(12) United States Patent
Lee et al.

(10) Patent No.: US 11,411,005 B2
(45) Date of Patent: Aug. 9, 2022

(54) SEMICONDUCTOR DEVICE AND METHOD FOR FABRICATING THE SAME

(71) Applicant: SK hynix Inc., Gyeonggi-do (KR)

(72) Inventors: Kun Young Lee, Gyeonggi-do (KR); Seo Hyun Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/935,848

(22) Filed: Jul. 22, 2020

(65) Prior Publication Data
US 2021/0296322 A1 Sep. 23, 2021

(30) Foreign Application Priority Data

Mar. 20, 2020 (KR) .................. 10-2020-0034528

(51) Int. Cl.
*H01L 27/108* (2006.01)

(52) U.S. Cl.
CPC .. *H01L 27/10852* (2013.01); *H01L 27/10808* (2013.01)

(58) Field of Classification Search
CPC ......... H01L 27/10852; H01L 27/10808; H01L 27/10814; H01L 28/90; H01L 28/40; H01L 27/10805; H01L 27/1085; H01L 28/60; H01L 28/92; H01L 27/10885; H01L 27/10891
See application file for complete search history.

(56) References Cited

U.S. PATENT DOCUMENTS

| | | | |
|---|---|---|---|
| 8,643,075 B2 | 2/2014 | Kim et al. | |
| 8,815,697 B2 | 8/2014 | Yoon et al. | |
| 10,950,618 B2* | 3/2021 | Tang | G06F 3/0688 |
| 2018/0175042 A1* | 6/2018 | Jang | H01L 21/3003 |
| 2018/0323200 A1* | 11/2018 | Tang | H01L 29/42376 |
| 2019/0198510 A1* | 6/2019 | Kim | H01L 27/11556 |
| 2021/0013210 A1* | 1/2021 | Lee | H01L 27/10894 |

* cited by examiner

*Primary Examiner* — Edward Chin
(74) *Attorney, Agent, or Firm* — IP & T Group LLP

(57) ABSTRACT

A method for fabricating a semiconductor device includes: forming a mold stack layer including a mold layer and a supporter layer over a substrate; forming opening by etching the mold stack layer; selectively forming a supporter reinforcement layer on an exposed surface of the supporter layer which is positioned in the opening; forming a bottom electrode in the opening in which the supporter reinforcement layer is formed; and forming a supporter opening by etching a portion of the supporter layer to form a supporter that supports an outer wall of the bottom electrode.

18 Claims, 50 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2020-0034528, filed on Mar. 20, 2020, which is incorporated herein by reference in its entirety.

BACKGROUND

1. Field

Various embodiments of the present invention relate generally to a semiconductor device and a method for fabricating the same and, more particularly, to a semiconductor device including a capacitor and a method for fabricating the semiconductor device.

2. Description of the Related Art

Memory devices using capacitors are well known. A capacitor may typically include a bottom electrode, a dielectric layer, and a top electrode. As demand for higher integration level semiconductor devices continues to increase, the area available for a capacitor decreases requiring making the bottom electrode with higher aspect ratio for increasing the capacitance of the capacitor. However, a bottom electrode having a high aspect ratio may be damaged, or collapse during subsequent processes employed in the manufacturing of a memory device. Therefore, novel concepts and techniques are needed for improving the structural integrity and reliability of a bottom electrode of a capacitor with high aspect ratio.

SUMMARY

Embodiments of the present invention are directed to a semiconductor device having a capacitor of excellent structural integrity and reliability and a method for fabricating the semiconductor device.

In accordance with an embodiment of the present invention, a method for fabricating a semiconductor device includes: forming a mold stack layer including a mold layer and a supporter layer over a substrate; forming an openings by etching the mold stack layer; selectively forming a supporter reinforcement layer on an exposed surface of the supporter layer which is positioned in the opening; forming a bottom electrode in the opening in which the supporter reinforcement layer is formed; and forming a supporter opening by etching a portion of the supporter layer to form a supporter that supports an outer wall of the bottom electrode.

In accordance with another embodiment of the present invention, a semiconductor device includes: a plurality of bottom electrodes over the substrate; a supporter that supports the bottom electrodes; and a supporter reinforcement layer between outer walls of the bottom electrodes and the supporter.

In accordance with yet another embodiment of the present invention, a semiconductor device includes: a buried word line formed in a substrate; a bit line formed over the buried word line; and a capacitor formed over the bit line, wherein the capacitor includes: a plurality of bottom electrodes; a multi-level supporter that supports the bottom electrodes; and a multi-level supporter reinforcement layer that is positioned between the outer walls of the bottom electrodes and the multi-level supporter.

These and other features and advantages of the present invention will be better understood from the detailed description of embodiments of the invention in conjunction with the following drawings.

DETAILED DESCRIPTION

Figure 1A:
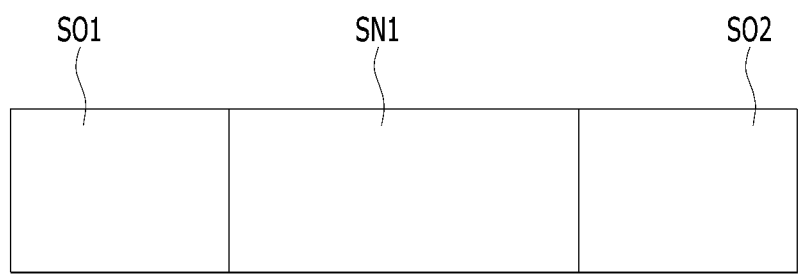
FIGS. 1A and 1B are cross-sectional views illustrating a method for fabricating a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Hereinafter, embodiments of the present invention will be described in detail with reference to the accompanying drawings. For simplicity, the description has been made based on a Dynamic Random-Access Memory (DRAM), but the concept of the present invention is not limited thereto and may be applied to other kinds of memories or semiconductor devices.

Figure 1B:
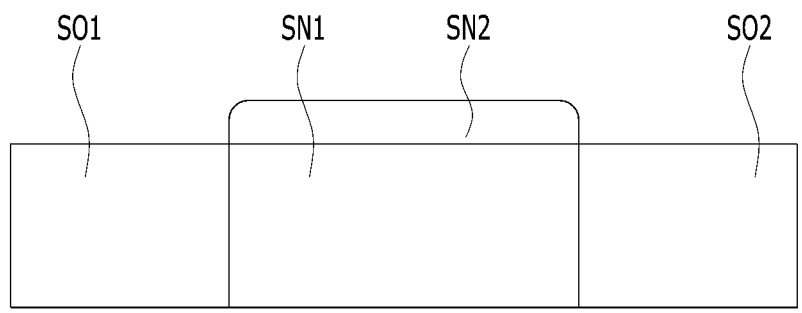

FIGS. 1A and 1B are cross-sectional views illustrating a method for fabricating a semiconductor device in accordance with an embodiment of the present invention.

Referring to FIG. 1A, a plurality of target layers SO1, SN1, and SO2 may be prepared. The target layers may include a first target layer SO1, a second target layer SN1, and a third target layer SO2. The first and third target layers SO1 and SO2 may include silicon oxide. The second target layer SN1 may include a first silicon nitride.

Referring to FIG. 1B, a selective growth layer SN2 may be formed by selective deposition over one target layer among the target layers SO1, SN1, SO2. For example, the selective growth layer SN2 may grow from the exposed surface of the second target layer SN1.

The selective growth layer SN2 may grow at a faster deposition rate from the surface of the second target layer SN1 than on the surfaces of the first and third target layers SO1 and SO2. The difference in the growth rate may be induced by a difference in nucleation incubation time for the formation of the selective growth layer SN2 on the surfaces of different materials. For example, the selective growth layer SN2 may have a shorter nucleation incubation time on the surface of the second target layer SN1 than on the surfaces of the first and third target layers SO1 and SO2. For example, there may be an incubation delay of the selective growth layer SN2 on the surfaces of the first and third target layers SO1 and SO2. Thus, while the selective growth process continues, the selective growth layer SN2 may grow from the exposed surface of the second target layer SN1, and may not grow from the surfaces of the first and third target layers SO1 and SO2. The selective growth process may be terminated before the selective growth layer SN2 is deposited over the first and third target layers SO1 and SO2.

The selective growth layer SN2 may include a second silicon nitride. The selective growth layer SN2 may selectively grow using an Atomic Layer Deposition (ALD) process or a Low-Pressure Chemical Vapor Deposition (LPCVD) process using, for example, dichloro silane ($SiH_2Cl_2$) and ammonia ($NH_3$) as reaction gases.

According to the above, as the selective growth layer SN2 is selectively formed over one target layer among the target layers, the structural stability of the semiconductor device may be reinforced.

Figure 2A:
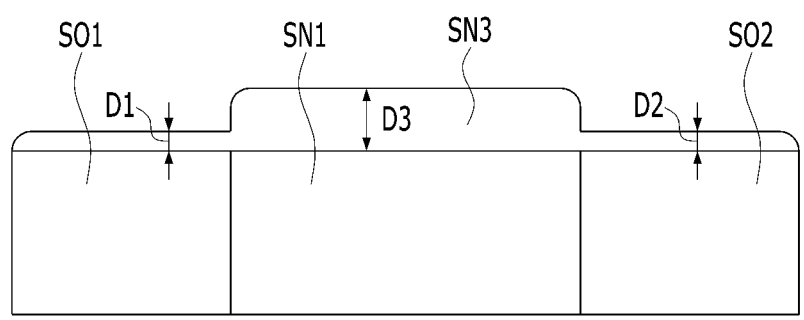
FIGS. 2A to 2B are cross-sectional views illustrating a method for fabricating a semiconductor device in accordance with another embodiment of the present invention.
Figure 2B:
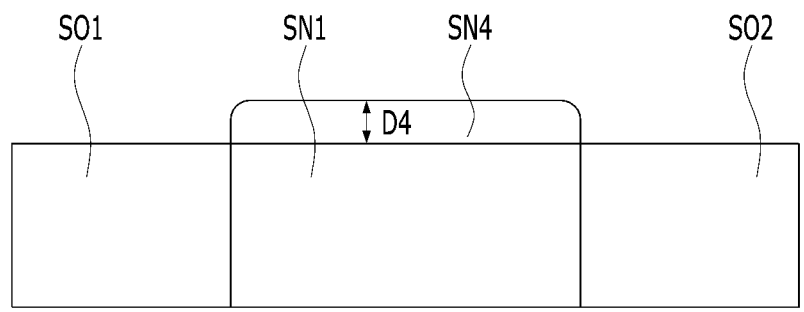

FIGS. 2A to 2B are cross-sectional views illustrating a method for fabricating a semiconductor device in accordance with another embodiment of the present invention.

First, as illustrated in FIG. 1A, a plurality of target layers may be prepared. For example, the target layers may include a first target layer SO1, a second target layer SN1, and a third target layer SO2.

Subsequently, referring to FIG. 2A, a selective growth layer SN3 may be formed over a plurality of target layers. For example, the selective growth layer SN3 may be formed over the first target layer SO1, the second target layer SN1, and the third target layer SO2. The incubation time of the selective growth layer SN3 on the surface of the second target layer SN1 may be shorter than the incubation time of the selective growth layer SN3 on the surfaces of the first and third target layers SO1 and SO2. Thus, before nuclei for the growth of the selective growth layer SN3 are generated on the surfaces of the first and third target layers SO1 and SO2, the selective growth layer SN3 is deposited over the second target layer SN1. When the deposition process of the selective growth layer SN3 is continued, the selective growth layer SN3 may be deposited over the first target layer SO1, the second target layer SN1, and the third target layer SO2. The thickness of the selective growth layer SN3 may be different according to the lower target layer. For example, the thickness D3 of the growth layer SN3 over the second target layer SN1 may be greater than the thickness D1 of the selective growth layer SN3 over the first target layer SO1 and the thickness D2 of the selective growth layer SN3 over the second target layer SO2.

The selective growth layer SN3 may include a second silicon nitride. The selective growth layer SN3 may selectively grow using an atomic layer deposition (ALD) process or a low-pressure chemical vapor deposition (LPCVD)

process using, for example, dichloro silane ($SiH_2Cl_2$) and ammonia ($NH_3$) as reaction gases.

Referring to FIG. 2B, the forming of the selective growth layer SN3 (referred to generally as the selective growth layer process) may include an etch-back process of the selective growth layer SN3. The etch-back process may be performed after the deposition of the selective growth layer SN3. The etch-back process may completely remove the selective growth layer SN3 that is formed on the surfaces of the first and third target layers SO1 and SO2, and a portion of the initial thickness D3 of the selective growth layer SN3 may remain on the surface of the second target layer SN1. Accordingly, the thickness D4 of the selective growth layer SN4 remaining over the second target layer SN1 after the etch-back process may be equal to or less than the thickness D3 of the selective growth layer SN3 before the etch-back process is performed.

Forming the selective growth layers SN3 having different thicknesses over the plurality of target layers and then etching back the selective growth layers to leave a selective growth layer SN3 only over the second target layer SN1 (as shown in FIG. 2B) results in enhanced structural stability of the semiconductor device.

Figure 3A:
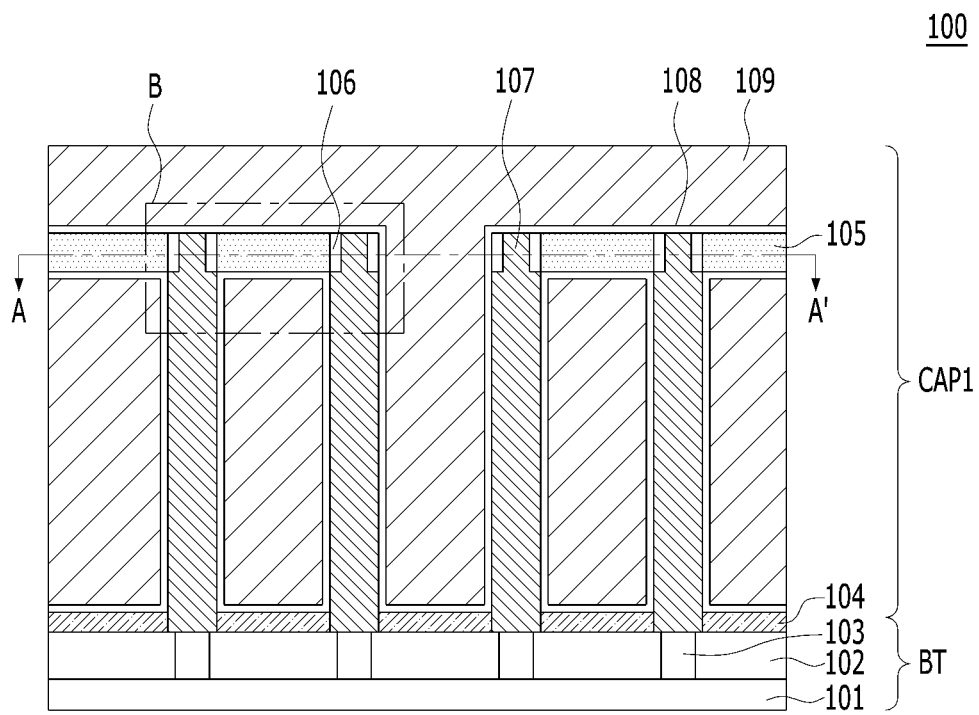
FIG. 3A is a cross-sectional view illustrating a semiconductor device in accordance with an embodiment of the present invention.
Figure 3B:
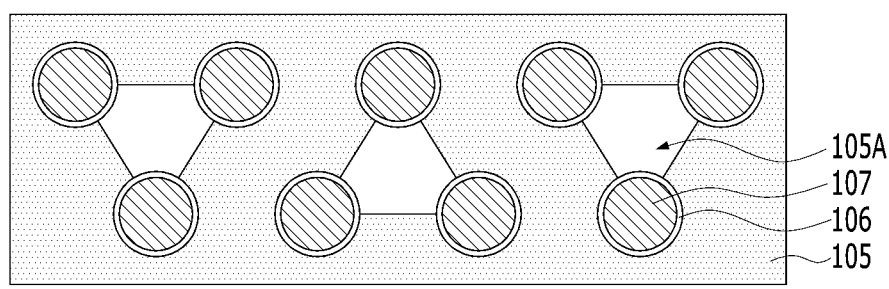
FIG. 3B is a top view taken along a line A-A' shown in FIG. 3A.

FIG. 3A is a cross-sectional view illustrating a semiconductor device in accordance with an embodiment of the present invention. FIG. 3B is a top view taken along a line A-A' shown in FIG. 3A. FIG. 3B illustrates a plurality of bottom electrodes 107 and a supporter 105 shown in FIG. 3A in detail. In FIG. 3B, the illustration of the dielectric layer 108 and the top electrode 109 is omitted.

Referring to FIGS. 3A and 3B, the semiconductor device 100 may include a lower structure BT and a capacitor structure CAP1 disposed over the lower structure BT.

The lower structure BT may include a substrate 101, an inter-layer dielectric layer 102, and a plurality of contact plugs spaced apart from each other. The contact plugs 103 may each penetrate the inter-layer dielectric layer 102 to be coupled to the substrate 101.

The capacitor structure CAP1 may include an etch stop layer 104, a supporter 105, a supporter reinforcement layer 106, a plurality of bottom electrodes 107, a dielectric layer 108, and a top electrode 109.

The etch stop layer 104 may be formed over the contact plug 103 and the inter-layer dielectric layer 102. The etch stop layer 104 may include, for example, silicon nitride. The etch stop layer 104 may be used as an etch end point. The etch stop layer 104 may be formed, for example, by a chemical vapor deposition (CVD) process, a physical vapor deposition (PVD) process, or an atomic layer deposition (ALD) process. The etch stop layer 104 may use plasma to increase the deposition effect. For example, the etch stop layer 104 may be formed by such methods as a Plasma Enhanced Chemical Vapor Deposition (PECVD) process, a Plasma Enhanced Atomic Layer Deposition (PEALD) process.

The bottom electrodes 107 may be formed over a corresponding one of the contact plugs 103. The bottom electrodes 107 may each be electrically connected to a corresponding one of the contact plugs 103. The bottom electrodes 107 may have a high aspect ratio. Here, the high aspect ratio refers to a ratio of width to height. The aspect ratio of each of the bottom electrodes 107 refers to the its height over its width. The bottom electrodes 107 refers to an aspect ratio greater than approximately 1:1. For example, the height of the bottom electrodes 107 may be ten times greater than the width of the bottom electrodes 107. The height of the bottom electrodes 107 may be approximately 5000 Å or more. The bottom electrodes 107 may have a pillar shape.

The bottom electrodes 107 may include a metal material or a metal-based conductive material. The bottom electrodes 107 may include a metal layer, a metal nitride, or a combination thereof. For example, the bottom electrodes 107 may include cobalt (Co), titanium (Ti), nickel (Ni), tungsten (W), molybdenum (Mo), platinum (Pt), ruthenium (Ru), iridium (Ir), titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), tungsten nitride (WN) or a combination thereof. According to the embodiment of the present invention, the bottom electrodes 107 may be formed of titanium nitride. The bottom electrodes 107 may, for example, include titanium nitride (ALD-TiN) formed by an atomic layer deposition process.

The dielectric layer 108 may be formed on the bottom electrodes 107. The dielectric layer 108 may include a high-k material having a higher dielectric constant than silicon oxide. The high-k material may include zirconium oxide ($ZrO_2$), aluminum oxide ($Al_2O_3$), titanium oxide ($TiO_2$), tantalum oxide ($Ta_2O_5$), niobium oxide ($Nb_2O_5$), or strontium titanium oxide ($SrTiO_3$). According to another embodiment of the present invention, the dielectric layer 108 may be formed of a composite layer including two or more layers of the high-k material mentioned above. In this embodiment of the present invention, the dielectric layer 108 may be formed of a zirconium oxide-base material having good leakage current characteristics while sufficiently lowering the equivalent oxide film thickness (EOT). For example, the dielectric layer 108 may include ZAZ ($ZrO_2/Al_2O_3/ZrO_2$). According to another embodiment of the present invention, the dielectric layer 108 may include $TiO_2/ZrO_2/Al_2O_3/ZrO_2$ or $Ta_2O_5/ZrO_2/Al_2O_3/ZrO_2$.

The top electrode 109 may be formed over the dielectric layer 108. The top electrode 109 may include a metal material or a metal-based conductive material. For example, the top electrode 109 may, for example, include titanium (Ti), titanium nitride (TiN), tantalum (Ta), tantalum nitride (TaN), titanium aluminum nitride (TiAlN), tungsten (W), tungsten nitride (WN), ruthenium (Ru), ruthenium oxide ($RuO_2$), iridium (Ir), iridium oxide ($IrO_2$), platinum (Pt), or a combination thereof. According to the embodiment of the present invention, the top electrode 109 may, for example, include titanium nitride (ALD-TiN) formed by an atomic layer deposition process.

According to another embodiment of the present invention, the top electrode 109 may have a multi-layer structure. The top electrode 109 may be formed by sequentially stacking a lower metal-containing layer, a silicon germanium layer, and an upper metal-containing layer. The lower metal-containing layer and the upper metal-containing layer may, for example, include titanium (Ti), titanium nitride (TiN), tantalum (Ta), tantalum nitride (TaN), titanium aluminum nitride (TiAlN), tungsten (W), tungsten nitride (WN), ruthenium (Ru), ruthenium oxide ($RuO_2$), iridium (Ir), iridium oxide ($IrO_2$), platinum (Pt), or a combination thereof. For example, the lower metal-containing layer may be titanium nitride, and the upper metal-containing layer may be WN/W in which tungsten nitride and tungsten are stacked. The silicon germanium layer may be doped with boron.

The outer wall of the bottom electrodes 107 may be supported by the supporter 105. The supporter 105 may be formed to support the outer wall of the bottom electrodes 107 in a lateral direction to prevent the bottom electrodes 107 from collapsing. The supporter 105 may be formed to support the upper outer wall of the bottom electrodes 107 in the lateral direction. The supporter 105 may include a nitrogen-containing material. The supporter 105 may be formed of a dielectric material, such as silicon nitride.

Referring to FIG. 3B, the supporter 105 may include a plurality of supporter openings 105A. The supporter openings 105A may not overlap with the bottom electrodes 107. For example, a plurality of supporter openings 105A may be positioned between the neighboring bottom electrodes 107. The number and shape of the supporter openings 105A may vary. The supporter openings 105A may be formed in diverse shapes, such as a triangle, a square, and a pentagon. According to the embodiment of the present invention, the supporter openings 105A may be formed in a triangular shape. The dielectric layer 108 may cover the bottom electrodes 107, the supporter openings 105A, and the supporter 105. The supporter openings 105A may be filled with the top electrode 109 (see FIG. 3A).

The supporter reinforcement layer 106 may be formed on a side portion of the supporter 105. The supporter reinforcement layer 106 may be positioned between the bottom electrodes 107 and the supporter 105. The supporter reinforcement layer 106 may have a surround-shape surrounding the upper outer wall of the bottom electrodes 107. The supporter reinforcement layer 106 may fully cover a contact surface between the supporter 105 and the bottom electrodes 107. From the perspective of a top view, the supporter reinforcement layer 106 may have a closed loop shape surrounding a sidewall of the bottom electrodes 107. The closed loop shape refers to a continuous loop shape without any part being cut out. The height of the supporter reinforcement layer 106 may be the same as or different from the height of the supporter 105. The height from the etch stop layer 104 to the supporter reinforcement layer 106 may be the same as or different from the height from the etch stop layer 104 to a bottom surface of the supporter 105. The sidewall profile of the supporter reinforcement layer 106 may be at least one among a curve-shape, a vertical-shape, and a tapered-shape.

The supporter reinforcement layer 106 may include a dielectric material. The supporter reinforcement layer 106 may include a nitrogen-containing material. The supporter reinforcement layer 106 may include, for example, silicon nitride, silicon carbon nitride (SiCN), silicon boron nitride (SiBN), or a combination thereof. The supporter reinforcement layer 106 and the supporter 105 may include the same material or different materials.

At least one between the supporter reinforcement layer 106 and the supporter 105 may be made of silicon nitride. For example, the supporter 105 may be made of silicon nitride formed by a deposition method, and the supporter reinforcement layer 106 may be made of silicon nitride that selectively grows from silicon nitride. The supporter 105 may be made of silicon nitride formed by a deposition method, and the supporter reinforcement layer 106 may be made of silicon carbon nitride that selectively grows from silicon nitride. The supporter 105 may be made of silicon nitride formed by a deposition method, and the supporter reinforcement layer 106 may be made of silicon boron nitride that selectively grows from silicon nitride.

At least one between the supporter reinforcement layer 106 and the supporter 105 may be made of silicon carbon nitride. For example, the supporter 105 may be made of silicon carbon nitride formed by a deposition method, and the supporter reinforcement layer 106 may be made of silicon carbon nitride that selectively grows from silicon carbon nitride. The supporter 105 may be made of silicon carbon nitride formed by a deposition method, and the supporter reinforcement layer 106 may be made of silicon carbon nitride that selectively grows from silicon carbon nitride. The supporter 105 may be made of silicon carbon nitride formed by a deposition method, and the supporter reinforcement layer 106 may be made of silicon boron nitride that selectively grows from silicon carbon nitride.

At least one between the supporter reinforcement layer 106 and the supporter 105 may be made of silicon boron nitride. For example, the supporter 105 may be made of silicon boron nitride formed by a deposition method, and the supporter reinforcement layer 106 may be made of silicon boron nitride that selectively grows from silicon boron nitride. The supporter 105 may be made of silicon boron nitride formed by a deposition method, and the supporter reinforcement layer 106 may be made of silicon nitride that selectively grows from silicon boron nitride. The supporter 105 may be made of silicon boron nitride formed by a deposition method, and the supporter reinforcement layer 106 may be made of silicon carbon nitride that selectively grows from silicon boron nitride.

The supporter reinforcement layer 106 may be formed, for example, by a chemical vapor deposition (CVD) process or an atomic layer deposition (ALD) process. The growth of the supporter reinforcement layer 106 may use plasma to increase the selective growth effect from the supporter 105. The supporter reinforcement layer 106 may selectively grow using an atomic layer deposition (ALD) process or a low-pressure chemical vapor deposition (LPCVD) process using, for example, dichloro silane ($SiH_2Cl_2$) and ammonia ($NH_3$) as reaction gases.

According to the embodiment of the present invention described above, since the supporter reinforcement layer 106 reinforces the side portion of the supporter 105, it may be possible to increase the structural stability of a capacitor.

FIGS. 4A to 4D are cross-sectional views illustrating sidewall profiles of the supporter reinforcement layer 106 according to modified examples of the embodiment of the present invention. FIGS. 4A to 4D are enlarged views of region B shown in FIG. 3A.

Referring to FIGS. 4A to 4D, the shape of the supporter reinforcement layer 106 may be variously modified. The sidewall profiles of the supporter reinforcement layers 106A, 106B, 106C, and 106D may be at least one among a curve-shape, vertical-shape, and tapered-shape. The heights of the supporter reinforcement layers 106A, 106B, 106C, and 106D may be the same as or different from the height of the supporter 105. The heights of the supporter reinforcement layers 106A, 106B, 106C, and 106D may be higher than the height of the supporter 105.

Figure 4A:
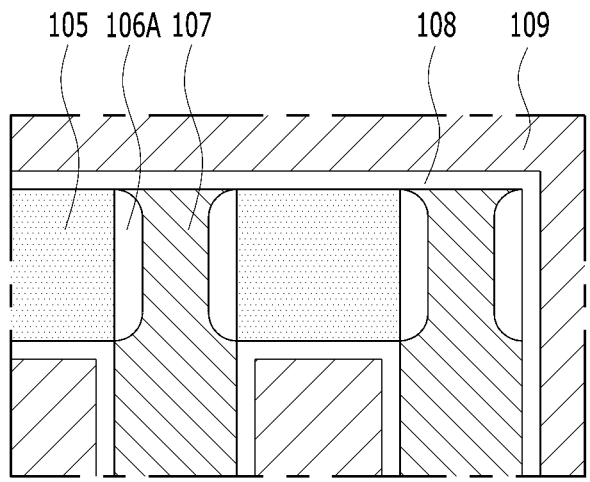
FIGS. 4A to 4D are cross-sectional views illustrating a semiconductor device in accordance with another embodiment of the present invention.

Referring to FIG. 4A, the supporter reinforcement layer 106A may selectively grow from the side of the supporter 105, and the side profile of the supporter reinforcement layer 106A may be curve-shaped. The side profile of the supporter reinforcement layer 106A may include diverse curvatures. The side profile of the supporter reinforcement layer 106A may be curve-shaped with a uniform curvature. The side profile of the supporter reinforcement layer 106A may be curve-shaped in the upper and lower portions of the supporter reinforcement layer 106A and may be vertical in the middle portion. In the side profile of the supporter reinforcement layer 106A, the curvature of the upper portion of the supporter reinforcement layer 106A may be greater than the curvature of the lower portion of the supporter reinforcement layer 106A. In the side profile of the supporter reinforcement layer 106A, the curvature of the lower portion of the supporter reinforcement layer 106A may be greater than the curvature of the upper portion of the supporter reinforcement layer 106A.

Figure 4B:
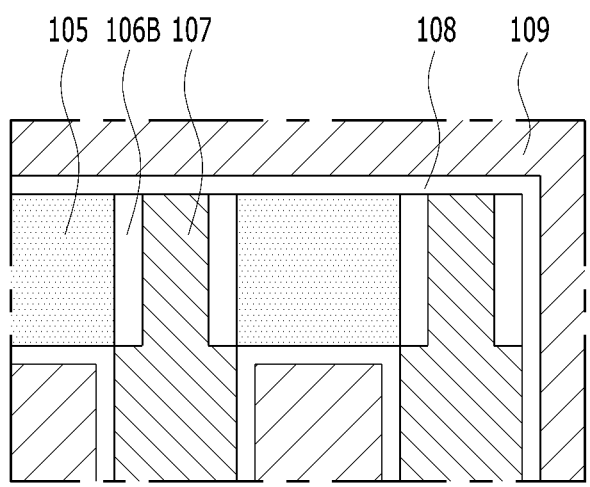

Referring to FIG. 4B, the supporter reinforcement layer 106B may selectively grow from the side of the supporter 105, and the side profile of the supporter reinforcement layer 106B may be vertical-shaped. The height of the supporter reinforcement layer 106B may be the same as the height of the supporter 105.

Figure 4C:
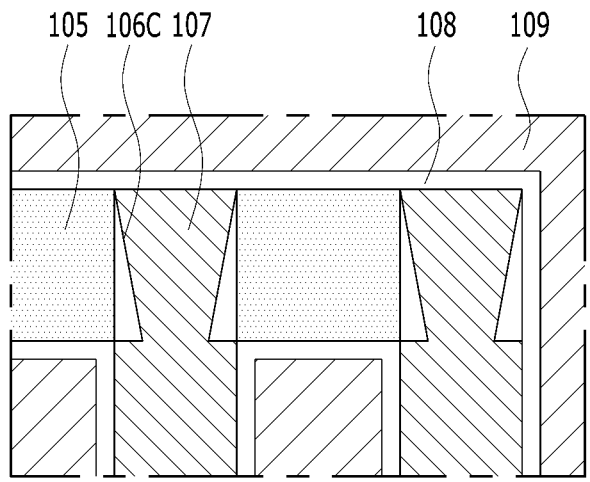

Referring to FIG. 4C, the supporter reinforcement layer 106C may selectively grow from the side of the supporter 105, and the side profile of the supporter reinforcement layer 106C may have a positively tapered shape. The thickness of the positively tapered supporter reinforcement layer 106C covering the upper side portion of the supporter 105 may be smaller than the thickness of the positively tapered supporter reinforcement layer 106C covering the bottom side portion of the supporter 105. The thickness of the supporter reinforcement layer 106C covering the side portion of the supporter 105 may increase gradually as it goes from the upper side portion of the supporter 105 toward the bottom side portion.

Figure 4D:
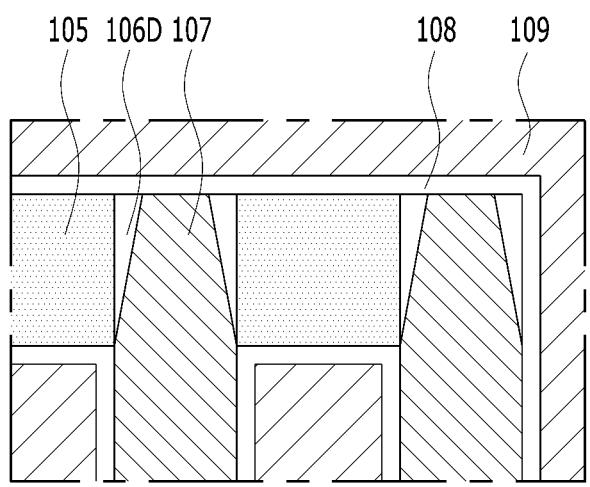

Referring to FIG. 4D, the supporter reinforcement layer 106C may selectively grow from the side of the supporter 105, and the side profile of the supporter reinforcement layer 106D may have a negatively tapered shape, which becomes thicker as it goes toward the top of the supporter 105. The thickness of the negatively tapered supporter reinforcement layer 106D covering the top side portion of the supporter 105 may be greater than the thickness of the negatively tapered supporter reinforcement layer 106D covering the bottom side portion of the supporter 105. The thickness of the supporter reinforcement layer 106C covering the side portion of the supporter 105 may gradually decrease as it goes from the top side portion of the supporter 105 toward the bottom side portion.

The above-described embodiments are mere examples of the various embodiments of the present invention, and diverse shapes of the supporter reinforcement layers 106 may be formed.

Figure 5:
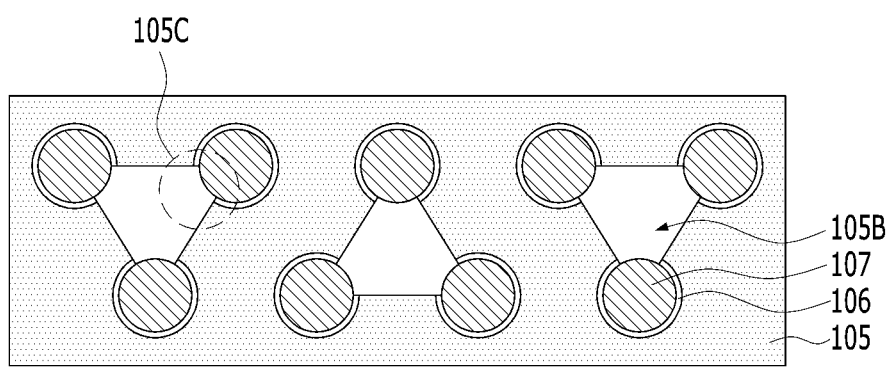
FIG. 5 is a top view illustrating a semiconductor device in accordance with another embodiment of the present invention.

FIG. 5 is a top view illustrating a shape of the supporter reinforcement layer 106 in accordance with another embodiment of the present invention. FIG. 5 illustrates the bottom electrodes 107 and the supporter 105, with the dielectric layer 108 and the top electrode 109 omitted.

Referring to FIG. 5, a supporter reinforcement layer cutting portion 105C may be formed on a side of each bottom electrodes 107. The top outer wall of the bottom electrodes 107 may be partially exposed by the supporter reinforcement layer cutting portion 105C. Therefore, the supporter reinforcement layer 106 may have a broken loop shape. The broken loop shape as this term is used herein refers to the shape of the supporter reinforcement layer as it is shown in FIG. 5, i.e., to a loop (or ring) shape a part of which is cut (or removed). The supporter openings 105B may each include at least three or more neighboring supporter reinforcement layer cutting portions 105C. In FIG. 5, each supporter opening 105B is adjacent to three supporter reinforcement layer cutting portions 105C, and the corresponding three bottom electrodes 107 are partially exposed by the supporter opening 105B.

According to the embodiment described above, since the width (or diameter) of the top outer wall of the bottom electrodes 107 is widened by the supporter reinforcement layer cutting portion 105C, contact failure of the capacitor that may occur in the subsequent process may be improved and the structural stability of a capacitor may be increased.

Figure 6A:
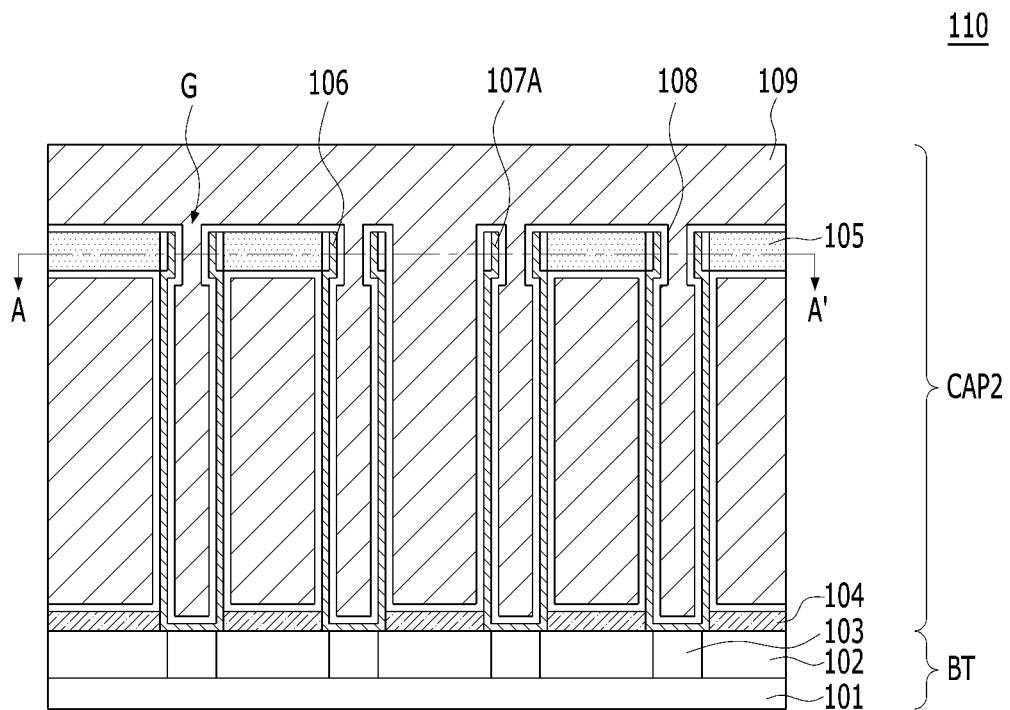
FIGS. 6A and 6B are cross-sectional views illustrating a bottom electrode in accordance with another embodiment of the present invention.
Figure 6B:
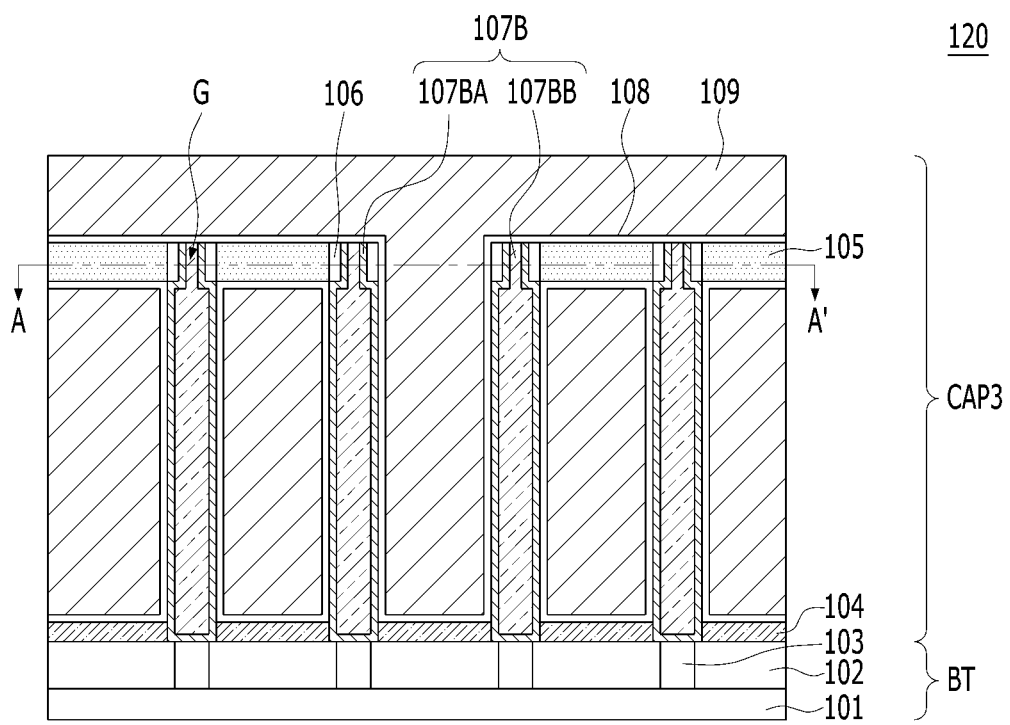

FIGS. 6A and 6B are cross-sectional views illustrating semiconductor devices 110 and 120 in accordance with other embodiments of the present invention. The semiconductor devices 110 and 120 may be identical or similar to the semiconductor device 100 of FIG. 3A. Hereinafter, detailed descriptions on the overlapping constituent elements will be omitted.

Referring to FIG. 6A, the bottom electrodes 107A of the semiconductor device 110 may have a cylinder shape in which a gap G is defined. The dielectric layer 108 may cover the upper portion of the supporter 105, the lower portion of the supporter 105, the upper portion of the supporter reinforcement layer 106, the bottom electrodes 107A, and the etch stop layer 104. The dielectric layer 108 may cover the inner and outer walls of the cylinder shape of the bottom electrodes 107A. The top electrode 109 may cover the dielectric layer 108. A portion of the top electrode 109 may fill the inside and outside of the cylinder shape of the bottom electrodes 107A. A supporter reinforcement layer 106 may be positioned between the bottom electrodes 107A and the supporter 105.

Referring to FIG. 6B, the bottom electrodes 107B of the semiconductor device 120 may have a modified pillar shape in which a cylinder shape and a pillar shape are combined. The bottom electrodes 107B may include a first bottom electrodes 107BA and a second bottom electrodes 107BB. The first bottom electrodes 107BA may have a cylinder shape in which the gap G is defined. The second bottom electrodes 107BB may have a pillar shape. The second bottom electrodes 107BB may fill the gap G inside the first bottom electrodes 107BA. The height of the second bottom electrodes 107BB may be the same as or different from the height of the first bottom electrodes 107BA. The bottom portion and the sidewall of the second bottom electrodes 107BB may have a structure surrounded by the first bottom electrodes 107BA. The dielectric layer 108 may cover the upper portion of the supporter 105, the lower portion of the supporter 105, the upper portion of the supporter reinforcement layer 106, the side portion of the first bottom electrodes 107BA, and the etch stop layer 104. The top electrode 109 may cover the dielectric layer 108. The supporter reinforcement layer 106 may be positioned between the second bottom electrodes 107BB and the supporter 105.

FIGS. 7A to 7H are cross-sectional views illustrating an example of a method for fabricating a semiconductor device in accordance with an embodiment of the present invention.

Figure 7A:
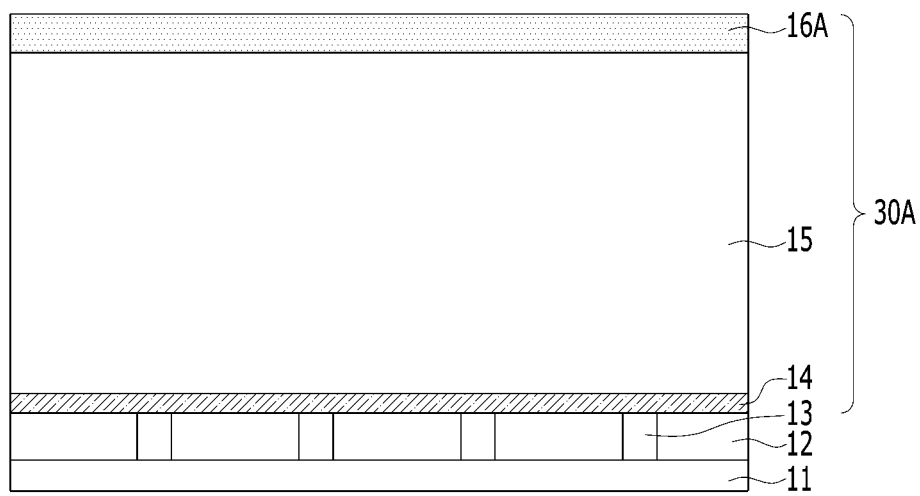
FIGS. 7A to 7H are cross-sectional views illustrating an example of a method for fabricating a semiconductor device in accordance with an embodiment of the present invention.

Referring to FIG. 7A, an inter-layer dielectric layer 12 may be formed on a substrate 11. A plurality of spaced apart contact plugs 13 penetrating the inter-layer dielectric layer 12 may be formed. The contact plugs 13 may penetrate the inter-layer dielectric layer 12 to be coupled to the substrate 11. Although not shown, before the contact plugs 13 is formed, a cell transistor, a bit line contact plug, and a bit line may be further formed.

The substrate 11 may be a material appropriate for semiconductor processing. The substrate 11 may include a semiconductor substrate. The substrate 11 may be formed of a silicon-containing material. The substrate 11 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 11 may also include other semiconductor materials, such as germanium. The substrate 11 may include a group-IIIV semiconductor substrate, for example, a compound semiconductor substrate, such as GaAs. The substrate 11 may include a Silicon-On-Insulator (SOI) substrate.

The inter-layer dielectric layer 12 may include silicon oxide, silicon nitride, or a combination thereof. The inter-layer dielectric layer 12 may include BSG (Borosilicate Glass), PSG (PhosphoSilicate Glass), BPSG (BoroPhospho-Silicate Glass), TEOS (Tetra ethly ortho silicate), USG (Undoped Silicate Glass) or SOG (Spin On Glass).

The contact plugs 13 may be formed by the inter-layer dielectric layer 12 to form a contact hole (no reference numeral is given) and then burying a conductive material in the contact hole. The contact plugs 13 may include polysilicon, a metal, a metal nitride, a metal silicide, or a combination thereof. For example, the contact plugs 13 may be formed by stacking polysilicon, a metal silicide and a metal in the mentioned order.

A mold stack layer 30A may be formed over the contact plugs 13 and the inter-layer dielectric layer 12. The mold stack layer 30A may include an etch stop layer 14, a mold layer 15, and a supporter layer 16A. The height of the bottom electrodes may be controlled by controlling the thickness of the mold stack layer 30A. The capacitance of a capacitor may vary according to the height of the bottom electrodes. For example, as the height of the mold stack layer 30A increases, the capacitance of the capacitor may increase.

An etch stop layer 14 may be formed over the contact plugs 13 and the inter-layer dielectric layer 12. The etch stop layer 14 may be formed of a material having an etch selectivity with respect to the mold layer 15. The etch stop layer 14 may include, for example, silicon nitride. The etch stop layer 14 may be used as an etch end point when the mold layer 15 is etched. The etch stop layer 14 may be formed, for example, by a chemical vapor deposition (CVD) process, a physical vapor deposition (PVD) process, or an atomic layer deposition (ALD) process. The etch stop layer 14 may use plasma to increase the deposition effect. In short, the etch stop layer 14 may be formed by a method, such as Plasma Enhanced Chemical Vapor Deposition (PECVD) and Plasma Enhanced Atomic Layer Deposition (PEALD).

A mold layer 15 may be formed over the etch stop layer 14. The mold layer 15 may include a dielectric material. The mold layer 15 may include BSG (Borosilicate Glass), PSG (PhosphoSilicate Glass), BPSG (BoroPhospoSilicate Glass), or TEOS (Tetra ethly ortho silicate). The mold layer 15 may be a single layer. According to another embodiment of the present invention, the mold layer 15 may have a multi-layer structure of at least two or more layers. For example, BPSG and TEOS layers may be stacked. According to another embodiment of the present invention, the mold layer 15 may include an undoped silicon layer or an amorphous silicon layer.

A supporter layer 16A may be formed over the mold layer 15. The thickness of the supporter layer 16A may be smaller than the thickness of the mold layer 15. The difficulty of the etching process may be reduced according to the thickness of the supporter layer 16A. For example, as the thickness of the supporter layer 16A becomes thinner, the difficulty of the etching process may be reduced. As the difficulty of the etching process is reduced, the capacitance of the capacitor may increase. The supporter layer 16A may be formed of a material having an etch selectivity with respect to the mold layer 15. The supporter layer 16A may include a nitrogen-containing material. The supporter layer 16A may include, for example, silicon nitride, silicon carbon nitride (SiCN), silicon boron nitride (SiBN), or a combination thereof. Since a supporter reinforcement layer is formed subsequently, the thickness of the supporter layer 16A, that is, the initial thickness, may become thin.

Figure 7B:
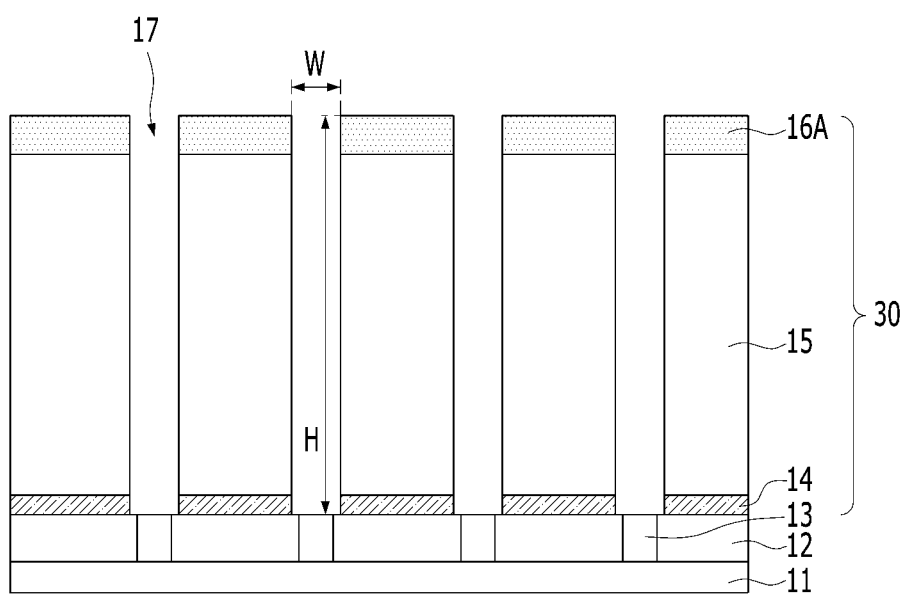

Referring to FIG. 7B, a plurality of spaced apart openings 17 may be formed in the mold stack layer 30A. The openings 17 may be formed over corresponding contact plugs 13. The openings 17 may be referred to as holes in which a plurality of bottom electrodes (or storage node) is to be formed. The openings 17 may be formed by using a mask layer (not shown) and etching the mold stack layer 30A. The mask layer (not shown) may include a photoresist pattern or a hard mask pattern. In order to form the openings 17, the support layer 16A and the mold layer 15 may be sequentially etched by using the mask layer as an etch barrier. The etching process for forming the openings 17 may stop at the etch stop layer 14. Subsequently, the etch stop layer 14 may be etched to expose the upper surface of the contact plugs 13 below the openings 17.

A mold stack pattern 30 including a plurality of openings 17 may be formed by an etching process including a series of steps described above. Herein, the openings 17 may be diversely formed according to the difficulty of the etching process. For example, as the thickness of the supporter layer 16A decreases, sidewalls of the openings 17 may be formed vertically. The vertically formed sidewalls of the openings 17 may improve the contact failure with the contact plugs 13 and increase the capacitance of a capacitor. To form the openings 17, a dry etching process, a wet etching process, or a combination thereof may be used. The openings 17 may have a high aspect ratio. The aspect ratio of each of the openings 17 refers to its height over its width. The openings 17 may have an aspect ratio of approximately at least 1:1. For example, the height of the openings 17 may be ten times greater than the width of openings 17.

Figure 7C:
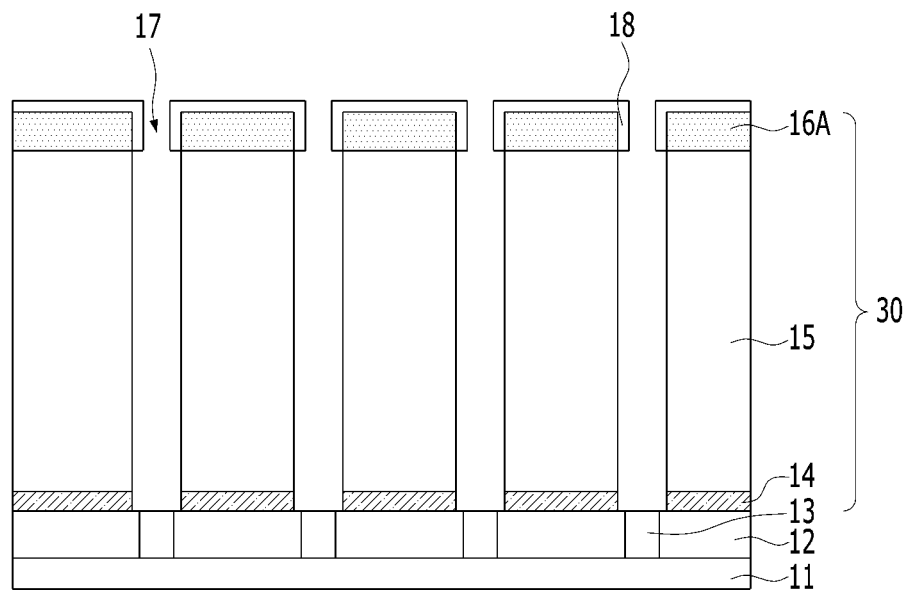

Referring to FIG. 7C, a supporter reinforcement layer 18 may be formed, and the supporter reinforcement layer 18 may be selectively formed on the side portions and upper surface of the supporter layer 16A.

The supporter reinforcement layer 18 may selectively grow from the exposed surface of the supporter layer 16A that is formed inside a plurality of spaced apart openings 17. The supporter reinforcement layer 18 may not grow from the exposed surface of the mold layer 15 that is formed inside the openings 17. The supporter reinforcement layer 18 may grow at a faster deposition rate from the surface of the supporter layer 16A than the surface of the mold layer 15. The difference in the growth rate may be induced by the difference in nucleation incubation time for the formation of the supporter reinforcement layer 18 on the surfaces of different materials. For example, the supporter reinforcement layer 18 may have a shorter nucleation incubation time on the surface of the supporter layer 16A than the surface of the mold layer 15. For example, there may be an incubation delay of the supporter reinforcement layer 18 on the surface of the mold layer 15. Thus, while the selective growth process is continuous, the supporter reinforcement layer 18 may grow from the exposed surface of the supporter layer 16A and may not grow from the surface of the mold layer 15. The selective growth process may be terminated before the supporter reinforcement layer 18 is deposited on the mold layer 15.

The supporter reinforcement layer 18 may grow over the exposed surfaces of the supporter layer 16A and the mold layer 15 that are formed inside the openings 17. The supporter reinforcement layer 18 may selectively grow from the upper surface of the supporter layer 16A. The incubation time of the supporter reinforcement layer 18 on the surface of the supporter layer 16A may be shorter than the incubation time of the supporter reinforcement layer 18 on the surface of the mold layer 15. Accordingly, the supporter reinforcement layer 18 may be deposited over the supporter layer 16A before nuclei for growth of the supporter reinforcement layer 18 are generated on the surface of the mold layer 15. While the deposition process of the supporter reinforcement layer 18 continues, the thickness of the supporter reinforcement layer 18 over the supporter layer 16A may be greater than the thickness of the supporter reinforcement layer 18 over the mold layer 15. In this case, the selective growth process may include an etch-back process. Therefore, an etch-back process may be performed after the deposition process of the supporter reinforcement layer 18. The etch-back process may completely remove the supporter reinforcement layer 18 that is formed on the surface of the mold layer 15, and a portion of the initial thickness of the supporter reinforcement layer 18 formed on the surface of the supporter layer 16A may remain. Therefore, the thickness of the supporter reinforcement layer 18 over the supporter layer 16A after the etch-back process may be equal to or less than the thickness of the supporter reinforcement layer 18 over the supporter layer 16A before the etch-back process.

The height of the supporter reinforcement layer 18 may be the same as or different from the height of the supporter layer 16A. The height from the etch stop layer 14 to the supporter reinforcement layer 18 may be the same as or different from the height from the etch stop layer 14 to the lower surface of the supporter layer 16A. The supporter reinforcement layer 18 may have a surrounding shape that surrounds the upper sidewall of the openings 17. The supporter reinforcement layer 18 may have a shape that extends from the exposed side of the supporter layer 16A to cover the upper surface of the supporter layer 16A. The shape of the supporter reinforcement layer 18 may vary. The sidewall profile of the supporter reinforcement layer 18 may be at least one among a vertical shape, a curved shape, and a tapered shape. A curved shape profile may include a round shape profile. The supporter reinforcement layer 18 may have a sidewall profile according to FIGS. 4A to 4D.

The supporter reinforcement layer 18 may include a nitrogen-containing material. The supporter reinforcement layer 18 may include, for example, silicon nitride, silicon carbon nitride (SiCN), silicon boron nitride (SiBN), or a combination thereof. The supporter reinforcement layer 18 may be formed, for example, by a chemical vapor deposition (CVD) process or an atomic layer deposition (ALD) process. The supporter reinforcement layer 18 may selectively grow using an atomic layer deposition (ALD) process or a low-pressure chemical vapor deposition (LPCVD) process using, for example, dichloro silane ($SiH_2Cl_2$) and ammonia ($NH_3$) as reaction gases.

Since the supporter reinforcement layer 18 may selectively grow from the exposed surface of the supporter layer 16A exposed inside the openings 17, the supporter reinforcement layer 18 may increase the structural stability of the supporter layer 16A. Even though the supporter layer 16A is formed thin, the supporter material may be reinforced by the supporter reinforcement layer 18. Thus, the bottom electrodes may be stably supported from a subsequent process. Since the supporter layer 16A may be formed thin, an etching process for forming the openings 17 may be easily performed, while preventing etching failure, such as not-open.

The width (or diameter) of the openings 17 may be decreased by the supporter reinforcement layer 18. Therefore, the width (or diameter) of the openings 17 may be defined to be greater than the width (or diameter) of the bottom electrodes which are to be formed therein subsequently. Herein, the width difference between the openings 17 and the bottom electrodes refers to a difference in a portion where the supporter reinforcement layer 18 is formed. When the openings 17 are formed to have a large width, even though the supporter reinforcement layer 18 is formed, gap-filling of the subsequently formed bottom electrodes may be facilitated.

Figure 7D:
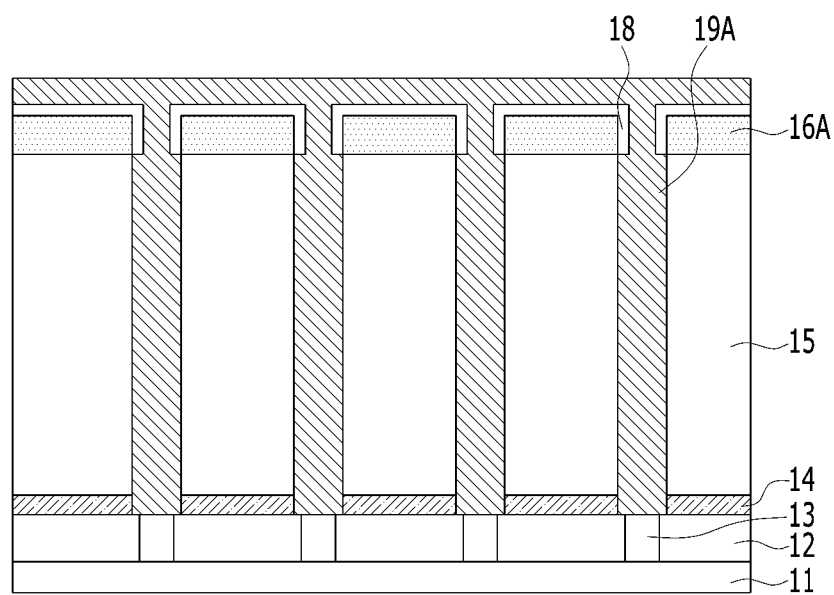

Referring to FIG. 7D, a bottom electrode layer 19A may be formed in the openings 17 in which the supporter reinforcement layer 18 is formed. The bottom electrode layer 19A may be formed over the contact plugs 13. Therefore, the bottom electrode layer 19A may each be electrically connected to the contact plugs 13.

The bottom electrode layer 19A may include a metal, a metal nitride, or a combination thereof. The bottom electrode layer 19A may include at least one among titanium (Ti), titanium nitride (TiN), tantalum (Ta), tantalum nitride (TaN), titanium aluminum nitride (TiAlN), tungsten (W), tungsten nitride (WN), ruthenium (Ru), ruthenium oxide ($RuO_2$), iridium (Ir), iridium oxide ($IrO_2$), platinum (Pt), and combinations thereof. In this embodiment of the present invention, the bottom electrode layer 19A may, for example, include titanium nitride (TiN). The bottom electrode layer 19A may, for example, include titanium nitride (ALD-TiN) formed by an atomic layer deposition (ALD) process.

Figure 7E:
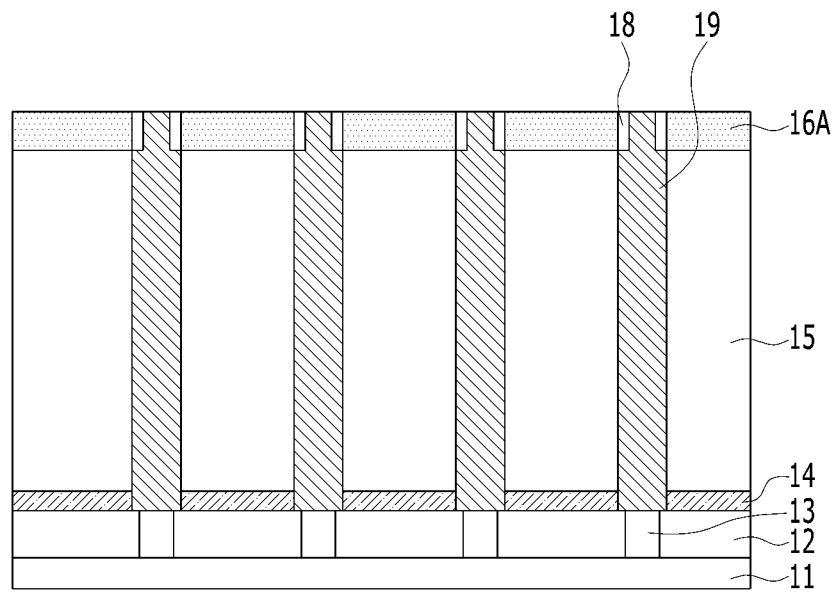

Referring to FIG. 7E, a bottom electrode isolation process may be performed. For example, to form the bottom electrodes 19 in the openings 17, a portion of the bottom electrode layer 19A may be selectively removed. The bottom electrode isolation process may be performed by a polishing process. For example, the bottom electrodes 19 may be formed, for example, by a chemical Mechanical Polishing (CMP) process or an etch-back process of the bottom electrode layer 19A. During formation of the bottom electrodes 19, the supporter reinforcement layer 18 on the upper surface of the supporter layer 16A may be removed. As a result, the bottom electrodes 19 may be formed inside the openings 17. After the formation of the bottom electrodes 19, the upper surface of the supporter layer 16A may be exposed.

The supporter reinforcement layer 18 may be positioned between the bottom electrodes 19 and the supporter layer 16A. The supporter reinforcement layer 18 may have a surrounding shape that surrounds the upper outer wall of the bottom electrodes 19. From the perspective of a top view, the supporter reinforcement layer 18 may have a closed loop shape. The bottom electrodes 19 may include one shape among a pillar shape, a cylinder shape, or a pylinder shape. The bottom electrodes 19 may have a cylinder shape shown in FIG. 6A. The bottom electrodes 19 may have a pylinder shape shown in FIG. 6B. In this embodiment of the present invention, the bottom electrodes 19 may have a pillar shape. The bottom electrodes 19 may have a high aspect ratio. The aspect ratio of each of the bottom electrodes 19 refers to its height over its width. The bottom electrodes 19 refers to an aspect ratio that is greater than approximately 1:1. For example, the height of the bottom electrodes 19 may be ten times greater than the width of the bottom electrodes 19.

Figure 7F:
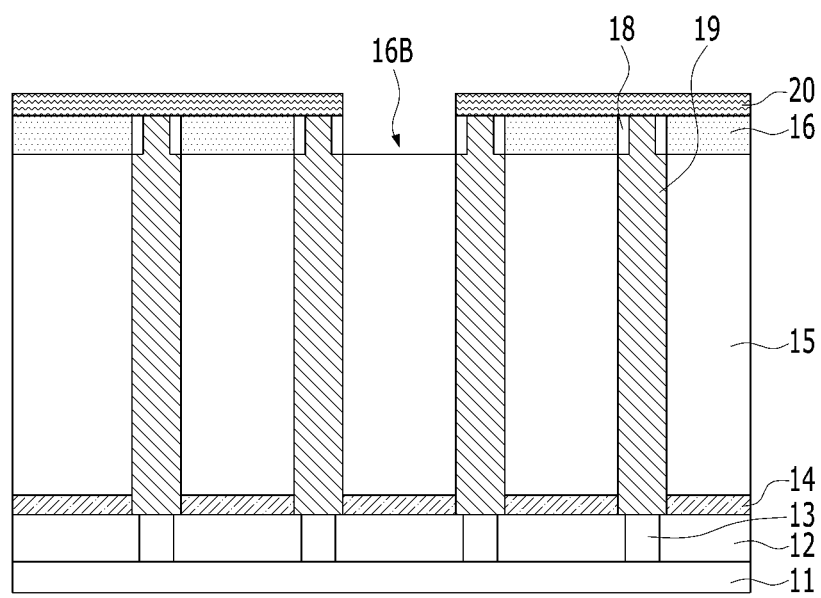

Referring to FIG. 7F, a supporter 16 supporting the upper outer wall of the bottom electrodes 19 may be formed. In order to form the supporter 16, the supporter layer 16A may be etched by using the mask layer 20. The mask layer 20 may include a photoresist pattern or a hard mask pattern. The supporter 16 may be formed by selectively etching the supporter layer 16A exposed by the mask layer 20. The supporter openings 16B formed by etching the supporter layer 16A may have the same arrangement and shape as those of the supporter openings 105A shown in FIG. 3B. Therefore, the supporter 16 may include a plurality of supporter openings 16B. A plurality of supporter openings 16B may be positioned between the neighboring bottom electrodes 19.

A plurality of supporter openings 16B may be positioned between the neighboring supporter reinforcement layers 18. The supporter openings 16B may partially expose the side of the supporter reinforcement layer 18. The supporter openings 16B may expose at least three or more neighboring supporter reinforcement layers 18. In this embodiment of the present invention, one supporter opening 16B may be adjacent to at least three supporter reinforcement layers 18, and three supporter reinforcement layers 18 may be exposed by one supporter opening 16B. The supporter openings 16B may be formed in diverse shapes, such as a triangle, a square, and a pentagon. In this embodiment of the present invention, a cross section of the supporter openings 16B may be formed in a triangular shape. Some surfaces of the mold layer 15 may be exposed by the supporter openings 16B. The supporter reinforcement layer 18 may be positioned on the side portion of the supporter 16. The supporter reinforcement layer 18 may be positioned between the bottom electrodes 19 and the supporter 16. While the supporter layer 16A is etched, a portion of the supporter reinforcement layer 18 may be etched.

Figure 7G:
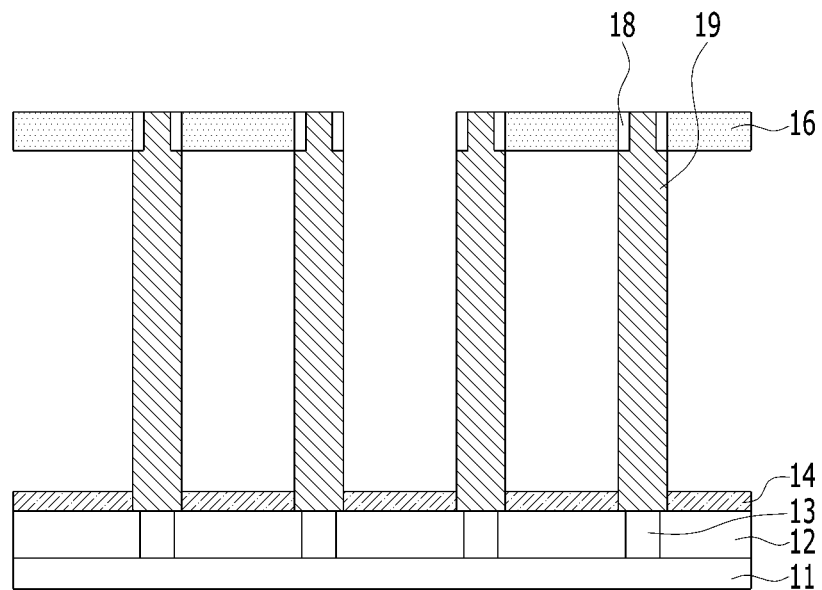

Referring to FIG. 7G, after the mask layer 20 is removed, the mold layer 15 may be removed. For example, the mold layer 15 may be removed by a wet dip-out process. The wet chemical for removing the mold layer 15 may be supplied through the supporter openings 16B. As for the wet chemical, one or more chemicals such as HF, $NH_4F/NH_4OH$, $H_2O_2$, HCl, $HNO_3$, and $H_2SO_4$ may be used. When the mold layer 15 is removed, the supporter 16 and the supporter reinforcement layer 18 having an etch selectivity with respect to the mold layer 15 may not be removed. As the mold layer 15 is removed, the outer wall of the bottom electrodes 19 may be exposed. Herein, the upper outer wall of the bottom electrodes 19 may be supported by the supporter 16 and the supporter reinforcement layer 18. In this way, the bottom electrodes 19 may be prevented from collapsing.

Figure 7H:
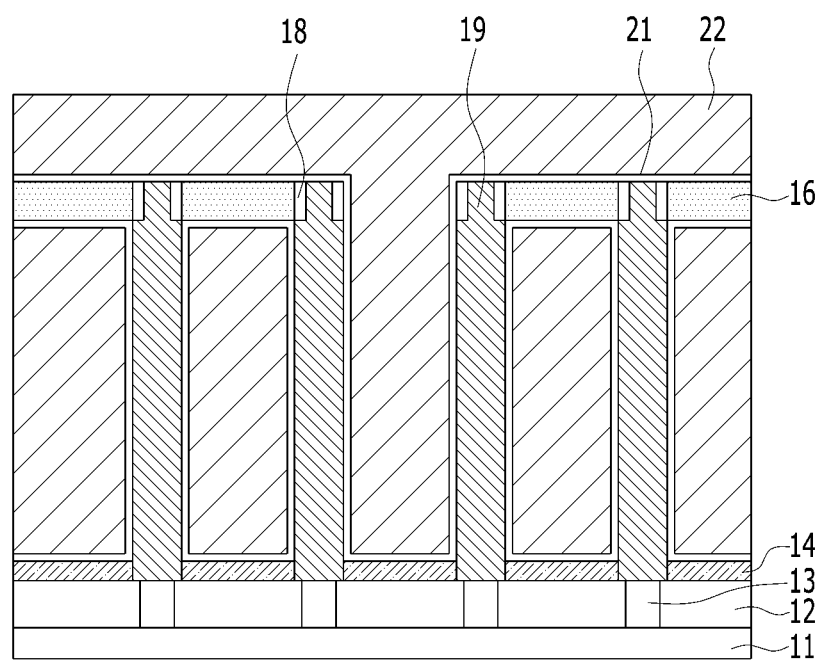

Referring to FIG. 7H, a dielectric layer 21 may be formed over the bottom electrodes 19, the supporter 16, and the supporter reinforcement layer 18. A portion of the dielectric layer 21 may cover the etch stop layer 14. The dielectric layer 21 may cover the supporter 16. The dielectric layer 21 may include a high-k material having a higher dielectric constant than silicon oxide. The high-k material may include zirconium oxide ($ZrO_2$), aluminum oxide ($Al_2O_3$), titanium oxide ($TiO_2$), tantalum oxide ($Ta_2O_5$), niobium oxide ($Nb_2O_5$), or strontium titanium oxide ($SrTiO_3$). According to another embodiment of the present invention, the dielectric layer 21 may be formed of a composite layer including two or more layers of the high-k materials mentioned above. In this embodiment of the present invention, the dielectric layer 21 may be formed of a zirconium oxide-base material having good leakage current characteristics while sufficiently lowering the equivalent oxide film thickness (EOT). For example, the dielectric layer 21 may include one among ZAZ ($ZrO_2/Al_2O_3/ZrO_2$), TZAZ ($TiO_2/ZrO_2/Al_2O_3/ZrO_2$), TZAZT ($TiO_2/ZrO_2/Al_2O_3/ZrO_2/TiO_2$), ZAZT ($ZrO_2/Al_2O_3/ZrO_2/TiO_2$), TZ ($TiO_2/ZrO_2$), or ZAZAT ($ZrO_2/Al_2O_3/ZrO_2/Al_2O_3/TiO_2$). In the dielectric layer stacks, such as TZAZ, TZAZT, ZAZT, TZ, ZAZAT, $TiO_2$ may be replaced with $Ta_2O_5$. The dielectric layer 21 may be formed, for example, by a chemical vapor deposition (CVD) process or an atomic layer deposition (ALD) process with excellent step coverage.

A top electrode 22 may be formed on the dielectric layer 21. The top electrode 22 may include a metal material or a metal-based conductive material. For example, the top electrode 22 may, for example, include titanium (Ti), titanium nitride (TiN), tantalum (Ta), tantalum nitride (TaN), titanium aluminum nitride (TiAlN), tungsten (W), tungsten nitride (WN), ruthenium (Ru), ruthenium oxide ($RuO_2$), iridium (Ir), iridium oxide ($IrO_2$), platinum (Pt), or a combination thereof. The top electrode 22 may be formed by a Low-Pressure Chemical Vapor Deposition (LPCVD) process, a Plasma Enhanced Chemical Vapor Deposition (PECVD) process, or an Atomic Layer Deposition (ALD) process. In this embodiment of the present invention, the top electrode 22 may, for example, include titanium nitride (ALD-TiN) that is formed by an atomic layer deposition process.

According to another embodiment of the present invention, the top electrode 22 may be of a multi-layer structure. The top electrode 22 may be formed by sequentially stacking a lower metal-containing layer, a silicon germanium layer, and an upper metal-containing layer. The lower metal-containing layer and the upper metal-containing layer may, for example, include titanium (Ti), titanium nitride (TiN), tantalum (Ta), tantalum nitride (TaN), titanium aluminum nitride (TiAlN), tungsten (W), tungsten nitride (WN), ruthenium (Ru), ruthenium oxide ($RuO_2$), iridium (Ir), iridium oxide ($IrO_2$), platinum (Pt), or a combination thereof. For example, the lower metal-containing layer may be titanium nitride, and the upper metal-containing layer may be WN/W in which tungsten nitride and tungsten are stacked. The silicon germanium layer may be doped with boron. In order to form the top electrode 22, a top electrode layer (not shown) deposition and a top electrode patterning process may be performed.

Figure 8A:
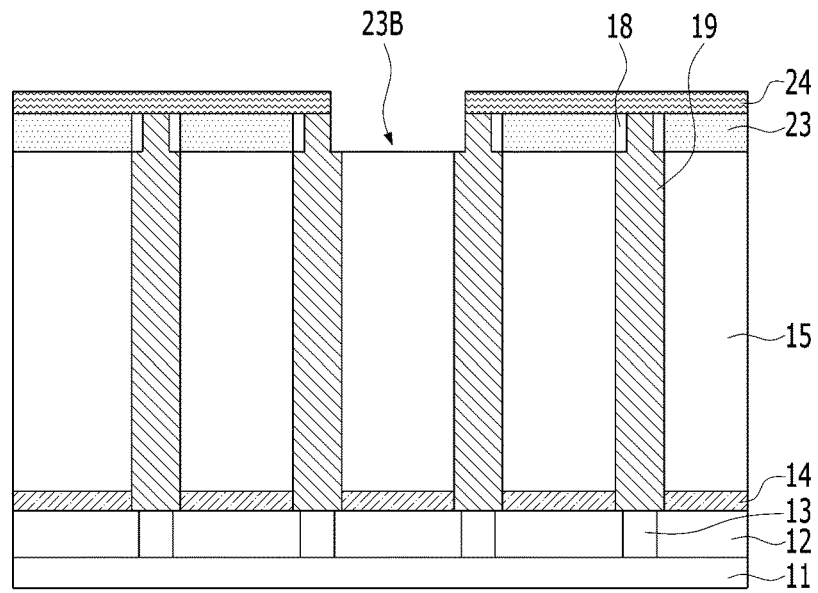
FIGS. 8A to 8C are cross-sectional views illustrating another example of a method for fabricating a semiconductor device in accordance with an embodiment of the present invention.
Figure 8B:
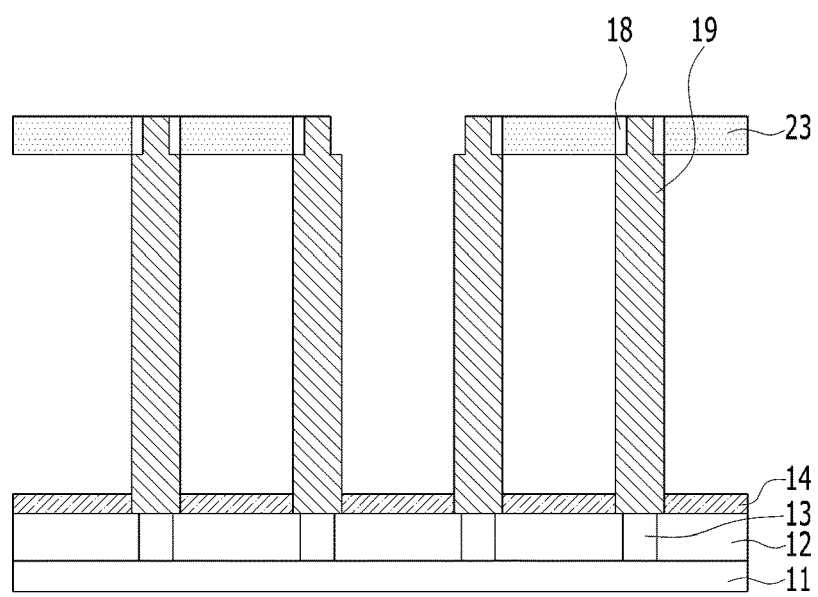
Figure 8C:
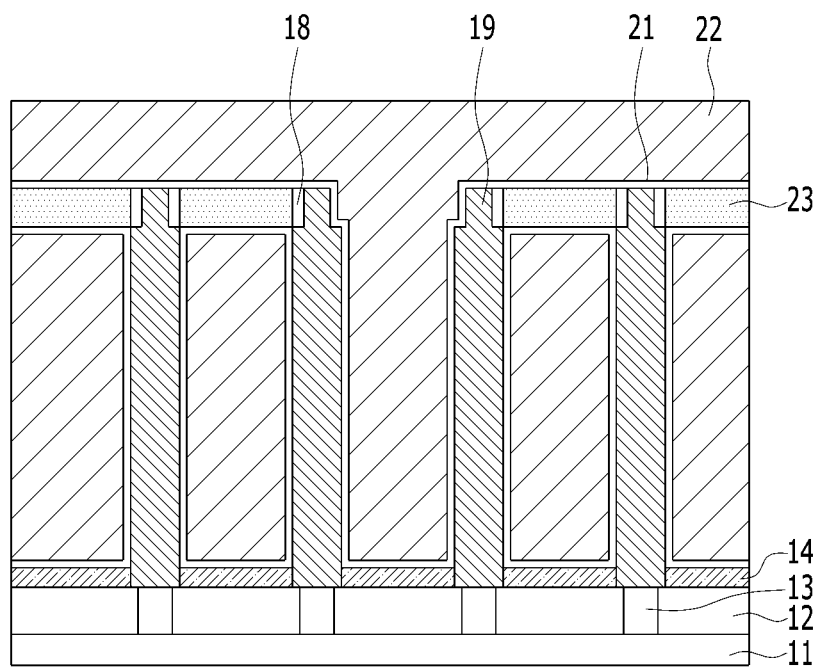

FIGS. 8A and 8C are cross-sectional views illustrating an example of a method for fabricating a semiconductor device in accordance with an embodiment of the present invention.

First, bottom electrodes 19 may be formed by the method illustrated in FIGS. 7A to 7E.

Subsequently, as shown in FIG. 8A, a supporter 23 may be formed on the top of the bottom electrodes 19. In order to form the supporter 23, a mask layer 24 may be included. The mask layer 24 may include a photoresist pattern or a hard mask pattern. The portion exposed by the mask layer 24 may include a supporter layer 16A and a supporter reinforcement layer 18. The supporter 23 may be formed by selectively etching the supporter layer 16A exposed by the mask layer 24. While the supporter layer 16A is etched, some or all of the supporter reinforcement layer 18 exposed by the mask layer 24 may be cut.

A supporter opening 23B may be formed by etching the supporter layer 16A to have the same arrangement and shape as the supporter opening 105B shown in FIG. 5. Therefore, the supporter 23 may include a plurality of supporter openings 23B. A plurality of supporter openings 23B may be positioned between the neighboring bottom electrodes 19. The supporter opening 23B may partially expose the upper outer wall of at least three or more neighboring bottom electrodes 19. In this embodiment of the present invention, one supporter opening 23B may be adjacent to at least three bottom electrodes 19, and three bottom electrodes 19 may be partially exposed by one supporter opening 23B. The supporter opening 23B may be formed in diverse shapes such as a triangle, a square, and a pentagon. In this embodiment of the present invention, the cross section of the supporter opening 23B may have a triangular shape.

The upper outer wall of the bottom electrodes 19 may be partially exposed by the supporter openings 23B. The supporter reinforcement layer 18 may be positioned between the outer wall of the bottom electrodes 19 and the supporter 23. The supporter reinforcement layer 18 may not be partially positioned between the supporter openings 23B and the bottom electrodes 19. The supporter reinforcement layer 18 may have a broken loop shape. Some surfaces of the mold layer 15 may be exposed by the supporter openings 23B.

Since the upper width (or diameter) of the bottom electrodes 19 is widened by the supporter openings 23B, it is possible to reduce contact failure of a capacitor that may occur in the subsequent process. In this way, the structural stability of the capacitor may be increased.

Referring to FIG. 8B, the mold layer 15 may be removed. For example, the mold layer 15 may be removed by a wet dip-out process. A wet chemical for removing the mold layer 15 may be supplied through the supporter openings 23B. As for the wet chemical, one or more chemicals among HF, $NH_4F/NH_4OH$, $H_2O_2$, HCl, $HNO_3$, and $H_2SO_4$ may be used. When the mold layer 15 is removed, the supporter 23 having an etch selectivity with respect to the mold layer 15 may not be removed. As the mold layer 15 is removed, the outer wall of the bottom electrodes 19 may be exposed. Herein, the upper outer wall of the bottom electrodes 19 may be supported by the supporter 23 and the supporter reinforcement layer 18. As a result, the bottom electrodes 19 may be prevented from collapsing.

Referring to FIG. 8C, a dielectric layer 21 may be formed on the bottom electrodes 19, the supporter 23, and the supporter reinforcement layer 18. A portion of the dielectric layer 21 may cover the etch stop layer 14. The dielectric layer 21 may cover the supporter 23 and the bottom electrodes 19.

The top electrode 22 may be formed over the dielectric layer 21.

Figure 9A:
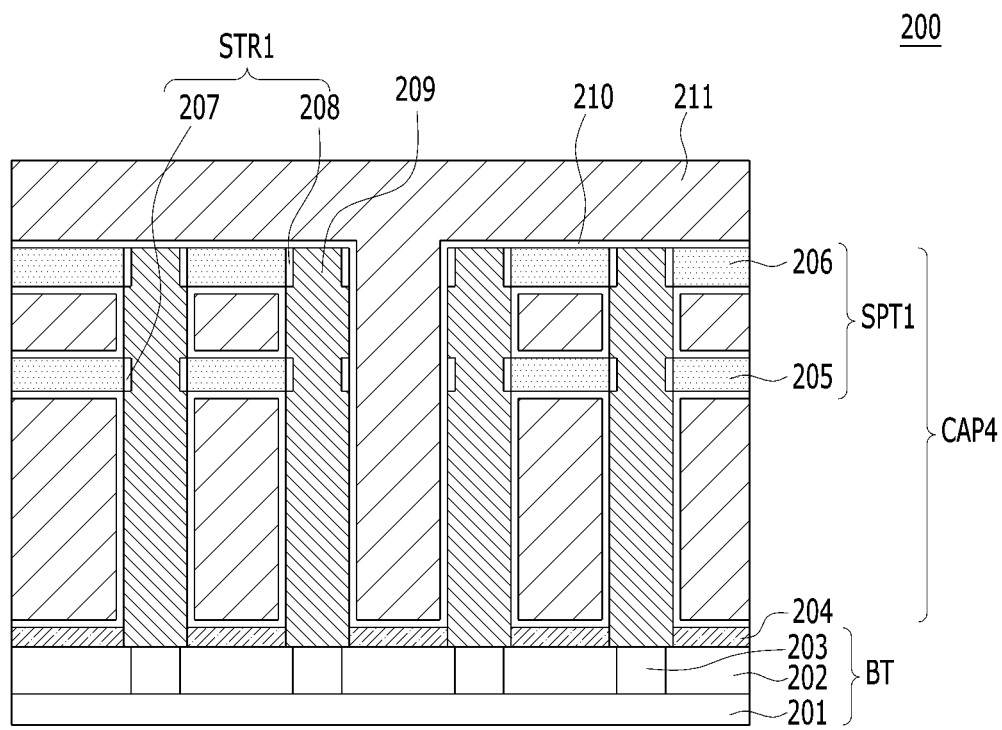
FIGS. 9A and 9B are cross-sectional views illustrating a semiconductor device in accordance with another embodiment of the present invention.
Figure 9B:
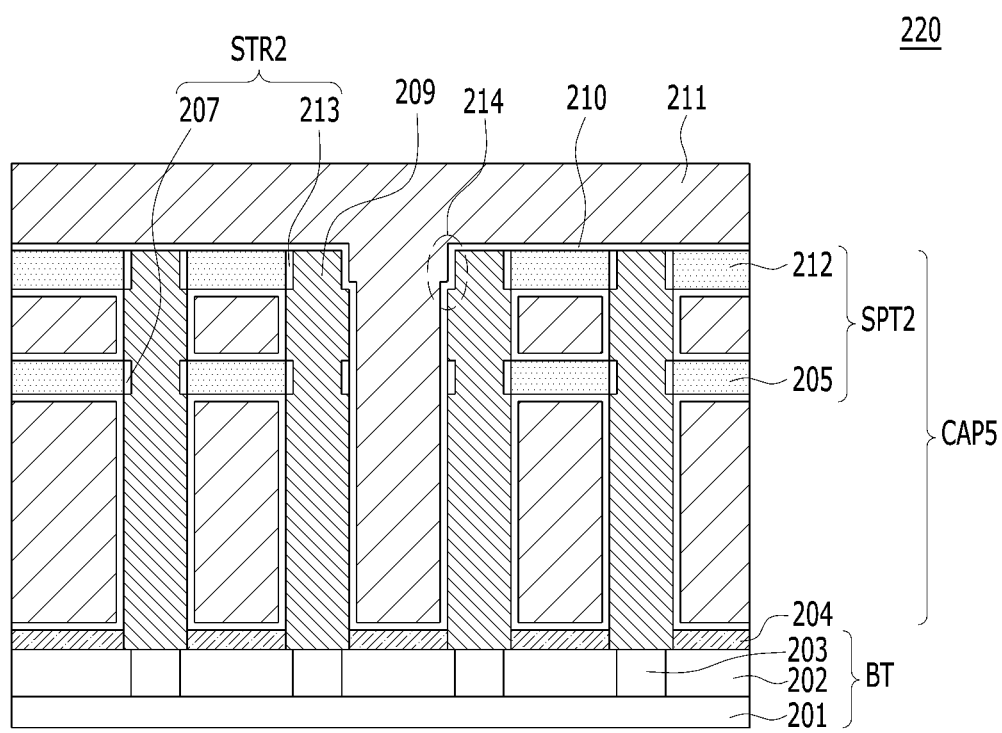

FIGS. 9A and 9B are cross-sectional views illustrating a semiconductor device in accordance with another embodiment of the present invention. The semiconductor device 200 may be identical or similar to the semiconductor device 100 shown in FIG. 3A.

Referring to FIG. 9A, the semiconductor device 200 may include a lower structure BT and a capacitor structure CAP4 disposed over the lower structure BT.

The lower structure BT may include a substrate 201, an inter-layer dielectric layer 202, and a plurality of contact plugs 203. The contact plugs 203 may penetrate the inter-layer dielectric layer 202 to be coupled to the substrate 201.

The capacitor structure CAP4 may include an etch stop layer 204, a supporter structure SPT1, a supporter reinforcement structure STR1, bottom electrodes 209, a dielectric layer 210, and a top electrode 211.

The etch stop layer 204 may be formed on the contact plugs 203 and the inter-layer dielectric layer 202. The etch stop layer 204 may include, for example, silicon nitride. The etch stop layer 204 may be used as an etch end point. The etch stop layer 204 may be formed, for example, by a chemical vapor deposition (CVD) process, a physical vapor deposition (PVD) process, or an atomic layer deposition (ALD) process. The etch stop layer 204 may use plasma to increase the effect of deposition. For example, the etch stop layer 204 may be formed by a method such as PECVD and PEALD.

Bottom electrodes 209 may be formed over the contact plugs 203. The bottom electrodes 209 may each be electrically connected to a corresponding one of the contact plugs 203. The bottom electrodes 209 may have a high aspect ratio. Herein, the aspect ratio refers to a ratio of width to height. The aspect ratio of each of the bottom electrodes 209 refers to its height over its width. The bottom electrodes 209 may have an aspect ratio that is greater than approximately 1:1. For example, the height of the bottom electrodes 209 may be ten times greater than the width of the bottom electrodes 209. The bottom electrodes 209 may have a pillar shape, a cylinder shape, or a pylinder shape in which a cylinder shape and a pillar shape are combined. In this embodiment of the present invention, the bottom electrodes 209 may have a pillar shape.

The bottom electrodes 209 may include a metal material or a metal-based conductive material. The bottom electrodes 209 may include a metal layer, a metal nitride, or a combination thereof. For example, the bottom electrodes 209 may include cobalt (Co), titanium (Ti), nickel (Ni), tungsten (W), molybdenum (Mo), platinum (Pt), ruthenium (Ru), iridium (Ir), titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), tungsten nitride (WN) or combinations thereof. In this embodiment of the present invention, the bottom electrodes 209 may be formed of titanium nitride. The bottom electrodes 209 may, for example, include titanium nitride (ALD-TiN) formed by an atomic layer deposition process.

A dielectric layer 210 may be formed over the bottom electrodes 209. The dielectric layer 210 may include a high-k material having a higher dielectric constant than silicon oxide. The high-k material may include zirconium oxide ($ZrO_2$), aluminum oxide ($Al_2O_3$), titanium oxide ($TiO_2$), tantalum oxide ($Ta_2O_5$), niobium oxide ($Nb_2O_5$), or strontium titanium oxide ($SrTiO_3$). According to another embodiment of the present invention, the dielectric layer 210 may be formed of a composite layer including two or more layers of the high-k materials mentioned above. In this embodiment of the present invention, the dielectric layer 210 may be formed of a zirconium oxide-base material having good leakage current characteristics while sufficiently lowering the equivalent oxide film thickness (EOT). For example, ZAZ ($ZrO_2/Al_2O_3/ZrO_2$) may be included. According to another embodiment of the present invention, the dielectric layer 210 may include $TiO_2/ZrO_2/Al_2O_3/ZrO_2$ or $Ta_2O_5/ZrO_2/Al_2O_3/ZrO_2$.

A top electrode 211 may be formed on the dielectric layer 210. The top electrode 211 may include a metal material or a metal-based conductive material. For example, the top electrode 211 may, for example, include titanium (Ti), titanium nitride (TiN), tantalum (Ta), tantalum nitride (TaN), titanium aluminum nitride (TiAlN), tungsten (W), tungsten nitride (WN), ruthenium (Ru), ruthenium oxide ($RuO_2$), iridium (Ir), iridium oxide ($IrO_2$), platinum (Pt), or a combination thereof. In this embodiment of the present invention, the top electrode 211 may, for example, include titanium nitride (ALD-TiN) formed by an atomic layer deposition process.

According to another embodiment of the present invention, the top electrode 211 may have a multi-layer structure. The top electrode 211 may be formed by sequentially stacking a lower metal-containing layer, a silicon germanium layer, and an upper metal-containing layer. The lower metal-containing layer and the upper metal-containing layer may, for example, include titanium (Ti), titanium nitride (TiN), tantalum (Ta), tantalum nitride (TaN), titanium aluminum nitride (TiAlN), tungsten (W), tungsten nitride (WN), ruthenium (Ru), ruthenium oxide ($RuO_2$), iridium (Ir), iridium oxide (IrO$_2$), platinum (Pt), or a combination thereof. For example, the lower metal-containing layer may be titanium nitride, and the upper metal-containing layer may be WN/W in which tungsten nitride and tungsten are stacked. The silicon germanium layer may be doped with boron.

The outer wall of the bottom electrodes 209 may be supported by the supporter structure SPT1. The supporter structure SPT1 may be a multi-level structure including at least one supporter. For example, the supporter structure SPT1 may include a lower-level supporter 205 and an upper-level supporter 206 disposed at higher level than the lower-level supporter 205. In this embodiment of the present invention, the supporter structure SPT1 may include the lower-level supporter 205 and the upper-level supporter 206. The supporter structure SPT1 may be formed to support the bottom electrodes 209 in a lateral direction to prevent the bottom electrodes 209 from collapsing. The supporter structure SPT1 may include a nitrogen-containing material. The supporter structure SPT1 may be formed of a dielectric material, such as silicon nitride. The lower-level supporter 205 and the upper-level supporter 206 may be formed of the same material or different materials. For example, the lower-level supporter 205 and the upper-level supporter 206 may be formed of a dielectric material, such as silicon nitride.

The lower-level supporter 205 may be positioned at a lower-level than the upper-level supporter 206 to support the outer wall of the bottom electrodes 209. The lower-level supporter 205 may have supporter openings (not shown) of the same arrangement and shape as those of the supporter openings 105A of FIG. 3B. Therefore, the lower-level supporter 205 may include a plurality of lower-level supporter openings. A plurality of lower-level supporter openings may be positioned between neighboring bottom electrodes 209. The number and shape of the lower-level supporter openings may vary. For example, in this embodiment of the present invention, the cross-section of the low-level supporter openings may be formed in a triangular shape.

The upper-level supporter 206 may support the upper outer wall of the bottom electrodes 209. The upper-level supporter 206 may support the upper outer wall of the bottom electrodes 209 in the lateral direction. The thickness of the upper-level supporter 206 may be the same as or different from the thickness of the low-level supporter 205. The thickness of the upper-level supporter 206 may be greater than the thickness of the lower-level supporter 205.

The upper-level supporter 206 may have supporter openings of the same arrangement and shape as those of the supporter openings 105A of FIG. 3B. Accordingly, the upper-level supporter 206 may include a plurality of upper-level supporter openings. A plurality of upper-level supporter openings may be positioned between neighboring bottom electrodes 209. The number and shape of the upper-level supporter openings may vary. The shapes of the lower-level supporter openings and the upper-level supporter openings may be the same or different. The lower-level supporter openings and the upper-level supporter openings may overlap vertically. The upper-level supporter openings may be thicker than the lower-level supporter openings. The dielectric layer 210 may cover the upper-level supporter openings and the lower-level supporter openings. The upper-level supporter openings and the lower-level supporter openings may be filled with the top electrode 211.

The supporter reinforcement structure STR1 may be a multi-level structure including at least one supporter reinforcement layer. For example, the supporter reinforcement structure STR1 may include a lower-level supporter reinforcement layer 207 and an upper-level supporter reinforcement layer 208 disposed at higher level than the lower-level supporter reinforcement layer 207.

The supporter reinforcement structure STR1 may be positioned between the bottom electrodes 209 and the supporter structure SPT1. The supporter reinforcement structure STR1 may fully cover a contact surface between the supporter structure SPT1 and the bottom electrodes 209. From the perspective of a top view, the supporter reinforcement structure STR1 may have a closed loop shape surrounding the sidewall of the bottom electrodes 209. The shape of the supporter reinforcement structure STR1 may vary. The sidewall profile of the supporter reinforcement structure STR1 may be at least one among a vertical shape, a curved shape, and a tapered shape. The sidewall profile of the supporter reinforcement structure STR1 may be one among those shown in FIGS. 4A to 4D. The sidewall profile of the lower-level supporter reinforcement layer 207 and the sidewall profile of the upper-level supporter reinforcement layer 208 may be the same or different.

The lower-level supporter reinforcement layer 207 may be formed on a side portion of the lower-level supporter 205. The lower-level supporter reinforcement layer 207 may have a shape surrounding the outer wall of the bottom electrodes 209. The lower-level supporter reinforcement layer 207 may be positioned between the bottom electrodes 209 and the lower-level supporter 205. The height of the lower-level supporter reinforcement layer 207 may be the same as or different from the height of the lower-level supporter 205. The height from the etch stop layer 204 to the lower-level supporter reinforcement layer 207 may be the same as or different from the height from the etch stop layer 204 to the lower portion of the lower-level supporter 205.

The upper-level supporter reinforcement layer 208 may be formed on a side portion of the upper-level supporter 206. The upper-level supporter reinforcement layer 208 may be positioned between the bottom electrodes 209 and the upper-level supporter 206. The upper-level supporter reinforcement layer 208 may have a shape surrounding the upper outer wall of the bottom electrodes 209. The height (or thickness) of the upper-level supporter reinforcement layer 208 may be the same as the height (or thickness) of the upper-level supporter 206. However, the invention may not be limited in this way, and in a variation of the illustrated embodiment (not shown), the height of the upper-level supporter reinforcement layer 208 may be different than the height of the upper-level supporter 206. The height (or thickness) of the upper-level supporter reinforcement layer 208 may be greater than the height (or thickness) of the upper-level supporter 206. The height from the etch stop layer 204 to the upper-level supporter reinforcement layer 208 may be the same as or different from the height from the etch stop layer 204 to the lower surface of the upper-level supporter 206.

The supporter reinforcement structure STR1 may include a dielectric material. The supporter reinforcement structure STR1 may include a nitrogen-containing material. The supporter reinforcement structure STR1 may include, for example, silicon nitride, silicon carbon nitride (SiCN), silicon boron nitride (SiBN), or a combination thereof. The material of the supporter reinforcement structure STR1 and the material of the supporter structure SPT1 may be the same or different. The material of the lower-level supporter reinforcement layer 207 and the material of the upper-level supporter reinforcement layer 208 may be the same or different.

At least one between the supporter reinforcement structure STR1 and the supporter structure SPT1 may be made of silicon nitride. For example, the supporter structure SPT1 may be made of silicon nitride that is formed by a deposition method, and the supporter reinforcement structure STR1 may be made of silicon nitride that selectively grows from silicon nitride. The supporter structure SPT1 may be made of silicon nitride that is formed by a deposition method, and the supporter reinforcement structure STR1 may be made of silicon carbon nitride that selectively grows from silicon nitride. The supporter structure SPT1 may be made of silicon nitride that is formed by a deposition method, and the supporter reinforcement structure STR1 may be made of silicon boron nitride that selectively grows from silicon nitride.

At least one between the supporter reinforcement structure STR1 and the supporter structure SPT1 may be made of silicon carbon nitride. For example, the supporter structure SPT1 may be made of silicon carbon nitride that is formed by a deposition method, and the supporter reinforcement structure STR1 may be made of silicon carbon nitride that selectively grows from silicon carbon nitride. According to another embodiment of the present invention, the supporter structure SPT1 may be made of silicon carbon nitride that is formed by a deposition method, and the supporter reinforcement structure STR1 may be made of silicon nitride that selectively grows from silicon carbon nitride. According to another embodiment of the present invention, the supporter structure SPT1 may be made of silicon carbon nitride that is formed by a deposition method, and the supporter reinforcement structure STR1 may be made of silicon boron nitride that selectively grows from silicon carbon nitride.

At least one between the supporter reinforcement structure STR1 and the supporter structure SPT1 may be made of silicon boron nitride. For example, the supporter structure SPT1 may be made of silicon boron nitride that is formed by a deposition method, and the supporter reinforcement structure STR1 may be made of silicon boron nitride that selectively grows from silicon boron nitride. According to another embodiment of the present invention, the supporter structure SPT1 may be made of silicon boron nitride that is formed by a deposition method, and the supporter reinforcement structure STR1 may be made of silicon nitride that selectively grows from silicon boron nitride. According to another embodiment of the present invention, the supporter structure SPT1 may be made of silicon boron nitride that is formed by a deposition method, and the supporter reinforcement structure STR1 may be made of silicon carbon nitride that selectively grows from silicon boron nitride.

The supporter reinforcement structure STR1 may be formed, for example, by a chemical vapor deposition (CVD) process or an atomic layer deposition (ALD) process. The growth of the supporter reinforcement structure STR1 may use plasma to increase the selective growth effect from the supporter structure SPT1. The supporter reinforcement structure STR1 may selectively grow using an atomic layer deposition (ALD) process or a low-pressure chemical vapor deposition (LPCVD) process using, for example, dichloro silane ($SiH_2Cl_2$) and ammonia ($NH_3$) as reaction gases. The method of forming the lower-level supporter reinforcement layer 207 and the upper-level supporter reinforcement layer 208 may be the same or different. The heights of the lower-level supporter reinforcement layer 207 and the upper-level supporter reinforcement layer 208 may be the same or different.

According to the above-described embodiment of the present invention, since the supporter reinforcement structure STR1 reinforces the side portion of the supporter structure SPT1, the structural stability of a capacitor may be increased.

Referring to FIG. 9B, the semiconductor device 220 may include a lower structure BT and a capacitor structure CAP5 disposed over the lower structure BT. The semiconductor device 220 may be identical or similar to the semiconductor device 200 shown in FIG. 9A.

The capacitor structure CAP5 may include an etch stop layer 204, a supporter structure SPT2, a supporter reinforcement structure STR2, a supporter reinforcement layer cutting portion 214, bottom electrodes 209, a dielectric layer 210, and a top electrode 211. The supporter structure SPT2 may include an upper-level supporter 212 and a lower-level supporter 205. The supporter reinforcement structure STR2 may include an upper-level supporter reinforcement layer 213 and a lower-level supporter reinforcement layer 207. For example, other constituent elements except the upper-level supporter 212, the upper-level supporter reinforcement layer 213, and the supporter reinforcement layer cutting portion 214 may be the same as those of the semiconductor device 200 shown in FIG. 9A.

The upper-level supporter 212 may support the upper outer wall of the bottom electrodes 209. The upper-level supporter 212 may support the upper outer wall of the bottom electrodes 209 in the lateral direction. The thickness of the upper-level supporter 212 may be the same as or different from the thickness of the lower-level supporter 205. The thickness of the upper-level supporter 212 may be greater than the thickness of the lower-level supporter 205.

The upper-level supporter reinforcement layer 213 may be positioned between the bottom electrodes 209 and the upper-level supporter 212. From the perspective of a top view, the upper-level supporter reinforcement layer 213 may have a shape surrounding a sidewall of the bottom electrodes 209. The upper-level supporter reinforcement layer 213 may include a broken loop shape.

The upper outer wall of the bottom electrodes 209 may partially contact the dielectric layer 210 by the supporter reinforcement layer cutting portion 214.

According to the embodiment of the present invention described above, since the upper width (or diameter) of the bottom electrodes 209 is widened by the supporter reinforcement layer cutting portion 214, it is possible to reduce contact failure of the capacitor during the subsequent process. As a result, the structural stability of a capacitor may be increased.

FIGS. 10A to 10J are cross-sectional views illustrating an example of a method for fabricating a semiconductor device in accordance with an embodiment of the present invention.

Figure 10A:
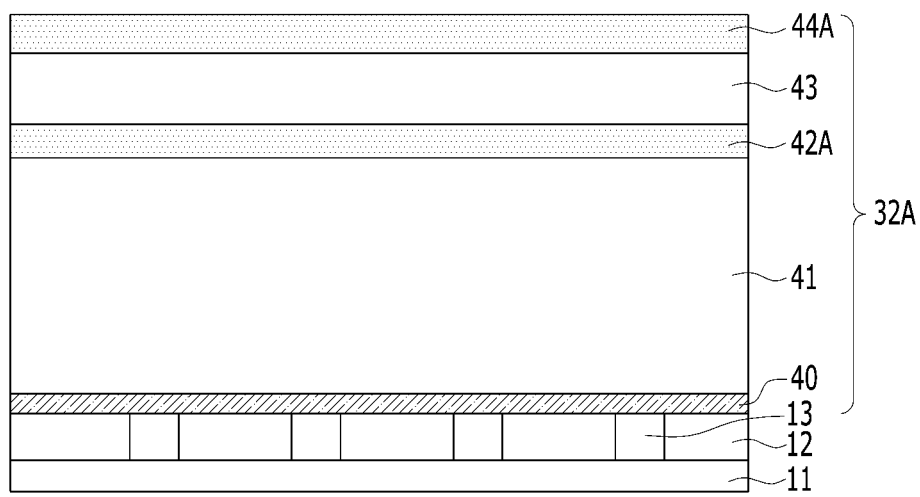
FIGS. 10A to 10J are cross-sectional views illustrating an example of a method for fabricating a semiconductor device in accordance with another embodiment of the present invention.

Referring to FIG. 10A, an inter-layer dielectric layer 12 may be formed over the substrate 11. A plurality of spaced apart contact plugs 13 penetrating the inter-layer dielectric layer 12 may be formed. The contact plugs 13 may penetrate the inter-layer dielectric layer 12 to be coupled to the substrate 11.

A mold stack layer 32A may be formed over the contact plugs 13 and the inter-layer dielectric layer 12. The mold stack layer 32A may include an etch stop layer 40, a lower-level mold layer 41, a lower-level supporter layer 42A, an upper-level mold layer 43, and an upper-level supporter layer 44A. The height of the bottom electrodes may be controlled by controlling the thickness of the mold stack layer 32A. The capacitance of a capacitor may vary according to the height of the bottom electrodes. For example, as the height of the mold stack layer 32A increases, the capacitance may also increase.

An etch stop layer 40 may be formed over the contact plugs 13 and the inter-layer dielectric layer 12. The etch stop layer 40 may be formed of a material having an etch selectivity with respect to the lower-level mold layer 41. The etch stop layer 40 may include, for example, silicon nitride.

A lower-level mold layer 41 may be formed over the etch stop layer 40. The lower-level mold layer 41 may include a dielectric material. The lower-level mold layer 41 may include BSG (Borosilicate Glass), PSG (PhosphoSilicate Glass), BPSG (BoroPhosphoSilicate Glass) or TEOS (Tetra ethly ortho silicate). The lower-level mold layer 41 may be a single layer. According to another embodiment of the present invention, the lower-level mold layer 41 may have a multi-layer structure of at least two or more layers. For example, BPSG and TEOS layers may be stacked.

A lower-level supporter layer 42A may be formed over the lower-level mold layer 41. The lower-level support layer 42A may have a smaller thickness than the lower-level mold layer 41. The difficulty of the etching process may be reduced by reducing the thickness of the lower-level supporter layer 42A. As the difficulty of the etching process is reduced, the capacitance of the capacitor may increase. The lower-level supporter layer 42A may be formed of a material having an etch selectivity with respect to the lower-level mold layer 41. The lower-level supporter layer 42A may include a nitrogen-containing material. The lower-level supporter layer 42A may include, for example, silicon nitride, silicon carbon nitride (SiCN), or a combination thereof.

The upper-level mold layer 43 may be formed over the lower-level supporter layer 42A. The upper-level mold layer 43 may include a dielectric material. The upper-level mold layer 43 may include BSG (Borosilicate Glass), PSG (PhosphoSilicate Glass), BPSG (BoroPhosphoSilicate Glass), or TEOS (Tetra ethly ortho silicate). The upper-level mold layer 43 may include a material which is the same as or different from that of the lower-level mold layer 41. The upper-level mold layer 43 may be a single layer. According to another embodiment of the present invention, the upper-level mold layer 43 may have a multi-layer structure of at least two or more layers. For example, BPSG and TEOS layers may be stacked. The thickness of the upper-level mold layer 43 may be the same as or different from that of the lower-level mold layer 41. For example, the thickness of the upper-level mold layer 43 may be equal to or smaller than the lower-level mold layer 41.

The upper-level supporter layer 44A may be formed over the upper-level mold layer 43. The thickness of the upper-level supporter layer 44A may be smaller than the thickness of the upper-level mold layer 43. The thickness of the upper-level supporter layer 44A may be the same as or different from that of the lower-level supporter layer 42A. For example, the thickness of the upper-level supporter layer 44A may be equal to or greater than the thickness of the lower-level supporter layer 42A. The difficulty of the etching process may be reduced according to the thickness of the upper-level supporter layer 44A. For example, as the thickness of the upper-level supporter layer 44A becomes thinner, the difficulty of the etching process may be reduced. The upper-level supporter layer 44A may be formed of a material having an etch selectivity with respect to the upper-level mold layer 43. The upper-level supporter layer 44A may include a nitrogen-containing material. The upper-level supporter layer 44A may include, for example, silicon nitride, silicon carbon nitride (SiCN), silicon boron nitride (SiBN), or a combination thereof. The upper-level supporter layer 44A may include a material which is the same as or different from that of the lower-level supporter layer 42A.

Figure 10B:
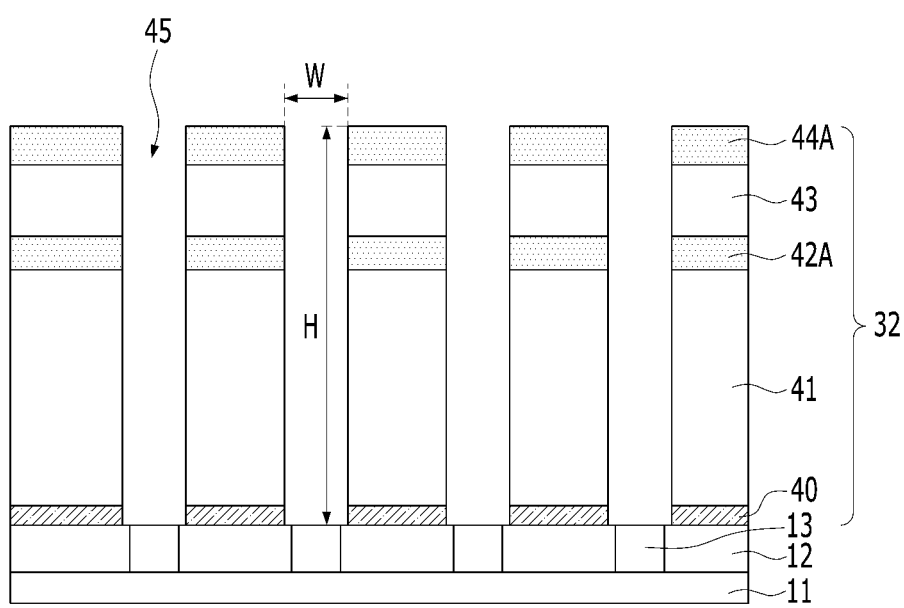

Referring to FIG. 10B, a plurality of spaced apart openings 45 may be formed in the mold stack layer 32A. The openings 45 may be formed on corresponding contact plugs 13. The openings 45 may be referred to as holes in which bottom electrodes (or storage nodes) are to be formed. The openings 45 may be formed by using a mask layer (not shown) and thereby etching the mold stack layer 32A. The mask layer (not shown) may include a photoresist pattern or a hard mask pattern. In order to form the openings 45, the upper layer supporter layer 44A, the upper-level mold layer 43, the lower-level supporter layer 42A, and the lower-level mold layer 41 may be sequentially etched by using the mask layer as an etch barrier. The etching process for forming the openings 45 may stop at the etch stop layer 40. Subsequently, the etch stop layer 40 may be etched to expose the upper surface of the contact plugs 13 below the openings 45.

A mold stack pattern 32 including a plurality of openings 45 may be formed by a series of the etching processes as described above. Herein, the openings 45 may be diversely formed according to the difficulty of the etching process. For example, as the thickness of the lower-level supporter layer 42A decreases, sidewalls of the openings 45 may be vertically formed. The vertically formed sidewalls of the openings 45 may improve the contact failure with the contact plugs 13 and increase the capacitance of the capacitor. To form the openings 45, a dry etching process, a wet etching process, or a combination thereof may be used. The openings 45 may have a high aspect ratio. The aspect ratio refers to a ratio of width W to height H. The aspect ratio of each of the openings 45 refers to the its height over its width. The openings 45 may have an aspect ratio of approximately at least 1:1. For example, the height of the openings 45 may be ten times greater than the width of the openings 45.

Figure 10C:
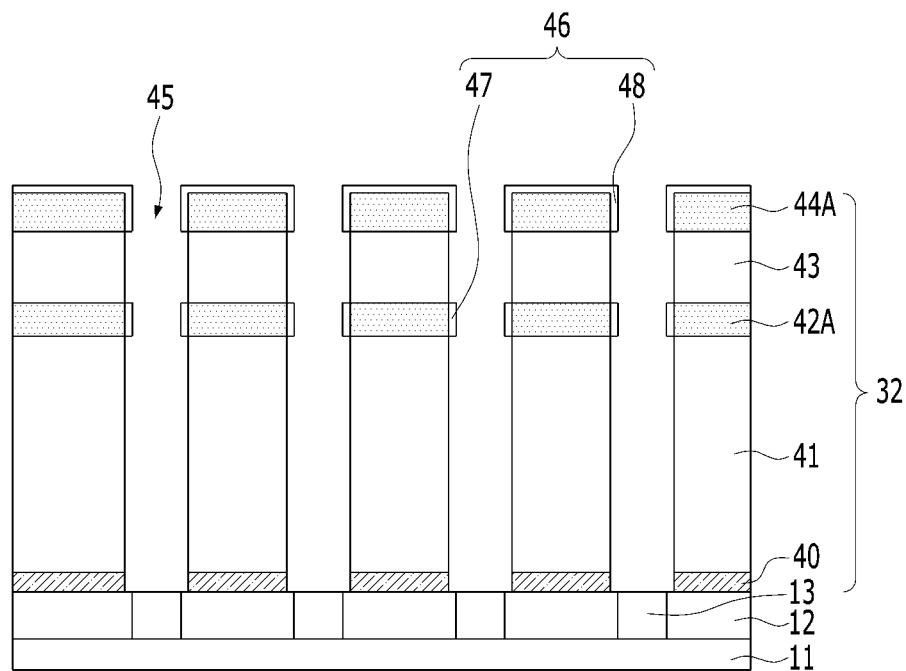

Referring to FIG. 10C, a supporter reinforcement structure 46 may be formed in the openings 45. The supporter reinforcement structure 46 may have a multi-level structure including at least one supporter reinforcement layer. The supporter reinforcement structure 46 may include a lower-level supporter reinforcement layer 47 and an upper-level supporter reinforcement layer 48 disposed at higher level than the lower-level supporter reinforcement layer 47.

The supporter reinforcement structure 46 may selectively grow from the exposed surfaces of the upper-level supporter layer 44A and the lower-level supporter layer 42A that are formed inside the openings 45. The supporter reinforcement structure 46 may not grow from the exposed surfaces of the upper-level mold layer 43 and the lower-level mold layer 41 that are formed inside the openings 45. The supporter reinforcement structure 46 may grow at a higher deposition rate on the surfaces of the upper-level supporter layer 44A and the lower-level supporter layer 42A than on the surfaces of the upper-level mold layer 43 and the lower-level mold layer 41. The difference in the growth rate may be induced by the difference in nucleation incubation time for the formation of the supporter reinforcement structure 46 on the surfaces of different materials. For example, the supporter reinforcement structure 46 may have a shorter nucleation incubation time on the surfaces of the upper-level supporter layer 44A and the lower-level supporter layer 42A than on the surfaces of the upper-level mold layer 43 and the lower-level mold layer 41. For example, there may be an incubation delay of the supporter reinforcement structure 46 on the surfaces of the upper-level mold layer 43 and the lower-level mold layer 41. Thus, while the selective growth process is continued, the supporter reinforcement structure 46 may grow from the exposed surfaces of the upper-level supporter layer 44A and the lower-level supporter layer 42A, and may not grow from the exposed surfaces of the upper-level mold layer 43 and the lower-level mold layer 41. The selective growth process may be terminated before the supporter reinforcement structure 46 is deposited over the upper-level mold layer 43 and the lower-level mold layer 41.

In an embodiment, the supporter reinforcement structure 46 may grow over the exposed surfaces of the upper-level supporter layer 44A, the lower-level supporter layer 42A, the upper-level mold layer 43, and the lower-level mold layer 41 that are formed inside the openings 45. The incubation time of the supporter reinforcement structure 46 may be shorter on the surfaces of the upper-level supporter layer 44A and the lower-level supporter layer 42A than on the surfaces of the upper-level mold layer 43 and the lower-level mold layer 41. Therefore, before nuclei are generated on the surfaces of the upper-level mold layer 43 and the lower-level mold layer 41, the supporter reinforcement structure 46 is formed over the upper-level supporter layer 44A and the lower-level supporter layer 42A. While the deposition process of the supporter reinforcement structure 46 is continued, the thicknesses of the supporter reinforcement structure 46 over the upper-level supporter layer 44A and the lower-level supporter layer 42A may be greater than the thicknesses of the supporter reinforcement structure 46 over the upper-level mold layer 43 and the lower-level mold layer 41.

In this case, the selective growth process may include an etch-back process. Therefore, an etch-back process may be performed after the deposition process of the supporter reinforcement structure 46. The etch-back process may completely remove the supporter reinforcement structure formed on the surfaces of the upper-level mold layer 43 and the lower-level mold layer 41, and the upper-level supporter reinforcement layer 48 formed on the surface of the upper-level supporter layer 44A and a portion of the initial thickness of the lower-level supporter reinforcement layer 47 formed on the surface of the lower-level supporter layer 42A may remain. Therefore, the thickness of the upper-level supporter reinforcement layer 48 after the etch-back process may be equal to or less than the thickness of the upper-level supporter reinforcement layer 48 before the etch-back process. The thickness of the lower-level supporter reinforcement layer 47 after the etch-back process may be equal to or less than the thickness of the lower-level supporter reinforcement layer 47 before the etch-back process.

The shape of the supporter reinforcement structure 46 may vary. The sidewall profile of the supporter reinforcement structure 46 may be at least one among a vertical shape, a curved shape, and a tapered shape. The supporter reinforcement structure 46 may have a sidewall profile according to FIGS. 4A to 4D. The sidewall profiles of the lower-level supporter reinforcement layer 47 and the upper-level supporter reinforcement layer 48 may be the same or different. For example, the lower-level supporter reinforcement layer 47 may have a curve-shaped sidewall profile, and the upper-level supporter reinforcement layer 48 may have a vertical sidewall profile. The lower-level supporter reinforcement layer 47 may have a tapered sidewall profile that becomes thicker as it goes down toward the lower portion of the lower-level supporter layer 42A, and the upper-level supporter reinforcement layer 48 may have a curve-shaped sidewall profile. In this embodiment of the present invention, the lower-level supporter reinforcement layer 47 may have a vertical sidewall profile whose height is the same as the height of the lower-level supporter layer 42A, and the upper-level supporter reinforcement layer 48 may have a vertical sidewall profile whose height is higher than the height of the upper-level supporter layer 44A.

The supporter reinforcement structure 46 may include a nitrogen-containing material. The supporter reinforcement structure 46 may include, for example, silicon nitride, silicon carbon nitride (SiCN), silicon boron nitride (SiBN), or a combination thereof. The lower-level supporter reinforcement layer 47 and the upper-level supporter reinforcement layer 48 may be of the same material or different materials. The supporter reinforcement structure 46 may be formed, for example, by a chemical vapor deposition (CVD) process or an atomic layer deposition (ALD) process. The supporter reinforcement structure 46 may selectively grow using an atomic layer deposition (ALD) process or a low-pressure chemical vapor deposition (LPCVD) process using, for example, dichloro silane ($SiH_2Cl_2$) and ammonia ($NH_3$) as reaction gases. The method for forming the lower-level supporter reinforcement layer 47 and the method for forming the upper-level supporter reinforcement layer 48 may be the same or different. The thickness of the lower-level supporter reinforcement layer 47 and the thickness of the upper-level supporter reinforcement layer 48 may be the same or different.

The lower-level supporter reinforcement layer 47 may selectively grow from the exposed surface of the lower-level supporter layer 42A that is exposed in the openings 45. Therefore, the lower-level supporter reinforcement layer 47 may be selectively formed on the side portion of the lower-level supporter layer 42A. The height of the lower-level supporter reinforcement layer 47 may be the same as or different from the height of the lower-level supporter layer 42A. The height from the etch stop layer 40 to the lower-level supporter reinforcement layer 47 may be the same as or different from the height from the etch stop layer 40 to the surface of the lower-level supporter layer 42A. The lower-level supporter reinforcement layer 47 may have a surround shape surrounding the middle portions of the openings 45.

The upper-level supporter reinforcement layer 48 may selectively grow from the exposed surface of the upper-level supporter layer 44A that is exposed in the openings 45. Therefore, the upper-level supporter reinforcement layer 48 may be selectively formed on the side portion and the upper surface of the upper-level supporter layer 44A. The height of the upper-level supporter reinforcement layer 48 may be the same as or different from the height of the upper-level supporter layer 44A. The height of the upper-level supporter reinforcement layer 48 may be greater than the height of the upper-level supporter layer 44A. The height from the etch stop layer 40 to the upper-level supporter reinforcement layer 48 may be the same as or different from the height from the etch stop layer 40 to the lower surface of the upper-level supporter layer 44A. The upper-level supporter reinforcement layer 48 may have a surround shape surrounding the upper portions of the openings 45.

As described above, the lower-level supporter reinforcement layer 47 and the upper-level supporter reinforcement layer 48 may selectively grow from the lower-level supporter layer 42A and the upper-level supporter layer 44A, respectively. Therefore, the lower-level supporter reinforcement layer 47 and the upper-level supporter reinforcement layer 48 may increase the structural stability of the lower-level supporter layer 42A and the upper-level supporter layer 44A, respectively. Even though the lower-level supporter layer 42A and the upper-level supporter layer 44A are formed thin, a supporter material may be reinforced by the lower-level supporter reinforcement layer 47 and the upper-level supporter reinforcement layer 48, thus stably supporting the bottom electrode during the subsequent process. Since the lower-level supporter layer 42A and the upper-level supporter layer 44A may be formed thin, an etching process for forming the openings 45 may be performed easily, and etching defects, such as not-open, may be prevented. The width (or diameter) of the openings 45 may be decreased by the lower-level supporter reinforcement layer 47 and the upper-level supporter reinforcement layer 48. Since the openings 45 is formed to have a larger width (or diameter) than the width (or diameter) of the subsequent bottom electrode and then the lower-level supporter reinforcement layer 47 and the upper-level supporter reinforcement layer 48 are formed, the gap-fill of the subsequent bottom electrode may be easy.

Figure 10D:
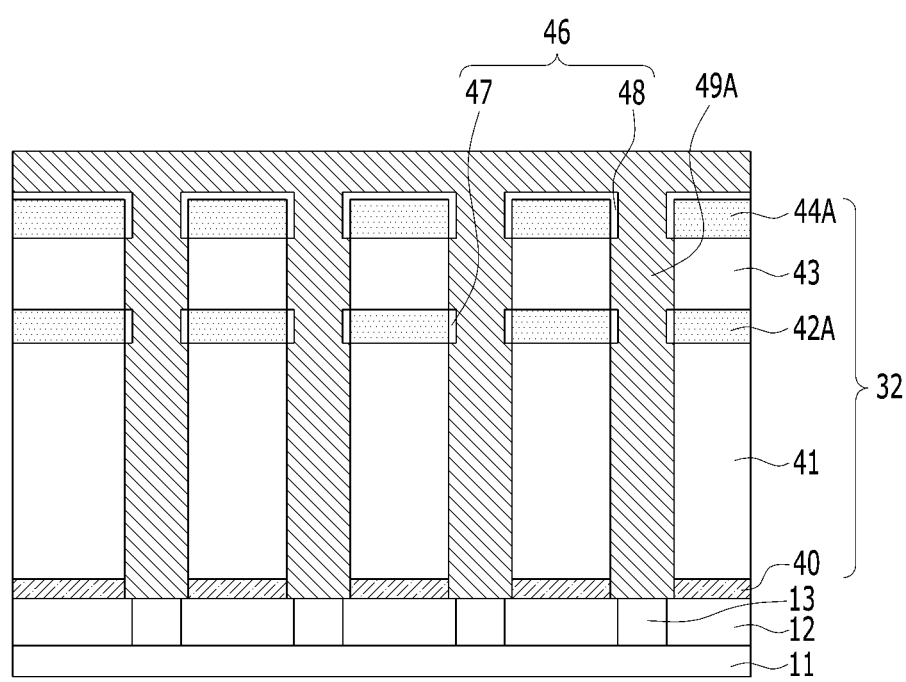

Referring to FIG. 10D, a bottom electrode layer 49A may be formed in the openings 45 in which the supporter reinforcement structure 46 is formed. The bottom electrode layer 49A may be formed over the contact plugs 13. Therefore, the bottom electrode layer 49A may each be electrically connected to the contact plugs 13.

The bottom electrode layer 49A may include a metal, a metal nitride, or a combination thereof. The bottom electrode layer 49A may include at least one among titanium (Ti), titanium nitride (TiN), tantalum (Ta), tantalum nitride (TaN), titanium aluminum nitride (TiAlN), tungsten (W) or tungsten nitride (WN), ruthenium (Ru), ruthenium oxide (RuO$_2$), iridium (Ir), iridium oxide (IrO$_2$), platinum (Pt), and combinations thereof. In this embodiment of the present invention, the bottom electrode layer 49A may, for example, include titanium nitride (TiN). The bottom electrode layer 49A may, for example, include titanium nitride (ALD-TiN) that is formed by an atomic layer deposition (ALD) process.

Figure 10E:
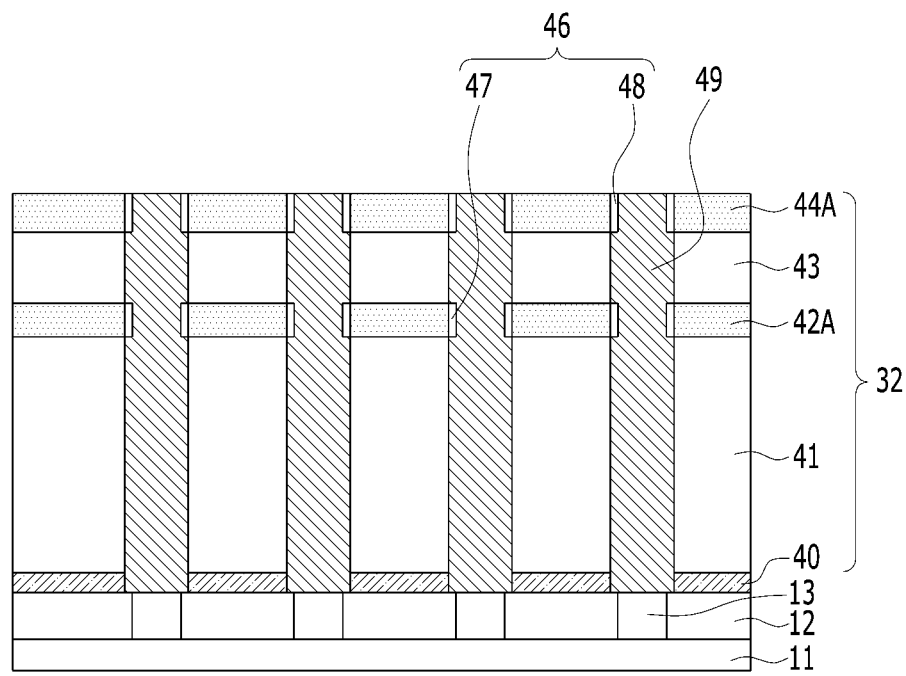

Referring to FIG. 10E, a bottom electrode isolation process may be performed. For example, to form the bottom electrodes 49 in the corresponding openings 45, a portion of the bottom electrode layer 49A may be selectively removed. The bottom electrode isolation process may be performed by a polishing process. For example, the bottom electrodes 49 may be formed by Chemical Mechanical Polishing (CMP) of the bottom electrode layer 49A. While the bottom electrodes 49 are formed, the upper-level supporter reinforcement layer 48 on the upper surface of the upper-level supporter layer 44A may be removed. As a result, the bottom electrodes 49 may be formed inside the openings 45.

The lower-level supporter reinforcement layer 47 may be positioned between the bottom electrode 49 and the lower-level supporter layer 42A. The upper-level supporter reinforcement layer 48 may be positioned between the bottom electrode 49 and the upper-level supporter layer 44A. The lower-level supporter reinforcement layer 47 and the upper-level supporter reinforcement layer 48 may have a surround shape surrounding the bottom electrode 49. The lower-level supporter reinforcement layer 47 may have a shape that fully covers the contact surface between the lower-level supporter layer 42A and the bottom electrode 49. The upper-level supporter reinforcement layer 48 may have a shape that fully covers the contact surface between the upper-level supporter layer 44A and the bottom electrodes 49. From the perspective of a top view, the supporter reinforcement structure 46 may have a closed loop shape. The bottom electrode 49 may include one shape among a pillar shape, a cylinder shape, and a pylinder shape. The bottom electrodes 49 may have a cylinder shape shown in FIG. 6A. The bottom electrode 49 may have a pylinder shape shown in FIG. 6B. In this embodiment of the present invention, the bottom electrodes 49 may have a pillar shape.

The bottom electrodes 49 may have a high aspect ratio. The aspect ratio of each of the bottom electrodes refers to its height over its width. The high aspect ratio refers to an aspect ratio that is greater than approximately 1:1 For example, the height of the bottom electrodes 49 may be ten times greater than the width of the bottom electrodes 49.

Figure 10F:
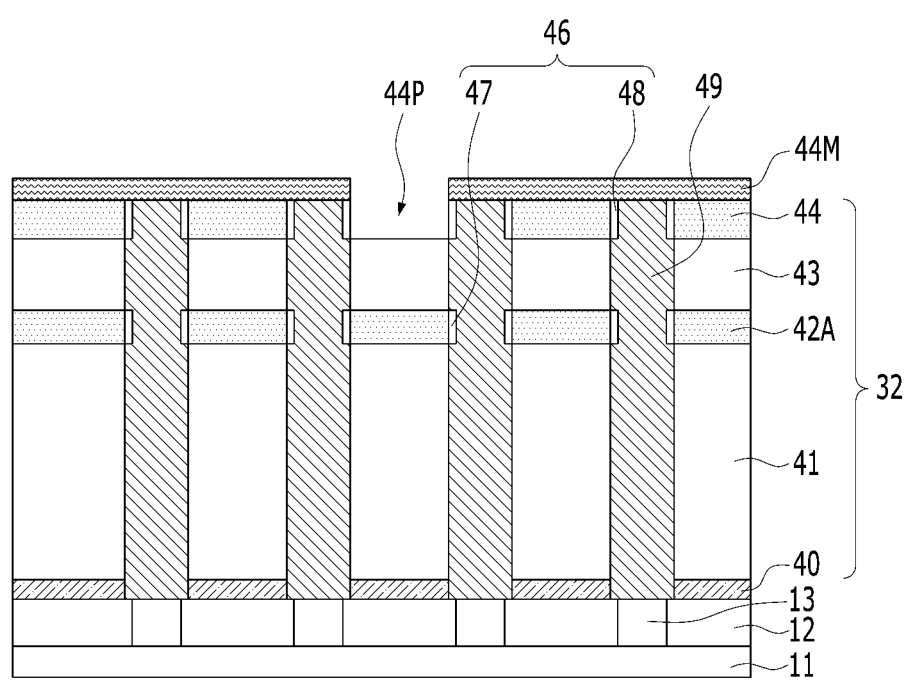

Referring to FIG. 10F, an upper-level supporter 44 supporting the upper outer wall of the bottom electrodes 49 may be formed. In order to form the upper-level supporter 44, the upper-level supporter layer 44A may be etched by using the mask layer 44M. The mask layer 44M may include a photoresist pattern or a hard mask pattern. The upper-level supporter layer 44A exposed by the mask layer 44M may be selectively etched. The upper-level supporter openings 44P formed by etching the upper-level supporter layer 44A may have the same arrangement and shape as those of the supporter openings 105A shown in FIG. 3B. Therefore, the upper-level supporter 44 may include a plurality of upper-level supporter openings 44P.

A plurality of upper-level supporter openings 44P may be positioned between the neighboring upper-level supporter reinforcement layers 48. The upper-level supporter openings 44P may partially expose the upper-level supporter reinforcement layers 48. Each of the upper-level supporter openings 44P may expose at least three or more neighboring upper-level supporter reinforcement layers 48. In this embodiment of the present invention, one upper-level supporter opening 44P may be adjacent to at least three upper-level supporter reinforcement layers 48, and three upper-level supporter reinforcement layers 48 may be exposed by one upper-level supporter opening 44P. The upper-level supporter openings 44P may be formed in diverse shapes, such as a triangle, a square, and a pentagon. In this embodiment of the present invention, the cross section of the upper-level supporter openings 44P may be formed in a triangular shape. Some surfaces of the upper-level mold layers 43 may be exposed by the upper-level supporter openings 44P.

The upper-level supporter reinforcement layer 48 may be positioned on the side portion of the upper-level supporter 44. The upper-level supporter reinforcement layer 48 may be positioned between the bottom electrode 49 and the upper-level supporter 44. While the upper-level supporter layer 44A is etched, a portion of the upper-level supporter reinforcement layer 48 may be etched.

Figure 10G:
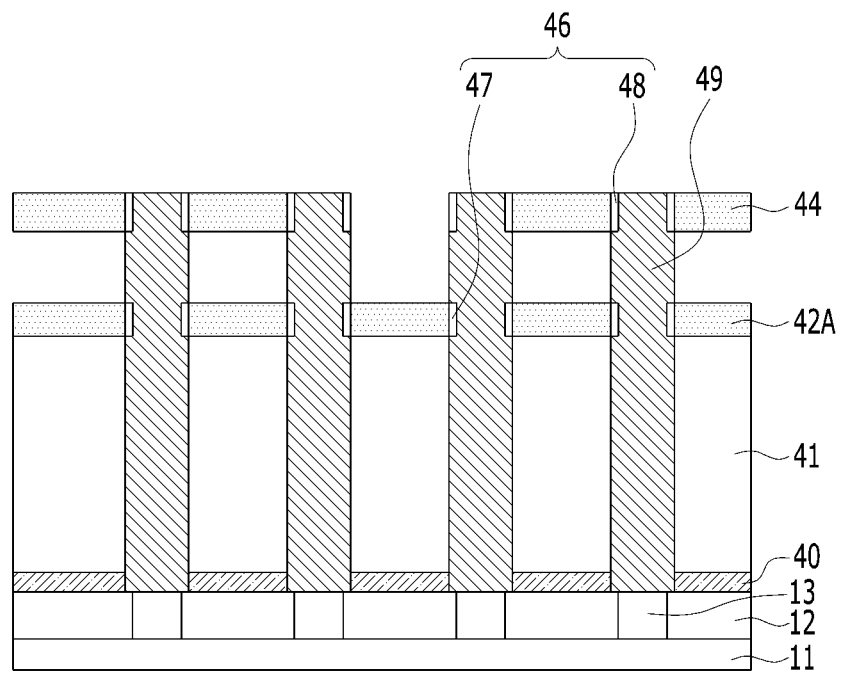

Referring to FIG. 10G, the upper-level mold layer 43 may be removed. For example, the upper-level mold layer 43 may be removed by a wet dip-out process. A wet chemical for removing the upper-level mold layer 43 may be supplied through the upper-level supporter openings 44P. As for the wet chemical, one or more chemicals among HF, NH$_4$F/NH$_4$OH, H$_2$O$_2$, HCl, HNO$_3$, and H$_2$SO$_4$ may be used. When the upper-level mold layer 43 is removed, the upper-level supporter 44 and the lower-level supporter layer 42A having an etch selectivity with respect to the upper-level mold layer 43 may not be removed. As the upper-level mold layer 43 is removed, the outer wall of the upper portion of the bottom electrode 49 may be exposed. Herein, the upper outer wall of the bottom electrode 49 may be supported by the upper-level supporter reinforcement layer 48 and the upper-level supporter 44. Accordingly, the bottom electrode 49 may be prevented from collapsing.

Figure 10H:
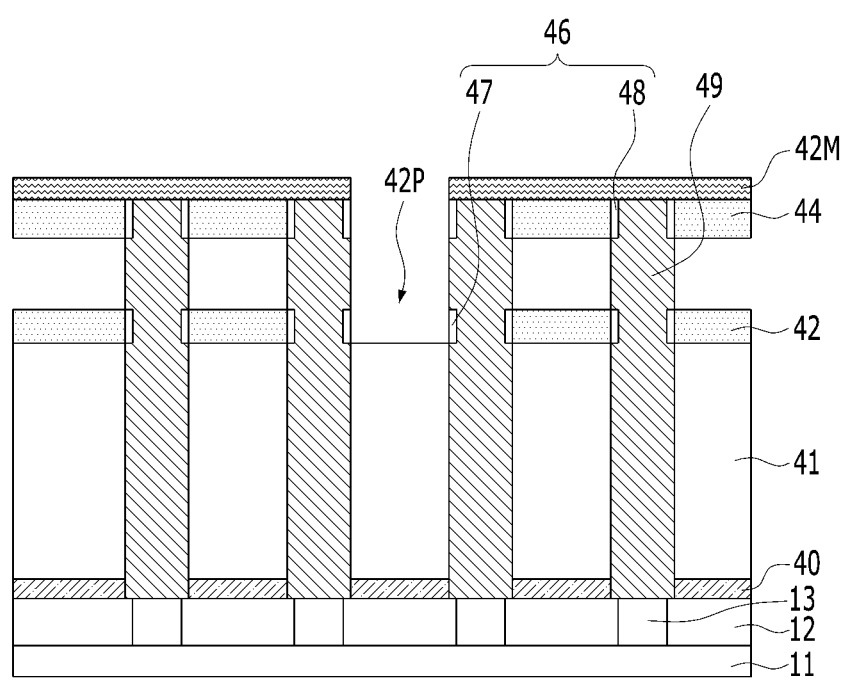

Referring to FIG. 10H, a lower-level supporter 42 may be formed. In order to form the lower-level supporter 42, the lower-level supporter layer 42A may be selectively etched by using the mask layer 42M. Also, the lower-level supporter layer 42A may be selectively etched to be self-aligned to the upper-level supporter 44. The lower-level supporter openings 42P formed by etching the lower-level supporter layer 42A may have the same arrangement and shape as those of the lower-level supporter openings 105A shown in FIG. 3B. Therefore, the lower-level supporter layer 42A may include a plurality of lower-level supporter openings 42P.

A plurality of lower-level supporter openings 42P may be positioned between the neighboring lower-level supporter reinforcement layers 47. The number of the lower-level supporter reinforcement layers 47 positioned adjacent to the lower-level supporter openings 42P may be three or more. In this embodiment of the present invention, the lower-level supporter openings 42P may be positioned adjacent to the three lower-level supporter reinforcement layers 47. The lower-level supporter openings 42P may be formed in diverse shapes, such as a triangle, a square, and a pentagon. In this embodiment of the present invention, the lower-level supporter openings 42P may be formed in a triangular shape. The shape of the lower-level supporter openings 42P may be the same as or different from the shape of the upper-level supporter openings 44P. Some surfaces of the lower-level mold layer 41 may be exposed by the lower-level supporter openings 42P.

The lower-level supporter reinforcement layer 47 may be positioned on a side portion of the lower-level supporter 42. The lower-level supporter reinforcement layer 47 may have a shape surrounding the middle portion of the bottom electrodes 49. The lower-level supporter reinforcement layer 47 may be positioned between the bottom electrodes 49 and the lower-level supporter 42. While the lower-level supporter layer 42A is etched, a portion of the lower-level supporter reinforcement layer 47 may be etched.

Figure 10I:
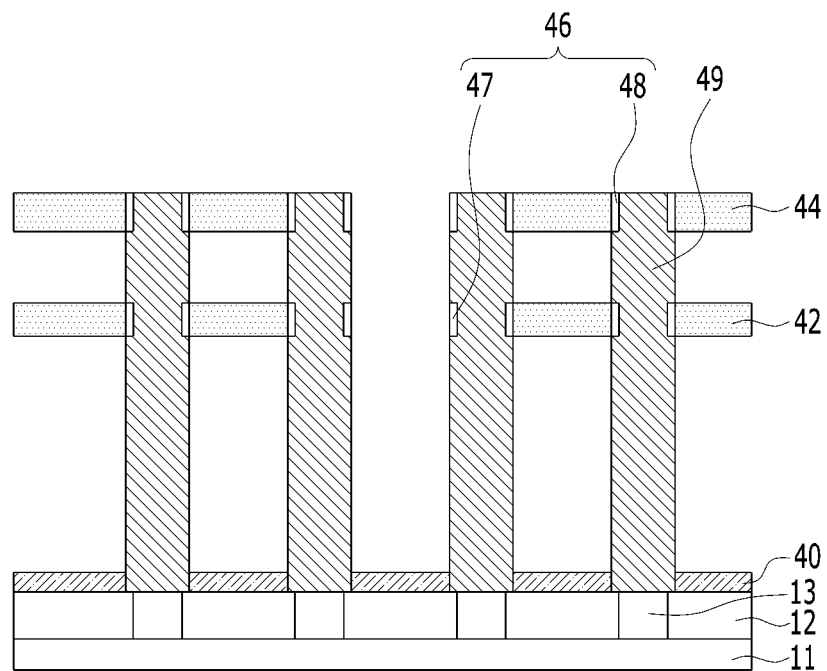

Referring to FIG. 10I, the lower-level mold layer 41 may be removed. For example, the lower-level mold layer 41 may be removed by a wet dip-out process. The wet chemical for removing the lower-level mold layer 41 may be supplied through the lower-level supporter openings 42P. As for the wet chemical, one or more chemicals among HF, $NH_4F$/$NH_4OH$, $H_2O_2$, HCl, $HNO_3$, and $H_2SO_4$ may be used. When the lower-level mold layer 41 is removed, the upper-level supporter 44 and the lower-level supporter 42 having an etch selectivity with respect to the lower-level mold layer 41 may not be removed. When the lower-level mold layer 41 is removed, the etch stop layer 40 may protect the inter-layer dielectric layer 12 and the contact plugs 13 from being damaged. As the lower-level mold layer 41 is removed, an outer wall of the middle portion of the bottom electrodes 49 may be exposed. Herein, the middle portion of the bottom electrodes 49 may be supported by the lower-level supporter reinforcement layer 47 and the lower-level supporter 42.

Figure 10J:
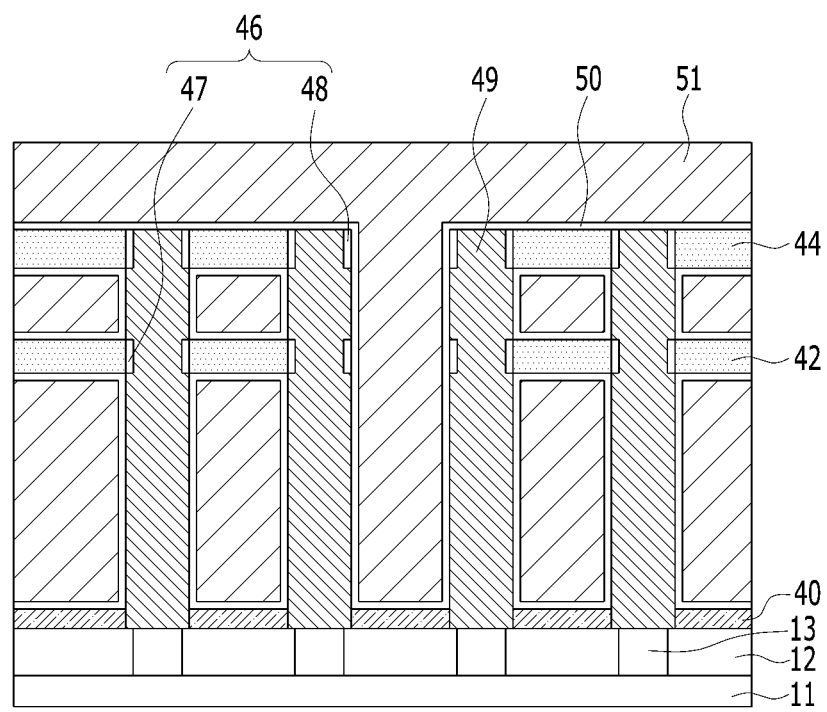

Referring to FIG. 10J, a dielectric layer 50 may be formed. The dielectric layer 50 may be formed on the upper and sidewall portions of the bottom electrode 49, the upper and lower portions of the lower-level supporter 42, the upper and lower portions of the upper-level supporter 44, and the upper and sidewall portions of the upper-level supporter reinforcement layer 48, and the sidewall portion of the lower-level supporter reinforcement layer 47. A portion of the dielectric layer 50 may cover the etch stop layer 40. The dielectric layer 50 may cover the lower-level supporter 42 and the upper-level supporter 44.

A top electrode 51 may be formed on the dielectric layer 50.

FIGS. 11A to 11E are cross-sectional views illustrating an example of a method for fabricating a semiconductor device in accordance with an embodiment of the present invention.

First, a supporter reinforcement structure 46 and a plurality of bottom electrodes 49 may be formed by the method illustrated in FIGS. 10A to 10E.

Figure 11A:
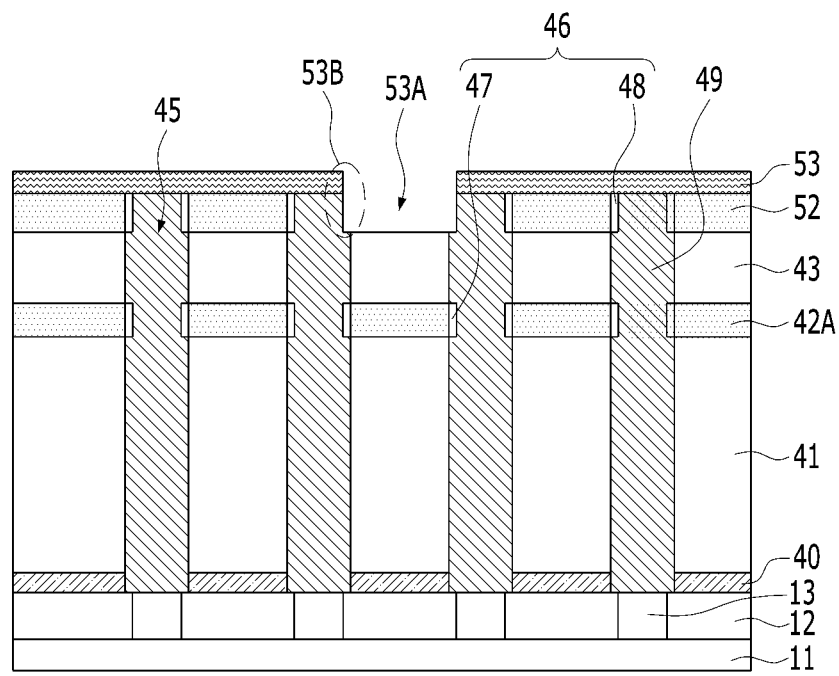
FIGS. 11A to 11E are cross-sectional views illustrating another example of a method for fabricating a semiconductor device in accordance with another embodiment of the present invention.

Subsequently, as illustrated in FIG. 11A, an upper-level supporter 52 supporting the upper outer wall of the bottom electrodes 49 may be formed. In order to form the upper-level supporter 52, the upper-level supporter layer 44A may be etched by using the mask layer 53. The mask layer 53 may include a photoresist pattern or a hard mask pattern. The mask layer 53 may expose portions of the upper-level supporter layer 44A and may also expose portions of the upper-level supporter reinforcement layer 48.

A portion of the upper-level supporter layer 44A exposed by the mask layer 53 may be etched to form the upper-level supporter 52. Also, some or all of the upper-level supporter reinforcement layer 48 exposed by the mask layer 53 may be selectively etched. As the upper-level supporter reinforcement layer 48 is partially etched, the supporter reinforcement layer cutting portion 53B may be formed.

The upper-level supporter 52 may have supporter openings 53A having the same arrangement and shape as those of the supporter openings 105B shown in FIG. 5. Accordingly, the upper-level supporter 52 may include a plurality of upper-level supporter openings 53A. A plurality of upper-level supporter openings 53A may be positioned between the neighboring bottom electrodes 49.

The upper-level supporter reinforcement layer 48 may be positioned between the bottom electrodes 49 and the upper-level supporter 52. From the perspective of a top view, the upper-level supporter reinforcement layer 48 may have a shape partially surrounding the upper sidewall of the bottom electrodes 49. The upper-level supporter reinforcement layer 48 may have a broken loop-shape by the supporter reinforcement layer cutting portion 53B.

The upper sidewall of the bottom electrodes 49 may be partially exposed by the supporter reinforcement layer cutting portion 53B.

Figure 11B:
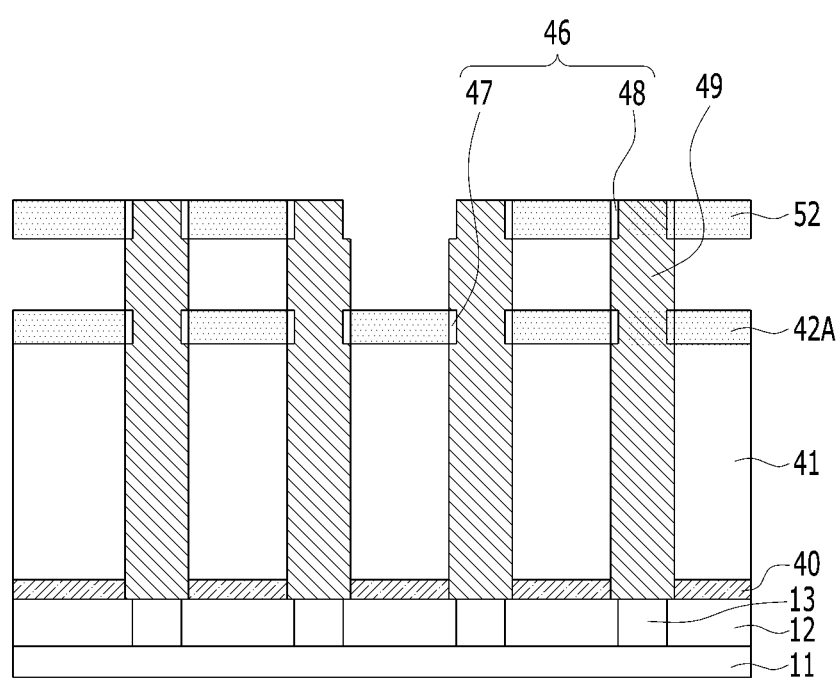

Referring to FIG. 11B, the upper-level mold layer 43 may be removed. For example, the upper-level mold layer 43 may be removed by a wet dip-out process.

Figure 11C:
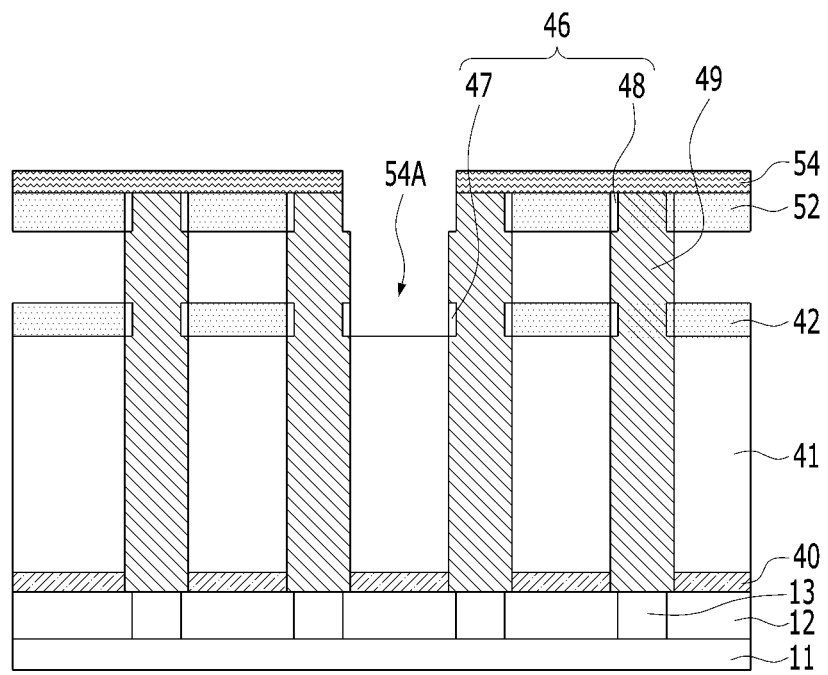

Referring to FIG. 11C, a lower-level supporter 42 may be formed by selectively etching the lower-level supporter layer 42A using the mask layer 54. The lower-level supporter layer 42A may be self-aligned to the upper-level supporter 52 and etched. The lower-level supporter openings 54A formed by etching the lower-level supporter layer 42A may have the same arrangement and shape as those of the supporter openings 105A shown in FIG. 3B. Therefore, the lower-level supporter 42 may include a plurality of lower-level supporter openings 54A.

The lower-level supporter reinforcement layer 47 may be positioned on a side portion of the lower-level supporter 42. The lower-level supporter reinforcement layer 47 may have a shape surrounding the middle portion of the bottom electrodes 49. The lower-level supporter reinforcement layer 47 may be positioned between the bottom electrodes 49 and the lower-level supporter 42. The lower-level supporter reinforcement layer 47 may include a closed loop shape.

Figure 11D:
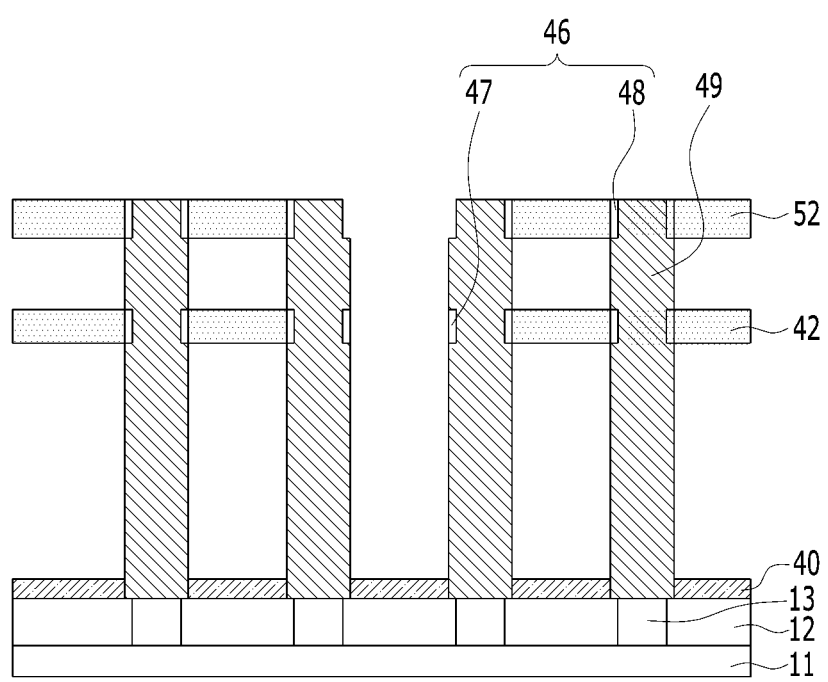

Referring to FIG. 11D, the lower-level mold layer 41 may be removed. For example, the lower-level mold layer 41 may be removed by a wet dip-out process.

Figure 11E:
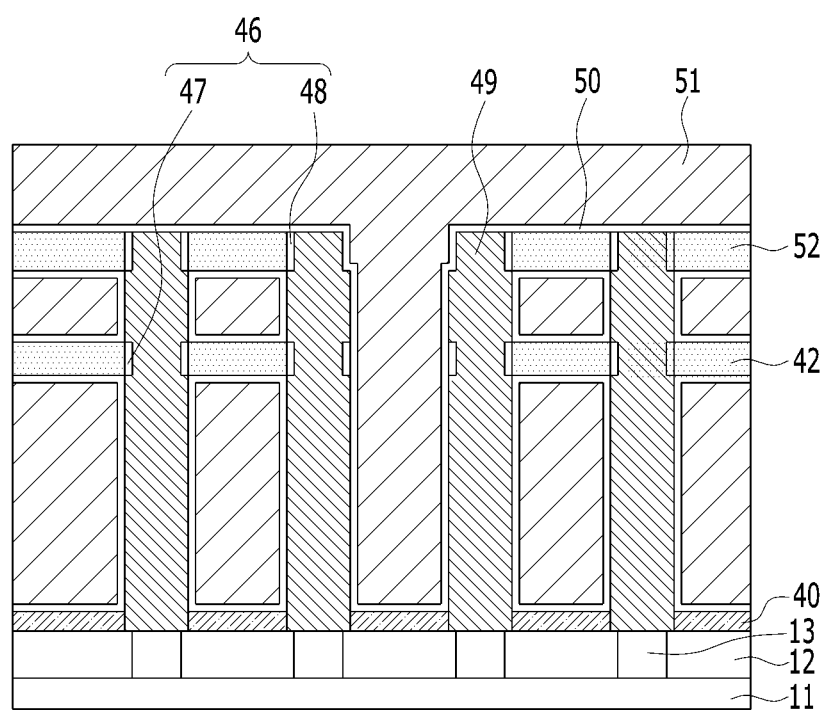

Referring to FIG. 11E, the dielectric layer 50 and the top electrode 51 may be sequentially formed. The dielectric layer 50 may be formed on the upper and sidewall portions of the bottom electrodes 49, the upper and lower portions of the lower-level supporter 42, the upper and lower portions of the upper-level supporter 52, and the upper and sidewall portions of the upper-level supporter reinforcement layer 48, and the sidewall portion of the lower-level supporter reinforcement layer 47. A portion of the dielectric layer 50 may cover the etch stop layer 40. The dielectric layer 50 may cover the lower-level supporter 42 and the upper-level supporter 52.

The top electrode 51 may include a metal material or a metal-based conductive material.

Figure 12A:
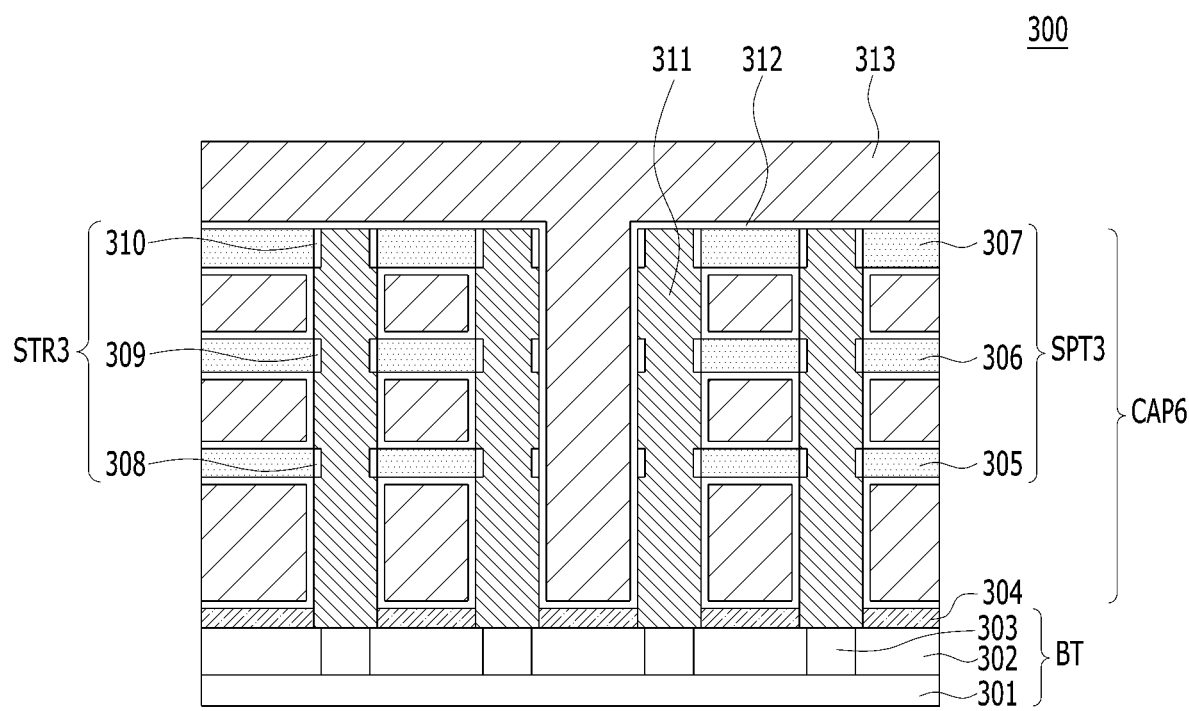
FIGS. 12A and 12B are cross-sectional views illustrating a semiconductor device in accordance with another embodiment of the present invention.
Figure 12B:
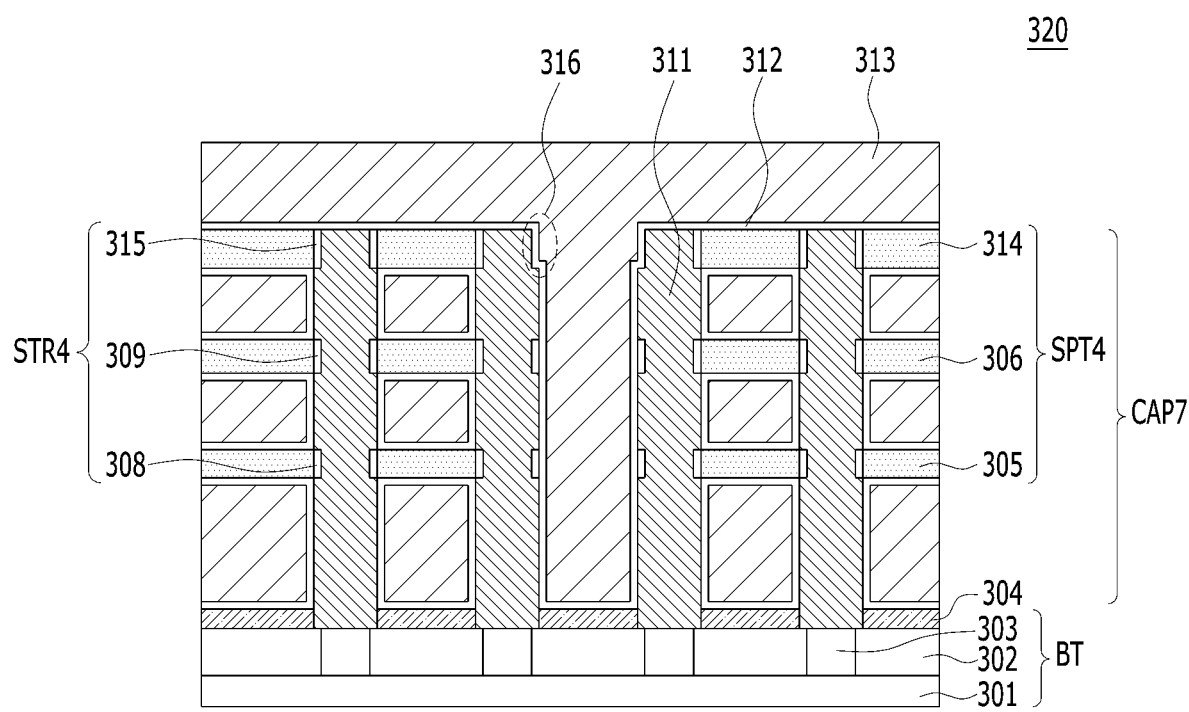

FIGS. 12A and 12B are cross-sectional views illustrating a semiconductor device 300 in accordance with another embodiment of the present invention. The semiconductor device 300 may be identical or similar to the semiconductor device 200 of FIG. 9A.

Referring to FIG. 12A, the semiconductor device 300 may include a lower structure BT and a capacitor structure CAP6 disposed over the lower structure BT.

The lower structure BT may include a substrate 301, an inter-layer dielectric layer 302, and contact plugs 303. The contact plugs 303 may penetrate the inter-layer dielectric layer 302 to be coupled to the substrate 301.

The capacitor structure CAP6 may include an etch stop layer 304, a supporter structure SPT3, a supporter reinforcement structure STR3, a plurality of bottom electrodes 311, a dielectric layer 312, and a top electrode 313.

The bottom electrodes 311 may be formed over the contact plugs 303. The bottom electrodes 311 may each be electrically connected to a corresponding one of the contact plugs 303. The dielectric layer 312 may be formed over the bottom electrodes 311 and the top electrode 313 may be formed over the dielectric layer 312.

The outer wall of the bottom electrodes 311 may be supported by the supporter structure SPT3. The supporter structure SPT3 may be a multi-level structure including at least one supporter or more. For example, the supporter structure SPT3 may include a lower-level supporter 305, a middle-level supporter 306 positioned at higher level than the lower level, and an upper-level supporter 307 positioned at a higher level than the middle level. The supporter structure SPT3 may be formed to support the bottom electrodes 311 in a lateral direction to prevent the bottom electrodes 311 from collapsing. The supporter structure SPT3 may include a nitrogen-containing material. The supporter structure SPT3 may be formed of a dielectric material, such as silicon nitride. The lower-level supporter 305, the middle-level supporter 306, and the upper-level supporter 307 may be formed of the same material or different materials. The thickness of the upper-level supporter 307 may be the same as or different from the thickness of the middle-level supporter 306. The thickness of the upper-level supporter 307 may be the same as or different from the thickness of the lower-level supporter 305. The thickness of the upper-level supporter 307 may be greater than the thickness of the middle-level supporter 306. The thickness of the upper-level supporter 307 may be greater than the thickness of the lower-level supporter 305.

The supporter reinforcement structure STR3 may be a multi-level structure including at least one supporter reinforcement layer or more. For example, the supporter reinforcement structure STR3 includes a lower-level supporter reinforcement layer 308, a middle-level supporter reinforcement layer 309 disposed at higher level than the lower-level supporter reinforcement layer 308, and an upper-level supporter reinforcement layer 310 disposed at higher level than the middle-level supporter reinforcement layer 309. From the perspective of a top view, the supporter reinforcement structure STR3 may have a closed loop shape surrounding the sidewall of the bottom electrodes 311. The supporter reinforcement structure STR3 may be positioned between the bottom electrodes 311 and the supporter structure SPT3. The supporter reinforcement structure STR3 may fully cover the contact surface between the supporter structure SPT3 and the bottom electrodes 311. The shape of the supporter reinforcement structure STR3 may vary. The sidewall profile of the supporter reinforcement structure STR3 may be at least one among a vertical shape, a curved shape, and a tapered shape. The supporter reinforcement structure STR3 may include sidewall profiles of FIGS. 4A to 4D. The sidewall profiles of the lower-level supporter reinforcement layer 308, the middle-level supporter reinforcement layer 309, and the upper-level supporter reinforcement layer 310 may be the same or different.

The lower-level supporter reinforcement layer 308 may be formed on the side portion of the lower-level supporter 305. The lower-level supporter reinforcement layer 308 may have a shape surrounding the outer wall of the bottom electrodes 311. The lower-level supporter reinforcement layer 308 may be positioned between the bottom electrodes 311 and the lower-level supporter 305. The height of the lower-level supporter reinforcement layer 308 may be the same as or different from the height of the lower-level supporter 305. The height from the etch stop layer 304 to the lower-level supporter reinforcement layer 308 may be the same as or different from the etch stop layer 304 to the surface of the lower-level supporter 305.

The middle-level supporter reinforcement layer 309 may be formed on the side portion of the middle-level supporter 306. The middle-level supporter reinforcement layer 309 may have a shape surrounding the outer wall of the bottom electrodes 311. The middle-level supporter reinforcement layer 309 may be positioned between the bottom electrodes 311 and the middle-level supporter 306. The height of the middle-level supporter reinforcement layer 309 may be the same as or different from the height of the middle-level supporter 306. The height from the etch stop layer 304 to the middle-level supporter reinforcement layer 309 may be the same as or different from the height from the etch stop layer 304 to the surface of the middle-level supporter 306.

The upper-level supporter reinforcement layer 310 may be formed on the side portion of the upper-level supporter 307. The upper-level supporter reinforcement layer 310 may be formed on the upper surface of the upper-level supporter 307. The upper-level supporter reinforcement layer 310 may be positioned between the bottom electrodes 311 and the upper-level supporter 307. The upper-level supporter reinforcement layer 310 may have a shape surrounding the upper outer wall of the bottom electrodes 311. The height of the upper-level supporter reinforcement layer 310 may be the same as or different from the height of the upper-level supporter 307. The height from the etch stop layer 304 to the upper-level supporter reinforcement layer 310 may be the same as or different from the height from the etch stop layer 304 to the surface of the upper-level supporter 307.

The supporter reinforcement structure STR3 may include a dielectric material. The supporter reinforcement structure STR3 may include a nitrogen-containing material. The supporter reinforcement structure STR3 may include, for example, silicon nitride, silicon carbon nitride (SiCN), silicon boron nitride (SiBN), or a combination thereof. The supporter reinforcement structure STR3 and the supporter structure SPT3 may be of the same material or different materials. The lower-level supporter reinforcement layer 308, the middle-level supporter reinforcement layer 309, and the upper-level supporter reinforcement layer 310 may be of the same material or different materials.

At least one between the supporter reinforcement structure STR3 and the supporter structure SPT3 may be made of silicon nitride. For example, the supporter structure SPT3 may be made of silicon nitride that is formed by a deposition method, and the supporter reinforcement structure STR3 may be made of silicon nitride that selectively grows from silicon nitride. The supporter structure SPT3 may be made of silicon nitride that is formed by a deposition method, and the supporter reinforcement structure STR3 may be made of silicon carbon nitride that selectively grows from silicon nitride. The supporter structure SPT3 may be made of silicon nitride that is formed by a deposition method, and the supporter reinforcement structure STR3 may be made of silicon boron nitride that selectively grows from silicon nitride.

At least one between the supporter reinforcement structure STR3 and the supporter structure SPT3 may be made of silicon carbon nitride. For example, the supporter structure SPT3 may be made of silicon carbon nitride that is formed by a deposition method, and the supporter reinforcement structure STR3 may be made of silicon carbon nitride that selectively grows from silicon carbon nitride. According to another embodiment of the present invention, the supporter structure SPT3 may be made of silicon carbon nitride that is formed by a deposition method, and the supporter reinforcement structure STR3 may be made of silicon nitride that selectively grows from silicon carbon nitride. The supporter structure SPT3 may be made of silicon carbon nitride that is formed by a deposition method, and the supporter reinforcement structure STR3 may be made of silicon boron nitride that selectively grows from silicon carbon nitride.

At least one between the supporter reinforcement structure STR3 and the supporter structure SPT3 may be made of silicon boron nitride. For example, the supporter structure SPT3 may be made of silicon boron nitride that is formed by a deposition method, and the supporter reinforcement structure STR3 may be made of silicon boron nitride that selectively grows from silicon boron nitride. According to another embodiment of the present invention, the supporter structure SPT3 may be made of silicon boron nitride that is formed by a deposition method, and the supporter reinforcement structure STR3 may be made of silicon nitride that selectively grows from silicon boron nitride. The supporter structure SPT3 may be made of silicon boron nitride that is formed by a deposition method, and the supporter reinforcement structure STR3 may be made of silicon carbon nitride that selectively grows from silicon boron nitride.

The supporter reinforcement structure STR3 may be formed, for example, by a chemical vapor deposition (CVD) process or an atomic layer deposition (ALD) process. The supporter reinforcement structure STR3 may grow by using plasma to increase the selective growth effect from the supporter structure SPT3. The supporter reinforcement structure STR3 may selectively grow using an atomic layer deposition (ALD) process or a low-pressure chemical vapor deposition (LPCVD) process using, for example, dichloro silane ($SiH_2Cl_2$) and ammonia ($NH_3$) as reaction gases. The lower-level supporter reinforcement layer 308, the middle-level supporter reinforcement layer 309, and the upper-level supporter reinforcement layer 310 may be formed in the same method or different methods. The thicknesses of the lower-level supporter reinforcement layer 308, the thicknesses of the middle-level supporter reinforcement layer 309, and the thicknesses of the upper-level supporter reinforcement layer 310 may be the same or different.

According to the embodiment of the present invention described above, since the supporter reinforcement structure STR3 reinforces at least one between the side portion and the upper surface of the supporter structure SPT3, the structural stability of a capacitor may be increased.

Referring to FIG. 12B, the semiconductor device 320 may include a lower structure BT and a capacitor structure CAP7 disposed over the lower structure BT. The semiconductor device 320 may be identical or similar to the semiconductor device 300 of FIG. 12A.

The capacitor structure CAP7 may include an etch stop layer 304, a supporter structure SPT4, a supporter reinforcement structure STR4, a supporter reinforcement layer cutting portion 316, a plurality of bottom electrodes 311, a dielectric layer 312, and a top electrode 313. The supporter structure SPT4 may include a lower-level supporter 305, a middle-level supporter 306, and an upper-level supporter 314. The supporter reinforcement structure STR4 may include a lower-level supporter reinforcement layer 308, a middle-level supporter reinforcement layer 309, and an upper-level supporter reinforcement layer 315. For example, other constituent elements except the upper-level supporter 314, the upper-level supporter reinforcement layer 315, and the supporter reinforcement layer cutting portion 316 may be the same as those of the semiconductor device 300 shown in FIG. 12A.

The upper-level supporter reinforcement layer 315 may be positioned between the bottom electrodes 311 and the upper-level supporter 314. From the perspective of a top view, the upper-level supporter reinforcement layer 315 may have a shape that partially surrounds the sidewall of the bottom electrodes 311. The upper-level supporter reinforcement layer 315 may include a broken loop-shape. The supporter reinforcement layer cutting portion 316 may be formed on the upper outer wall of the bottom electrodes 311. The upper portion of the bottom electrodes 311 and the upper-level supporter 314 may be in direct contact by the supporter reinforcement layer cutting portion 316.

According to the embodiment of the present invention described above, since the upper width (or diameter) between the bottom electrodes 311 is widened by the supporter reinforcement layer cutting portion 316, it is possible to improve a contact defect of the capacitor according to the subsequent process and increase the structural stability of a capacitor.

FIGS. 13A to 13L are cross-sectional views illustrating an example of a method for fabricating a semiconductor device in accordance with an embodiment of the present invention.

Figure 13A:
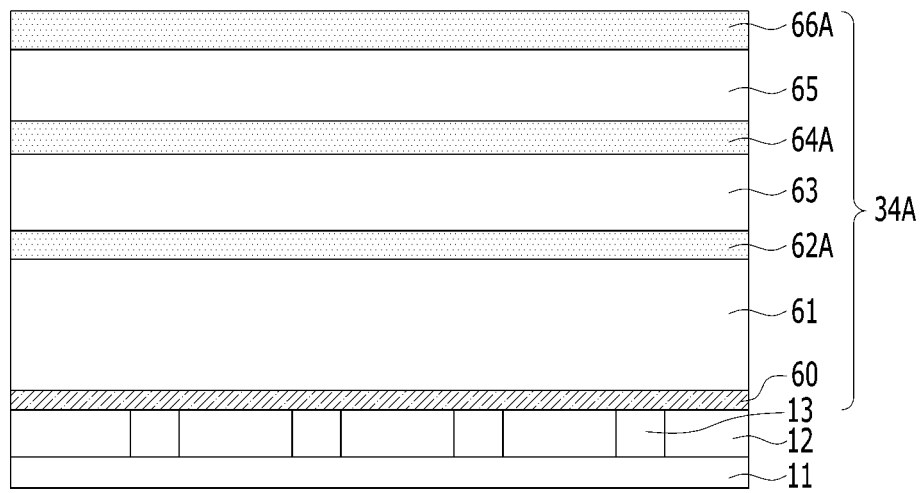
FIGS. 13A to 13L are cross-sectional views illustrating an example of a method for fabricating a semiconductor device in accordance with another embodiment of the present invention.

Referring to FIG. 13A, an inter-layer dielectric layer 12 may be formed over a substrate 11. A plurality of spaced apart contact plugs 13 penetrating the inter-layer dielectric layer 12 may be formed. The contact plugs 13 may penetrate the inter-layer dielectric layer 12 to be coupled to the substrate 11.

A mold stack layer 34A may be formed over the contact plugs 13 and the inter-layer dielectric layer 12. The mold stack layer 34A may include an etch stop layer 60, a lower-level mold layer 61, a lower-level supporter layer 62A, a middle-level mold layer 63, a middle-level supporter layer 64A, an upper-level mold layer 65, and an upper-level supporter layer 66A. The height of the bottom electrodes may be controlled by controlling the thickness of the mold stack layer 34A. The capacitance of a capacitor may vary according to the height of the bottom electrodes. For example, as the height of the mold stack layer 34A increases, the capacitance of the capacitor may increase.

The etch stop layer 60 may be formed over the contact plugs 13 and the inter-layer dielectric layer 12. The etch stop layer 60 may be formed of a material having etch selectivity with respect to the lower-level mold layer 61.

The lower-level mold layer 61 may be formed over the etch stop layer 60. The lower-level mold layer 61 may include a dielectric material. The lower-level mold layer 61 may include BSG (Borosilicate Glass), PSG (PhosphoSilicate Glass), BPSG (BoroPhosphoSilicate Glass) or TEOS (Tetra ethly ortho silicate). The lower-level mold layer 61 may be a single layer. According to another embodiment of the present invention, the lower-level mold layer 61 may have a multi-layer structure of at least two or more layers. For example, BPSG and TEOS layers may be stacked. The lower-level mold layer 61 may have a thickness of approximately 1000 Å.

A lower-level supporter layer 62A may be formed over the lower-level mold layer 61. The thickness of the lower-level supporter layer 62A may be smaller than the thickness of the lower-level mold layer 61. The difficulty of the etching process may be reduced according to the thickness of the lower-level supporter layer 62A. For example, as the thickness of the lower-level supporter layer 62A is thin, the difficulty of the etching process may be reduced. As the difficulty of the etching process is reduced, the capacitance of the capacitor may increase. The lower-level supporter layer 62A may be formed of a material having an etch selectivity with respect to the lower-level mold layer 61. The lower-level supporter layer 62A may include a nitrogen-containing material. The lower-level supporter layer 62A may include, for example, silicon nitride, silicon carbon nitride (SiCN), silicon boron nitride (SiBN), or a combination thereof.

The middle-level mold layer 63 may be formed over the lower-level supporter layer 62A. The middle-level mold layer 63 may include a dielectric material. The middle-level mold layer 63 may include BSG (Borosilicate Glass), PSG (PhosphoSilicate Glass), BPSG (BoroPhosphoSilicate Glass), or TEOS (Tetra ethly ortho silicate). The middle-level mold layer 63 may be a single layer. According to another embodiment of the present invention, the middle-level mold layer 63 may have a multi-layer structure of at least two or more layers. For example, BPSG and TEOS layers may be stacked. The material of the middle-level mold layer 63 may be the same as or different from the material of the lower-level mold layer 61. The thickness of the middle-level mold layer 63 may be the same as or different from the thickness of the lower-level mold layer 61. For example, the thickness of the middle-level mold layer 63 may be smaller than the thickness of the lower-level mold layer 61.

The middle-level supporter layer 64A may be formed over the middle-level mold layer 63. The thickness of the middle-level supporter layer 64A may be smaller than the thickness of the middle-level mold layer 63. The thickness of the middle-level supporter layer 64A may be the same as or different from the thickness of the lower-level supporter layer 62A. In this embodiment of the present invention, the thickness of the middle-level supporter layer 64A may be equal to or greater than the thickness of the lower-level supporter layer 62A. The difficulty of the etching process may be reduced according to the thickness of the middle-level supporter layer 64A. For example, as the thickness of the middle-level supporter layer 64A becomes thinner, the difficulty of the etching process may be reduced. As the difficulty of the etching process is reduced, the capacitance of the capacitor may increase. The middle-level supporter layer 64A may be formed of a material having an etch selectivity with respect to the middle-level mold layer 63.

The middle-level supporter layer 64A may include a nitrogen-containing material. The middle-level supporter layer 64A may include, for example, silicon nitride, silicon carbon nitride (SiCN), silicon boron nitride (SiBN), or a combination thereof.

The upper-level mold layer 65 may be formed over the middle-level supporter layer 64A. The upper-level mold layer 65 may include a dielectric material. The upper-level mold layer 65 may include BSG (Borosilicate Glass), PSG (PhosphoSilicate Glass), BPSG (BoroPhosphoSilicate Glass), or TEOS (Tetra ethly ortho silicate). The upper-level mold layer 65 may include a material which is the same or different from the material of the middle-level mold layer 63. The material of the upper-level mold layer 65 may be the same as or different from the material of the lower-level mold layer 61.

The upper-level mold layer 65 may be a single layer. According to another embodiment of the present invention, the upper-level mold layer 65 may have a multi-layer structure of at least two or more layers. For example, BPSG and TEOS layers may be stacked. The thickness of the upper-level mold layer 65 may be the same as or different from the thickness of the middle-level mold layer 63. The thickness of the upper-level mold layer 65 may be the same as or different from the thickness of the lower-level mold layer 61. For example, the thickness of the upper-level mold layer 65 may be equal to or less than the thickness of the middle-level mold layer 63. The thickness of the upper-level mold layer 65 may be equal to or less than the thickness of the lower-level mold layer 61.

The upper-level supporter layer 66A may be formed over the upper-level mold layer 65. The thickness of the upper-level supporter layer 66A may be smaller than the thickness of the upper-level mold layer 65. The thickness of the upper-level supporter layer 66A may be the same as or different from the thickness of the middle-level supporter layer 64A. The thickness of the upper-level supporter layer 66A may be the same as or different from the thickness of the lower-level supporter layer 62A. For example, the thickness of the upper-level supporter layer 66A may be equal to or greater than the thickness of the middle-level supporter layer 64A. The thickness of the upper-level supporter layer 66A may be equal to or greater than the thickness of the lower-level supporter layer 62A. The difficulty of the etching process may be reduced according to the thickness of the upper-level supporter layer 66A. For example, as the upper-level supporter layer 66A becomes thinner, the difficulty of the etching process may be reduced.

The upper-level supporter layer 66A may be formed of a material having an etch selectivity with respect to the upper-level mold layer 65. The upper-level supporter layer 66A may include a nitrogen-containing material. The upper-level supporter layer 66A may include, for example, silicon nitride, silicon carbon nitride (SiCN), or a combination thereof. The upper-level supporter layer 66A may include a material which is the same as or different from that of the middle-level supporter layer 64A. The upper-level supporter layer 66A may include a material which is the same as or different from that of the lower-level supporter layer 62A.

Figure 13B:
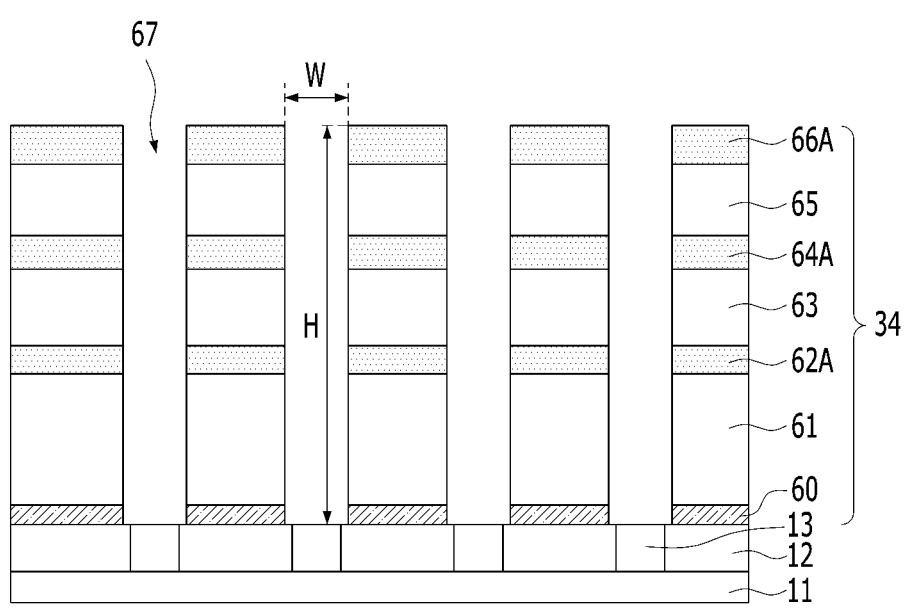

Referring to FIG. 13B, a plurality of spaced apart openings 67 may be formed in the mold stack layer 34A. The openings 67 may be formed over the contact plugs 13. The openings 67 may be referred to holes in which a plurality of bottom electrodes (or storage node) is to be formed. The openings 67 may be formed by using a mask layer (not shown) and thereby etching the mold stack layer 34A. The mask layer (not shown) may include a photoresist pattern or a hard mask pattern. In order to form The openings 67, the upper-level supporter layer 66A, the upper-level mold layer 65, the middle-level supporter layer 64A, the middle-level mold layer 63, the lower-level supporter layer 62A, and the lower-level mold layer 61 may be sequentially etched by using the mask layer as an etch barrier. The etching process for forming the openings 67 may stop at the etch stop layer 60. Subsequently, the upper surface of the contact plugs 13 below the openings 67 may be exposed by etching the etch stop layer 60.

The mold stack pattern 34 including a plurality of openings 67 may be formed by a series of steps of an etching process as described above. The openings 67 may be formed diversely according to the difficulty of the etching process. For example, as the thickness of the lower-level supporter layer 62A decreases, sidewalls of the openings 67 may be formed vertically. As the sidewalls of the openings 67 are vertically formed, a contact defect with the contact plugs 13 may be improved, and the capacitance of the capacitor may be increased. To form the openings 67, a dry etching process, a wet etching process, or a combination thereof may be used. The openings 67 may have a high aspect ratio. The aspect ratio refers to a ratio of width W to height H. The aspect ratio of each of the openings 67 refers to its height over its width. The openings 67 may have an aspect ratio of approximately at least 1:1. For example, the height of the openings 67 may be ten times greater than the width of the openings 67.

Figure 13C:
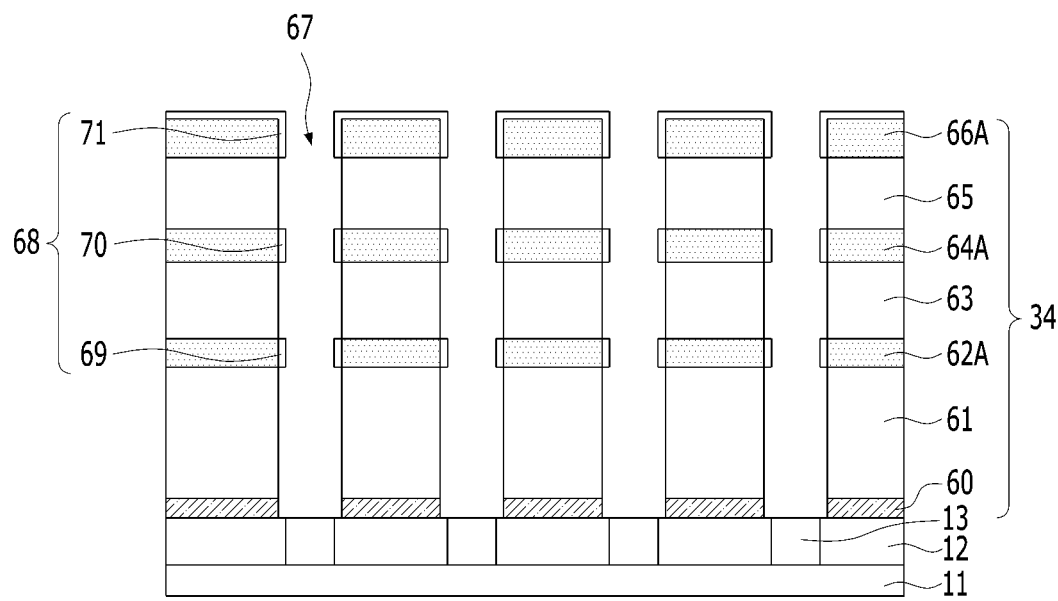

Referring to FIG. 13C, a supporter reinforcement structure 68 may be formed in the openings 67. The supporter reinforcement structure 68 may include a lower-level supporter reinforcement layer 69, a middle-level supporter reinforcement layer 70 which is positioned at a higher level than the lower-level supporter reinforcement layer 69, and an upper-level supporter reinforcement layer 71 which is positioned at a higher level than the middle-level supporter reinforcement layer 70.

The supporter reinforcement structure 68 may selectively grow from the exposed surfaces of the upper-level supporter layer 66A, the middle-level supporter layer 64A, and the lower-level supporter layer 62A that are formed inside the openings 67. The supporter reinforcement structure 68 may not grow on the exposed surfaces of the upper-level mold layer 65, the middle-level mold layer 63, and the lower-level mold layer 61 that are formed inside the openings 67. The supporter reinforcement structure 68 may grow at a faster deposition rate on the surfaces of the upper-level supporter layers 66A, the middle-level supporter layers 64A, and the lower-level supporter layer 62A than on the surfaces of the upper-level mold layer 65, the middle-level mold layer 63, and the lower-level mold layer 61. The difference in the growth rate may be induced by the difference in nucleation incubation time for forming the supporter reinforcement structure 68 on the surfaces of different materials. For example, the supporter reinforcement structure 68 may have a shorter nucleation incubation time on the surfaces of the upper-level supporter layer 66A, the middle-level supporter layer 64A, and the lower-level supporter layer 62A than on the surfaces of the upper-level mold layer 65, the middle-level mold layer 63, and the lower-level mold layer 61. In short, there may be an incubation delay of the supporter reinforcement structure 68 on the surfaces of the upper-level mold layer 65, the middle-level mold layer 63, and the lower-level mold layer 61. Thus, while the selective growth process is continued, the supporter reinforcement structure 68 may grow from the exposed surfaces of the upper-level supporter layer 66A, the middle-level supporter layer 64A, and the lower-level supporter layer 62A, and may not grow from the surfaces of the upper-level mold layer 65, the middle-level mold layer 63, and the lower-level mold layer 61. The selective growth process may be terminated before the supporter reinforcement structure 68 is deposited on the upper-level mold layer 65, the middle-level mold layer 63, and the lower-level mold layer 61.

The supporter reinforcement structure 68 may grow on the exposed surfaces of the upper-level supporter layer 66A, the middle-level supporter layer 64A, the lower-level supporter layer 62A, the upper-level mold layer 65, the middle-level mold layer 63, and the lower-level mold layer 61 that are formed inside the openings 67. The incubation time of the supporter reinforcement structure 68 may be shorter on the surfaces of the upper-level supporter layer 66A, the middle-level supporter layer 64A, and the lower-level supporter layer 62A than on the surfaces of the upper-level mold layer 65, the middle-level mold layer 63, and the lower-level mold layer 61. Therefore, before nuclei are generated on the surfaces of the upper-level mold layer 65, the middle-level mold layer 63, and the lower-level mold layer 61, the supporter reinforcement structure 68 may be deposited on the upper-level supporter layer 66A, the middle-level supporter layer 64A, and the lower-level supporter layer 62A. While the deposition process of the supporter reinforcement structure 68 is continued, the upper-level supporter reinforcement structure 68 may be thicker on the upper-level supporter layer 66A, the middle-level supporter layer 64A, and the lower-level supporter layer 62A than on the upper-level mold layer 65, the middle-level mold layer 63, and the lower-level mold layer 61.

In this case, the selective growth process may include an etch-back process. Therefore, an etch-back process may be performed after the deposition process of the supporter reinforcement structure 68. The etch-back process may completely remove the supporter reinforcement structure 68 that is formed on the surfaces of the upper-level mold layer 65, the middle-level mold layer 63, and the lower-level mold layer 61, and a portion of the initial thickness of each of the upper-level supporter reinforcement layer 71 formed on the surface of the upper-level supporter layer 66A, the middle-level supporter reinforcement layer 70 formed on the surface of the middle-level supporter layer 64A, and the lower-level supporter reinforcement layer 69 formed on the surface of the lower-level supporter layer 62A may remain. Therefore, the thickness of the upper-level supporter reinforcement layer 71 after the etch-back process may be equal to or less than the thickness of the upper-level supporter reinforcement layer 71 before the etch-back process. The thickness of the middle-level supporter reinforcement layer 70 after the etch-back process may be equal to or less than the thickness of the middle-level supporter reinforcement layer 70 before the etch-back process. The thickness of the lower-level supporter reinforcement layer 69 after the etch-back process may be equal to or less than the thickness of the lower-level supporter reinforcement layer 69 before the etch-back process.

The shape of the supporter reinforcement structure 68 may vary. The sidewall profile of the supporter reinforcement structure 68 may be at least one among a vertical shape, a curved shape, and a tapered shape. The supporter reinforcement structure 68 may include the sidewall profiles shown in FIGS. 4A to 4D. The sidewall profiles of the lower-level supporter reinforcement layer 69, the middle-level supporter reinforcement layer 70, and the upper-level supporter reinforcement layer 71 may be the same or different.

For example, the lower-level supporter reinforcement layer 69 and the middle-level supporter reinforcement layer 70 may have a round sidewall profile, and the upper-level supporter reinforcement layer 71 may have a vertical sidewall profile. The lower-level supporter reinforcement layer 69 may have a tapered sidewall profile that becomes thicker as it goes down toward the lower portion of the lower-level supporter layer 62A, and the middle-level supporter reinforcement layer 70 may have a vertical sidewall profile. The upper-level supporter reinforcement layer 71 may have a round sidewall profile. In this embodiment of the present invention, the lower-level supporter reinforcement layer 69 may have a vertical sidewall profile having the same height as that of the lower-level supporter layer 62A, and the middle-level supporter reinforcement layer 70 may have a vertical sidewall profile having the same height as that of the middle-level supporter layer 63, and the upper-level supporter reinforcement layer 71 may have a vertical sidewall profile having the same height as that of the upper-level supporter layer 66A.

The supporter reinforcement structure 68 may include a nitrogen-containing material. The supporter reinforcement structure 68 may include, for example, silicon nitride, silicon carbon nitride (SiCN), silicon boron nitride (SiBN), or a combination thereof. The material of the lower-level supporter reinforcement layer 69, the material of the middle-level supporter reinforcement layer 70, and the material of the upper-level supporter reinforcement layer 71 may be the same or different. The supporter reinforcement structure 68 may be formed, for example, by a chemical vapor deposition (CVD) process or an atomic layer deposition (ALD) process. The supporter reinforcement structure 68 may selectively grow using an atomic layer deposition (ALD) process or a low-pressure chemical vapor deposition (LPCVD) process using, for example, dichloro silane ($SiH_2Cl_2$) and ammonia ($NH_3$) as reaction gases. The method for forming the lower-level supporter reinforcement layer 69, the method for forming the middle-level supporter reinforcement layer 70, and the method for forming the upper-level supporter reinforcement layer 71 may be the same or different. The thickness of the lower-level supporter reinforcement layer 69, the thickness of the middle-level supporter reinforcement layer 70, and the thickness of the upper-level supporter reinforcement layer 71 may be the same or different.

The lower-level supporter reinforcement layer 69 may be selectively formed on the side portion of the lower-level supporter layer 62A. The lower-level supporter reinforcement layer 69 may selectively grow from the exposed surface of the lower-level supporter layer 62A which is exposed in the openings 67. The height of the lower-level supporter reinforcement layer 69 may be the same as or different from the height of the lower-level supporter layer 62A. The height from the etch stop layer 60 to the lower-level supporter reinforcement layer 69 may be the same as or different from the height from the etch stop layer 60 to the surface of the lower-level supporter layer 62A. The lower-level supporter reinforcement layer 69 may have a surround shape surrounding the sidewalls of the openings 67.

The middle-level supporter reinforcement layer 70 may be selectively formed on the side portion of the middle-level supporter layer 64A. The middle-level supporter reinforcement layer 70 may selectively grow from the exposed surface of the middle-level supporter layer 64A which is exposed in the openings 67. The height of the middle-level supporter reinforcement layer 70 may be the same as or different from the height of the middle-level supporter layer 64A. The height from the etch stop layer 60 to the middle-level supporter reinforcement layer 70 may be the same as or different from the height from the etch stop layer 60 to the surface of the middle-level supporter layer 64A. The middle-level supporter reinforcement layer 70 may have a surround shape surrounding the sidewalls of the openings 67.

The upper-level supporter reinforcement layer 71 may be selectively formed on the side portion and the upper surface of the upper-level supporter layer 66A. The upper-level supporter reinforcement layer 71 may selectively grow from the exposed surface of the upper-level supporter layer 66A which is exposed in the openings 67. The height of the upper-level supporter reinforcement layer 71 may be the same as or different from the height of the upper-level supporter layer 66A. The height from the etch stop layer 60 to the upper-level supporter reinforcement layer 71 may be the same as or different from the height from the etch stop layer 60 to the surface of the upper-level supporter layer 66A. The upper-level supporter reinforcement layer 71 may have a surround shape surrounding the upper sidewalls of the openings 67.

As described above, the lower-level supporter reinforcement layer 69, the middle-level supporter reinforcement layer 70, and the upper-level supporter reinforcement layer 71 may selectively grow from the lower-level supporter layer 62A, the middle-level supporter layer 64A, and the upper-level supporter layer 66A, respectively. The lower-level supporter reinforcement layer 69, the middle-level supporter reinforcement layer 70, and the upper-level supporter reinforcement layer 71 may not grow on the exposed surfaces of the lower-level mold layer 61, the middle-level mold layer 63, and the upper-level mold layer 65, respectively. The lower-level supporter reinforcement layer 69, the middle-level supporter reinforcement layer 70, and the upper-level supporter reinforcement layer 71 may increase the structural stability of the lower-level supporter layer 62A, the middle-level supporter layer 64A, and the upper-level supporter layer 66A, respectively.

Even though the lower-level supporter layer 62A, the middle-level supporter layer 64A, and the upper-level supporter layer 66A are formed thin, since a supporter material is reinforced by the lower-level supporter reinforcement layer 69, the middle-level supporter reinforcement layer 70, and the upper-level supporter reinforcement layer 71, it is possible to stably support the bottom electrodes during the subsequent process. Since the lower-level supporter layer 62A, the middle-level supporter layer 64A, and the upper-level supporter layer 66A may be formed thin, the etching process for forming the openings 67 may be easily performed, and etching defects such as not-open may be prevented. The width (or diameter) of the openings 67 may be decreased by the lower-level supporter reinforcement layer 69, the middle-level supporter reinforcement layer 70, and the upper-level supporter reinforcement layer 71. Since the openings 67 is formed to have a larger width (or diameter) than the width (or diameter) of the subsequent bottom electrode and then the lower-level supporter reinforcement layer 69, the middle-level supporter reinforcement layer 70, and the upper-level supporter reinforcement layer 71 are formed, the gap-fill of the subsequent bottom electrode may be performed easily.

Figure 13D:
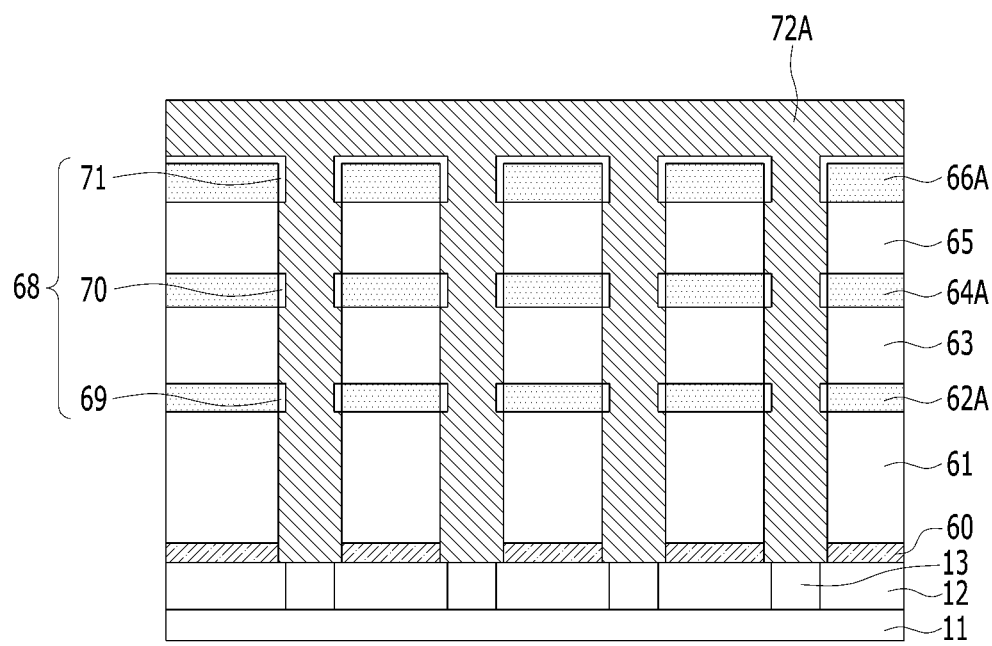

Referring to FIG. 13D, a bottom electrode layer 72A may be formed in the openings 67 in which the supporter reinforcement structure 68 is formed. The bottom electrode layer 72A may be formed over the contact plugs 13. Therefore, the bottom electrode layer 72A may each be electrically connected to the contact plugs 13.

The bottom electrode layer 72A may include a metal, a metal nitride, or a combination thereof. The bottom electrode layer 72A may include at least one among titanium (Ti), titanium nitride (TiN), tantalum (Ta), tantalum nitride (TaN), titanium aluminum nitride (TiAlN), tungsten (W) or tungsten nitride (WN), ruthenium (Ru), ruthenium oxide ($RuO_2$), iridium (Ir), iridium oxide ($IrO_2$), platinum (Pt), and combinations thereof. In this embodiment of the present invention, the bottom electrode layer 72A may, for example, include titanium nitride (TiN). The bottom electrode layer 72A may, for example, include titanium nitride (ALD-TiN) that is formed by an atomic layer deposition (ALD) process.

Figure 13E:
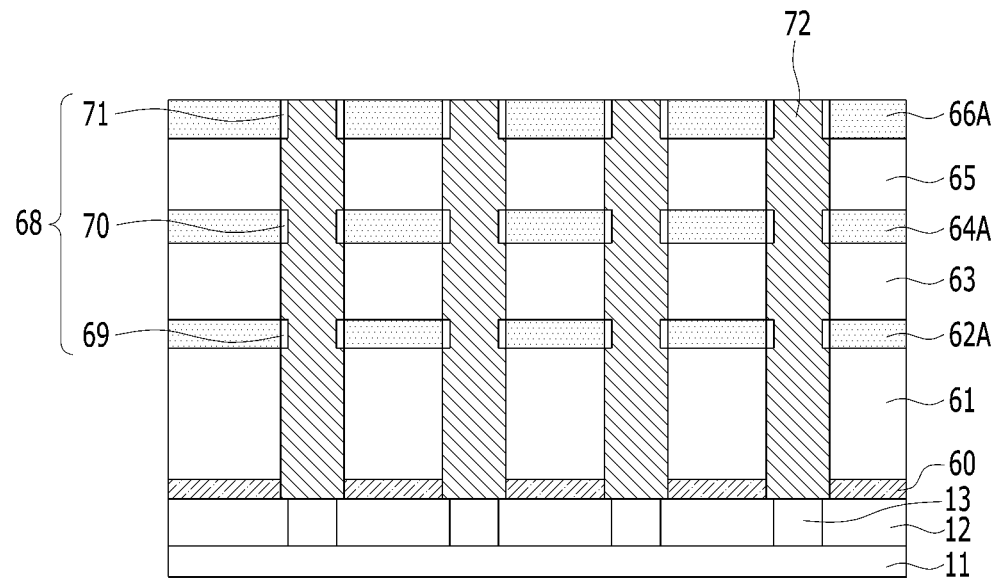

Referring to FIG. 13E, a bottom electrode isolation process may be performed. For example, to form the bottom electrodes 72 in the openings 67, a portion of the bottom electrode layer 72A may be selectively removed. The bottom electrode isolation process may be performed by a polishing process. For example, the bottom electrodes 72 may be formed, for example, by a chemical mechanical polishing (CMP) of the bottom electrode layer 72A. During formation of the bottom electrodes 72, the upper-level supporter reinforcement layer 71 of the upper surface of the upper-level supporter layer 66A may be removed. Therefore, the bottom electrodes 72 may be formed inside the openings 67.

The lower-level supporter reinforcement layer 69 may be positioned between the bottom electrodes 72 and the lower-level supporter layer 62A. The middle-level supporter reinforcement layer 70 may be positioned between the bottom electrodes 72 and the middle-level supporter layer 64A. The upper-level supporter reinforcement layer 71 may be positioned between the bottom electrodes 72 and the upper-level supporter layer 66A. The lower-level supporter reinforcement layer 69, the middle-level supporter reinforcement layer 70, and the upper-level supporter reinforcement layer 71 may have a surround shape surrounding the outer wall of the bottom electrodes 72.

The bottom electrodes 72 may include one shape among a pillar shape, a cylinder shape, or a pylinder shape. In this embodiment of the present invention, the bottom electrodes 72 may have a pillar shape. The bottom electrodes 72 may have a high aspect ratio. The aspect ratio of each of the bottom electrodes 72 refers to its height over its width. The bottom electrodes 72 may have an aspect ratio greater than approximately 1:1. For example, the height of the bottom electrodes 72 may be ten times greater than the width of the bottom electrodes 72.

Figure 13F:
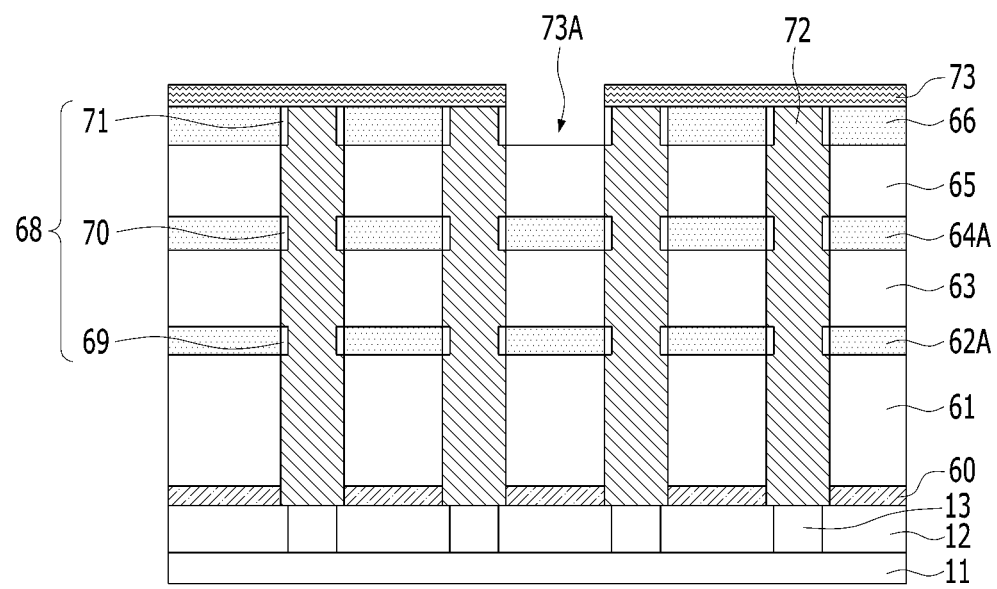

Referring to FIG. 13F, an upper-level supporter 66 may be formed over the bottom electrodes 72. In order to form the upper-level supporter 66, a mask layer 73 may be included. The mask layer 73 may include a photoresist pattern or a hard mask pattern. The upper-level supporter layer 66A exposed by the mask layer 73 may be selectively etched. The upper-level supporter opening 73A formed by etching the upper-level supporter layer 66A may have the same arrangement and shape as those of the supporter opening 105A of FIG. 3B. Therefore, the upper-level supporter 66 may include a plurality of upper-level supporter openings 73A.

A plurality of upper-level supporter openings 73A may be positioned between the neighboring upper-level supporter reinforcement layers 71. The upper-level supporter openings 73A may partially expose the side of the upper-level supporter reinforcement layer 71. The upper-level supporter openings 73A may expose at least three or more neighboring upper-level supporter reinforcement layers 71. In this embodiment of the present invention, one upper-level supporter opening 73A may be positioned adjacent to at least three upper-level supporter reinforcement layers 71, and three upper-level supporter reinforcement layers 71 may be exposed by one upper-level supporter opening 73A. The upper-level supporter openings 73A may be formed in diverse shapes, such as a triangle, a square, and a pentagon. In this embodiment of the present invention, the cross section of the upper-level supporter openings 73A may be formed in a triangular shape. Some surfaces of the upper-level mold layer 65 may be exposed by the upper-level supporter openings 73A.

An upper-level supporter reinforcement layer 71 may be positioned on a side portion of the upper-level supporter 66. The upper-level supporter reinforcement layer 71 may be positioned between the bottom electrodes 72 and the upper-level supporter 66. While the upper-level supporter layer 66A is etched, a portion of the upper-level supporter reinforcement layer 71 may be etched.

Figure 13G:
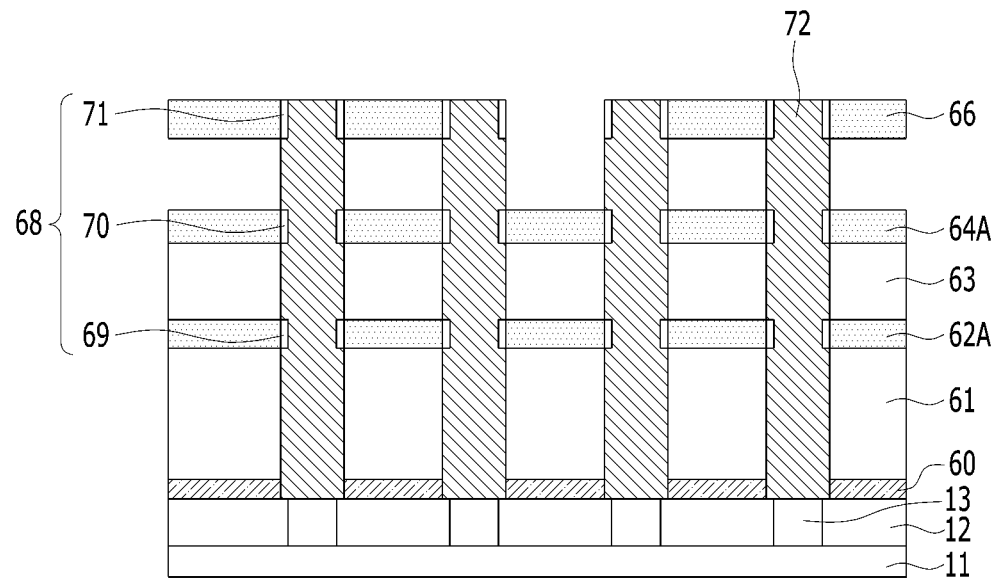

Referring to FIG. 13G, the upper-level mold layer 65 may be removed. For example, the upper-level mold layer 65 may be removed by a wet dip-out process. A wet chemical for removing the upper-level mold layer 65 may be supplied through the upper-level supporter openings 73A. As for the wet chemical, one or more chemicals among HF, $NH_4F/NH_4OH$, $H_2O_2$, HCl, $HNO_3$, and $H_2SO_4$ may be used. When the upper-level mold layer 65 is removed, the upper-level supporter 66 and the middle-level supporter layer 64A having an etch selectivity with respect to the upper-level mold layer 65 may not be removed. As the upper-level mold layer 65 is removed, the outer wall of the upper portion of the bottom electrodes 72 may be exposed. Herein, the upper outer wall of the bottom electrodes 72 may be supported by the upper-level supporter reinforcement layer 71 and the upper-level supporter 66. Accordingly, the bottom electrodes 72 may be prevented from collapsing.

Figure 13H:
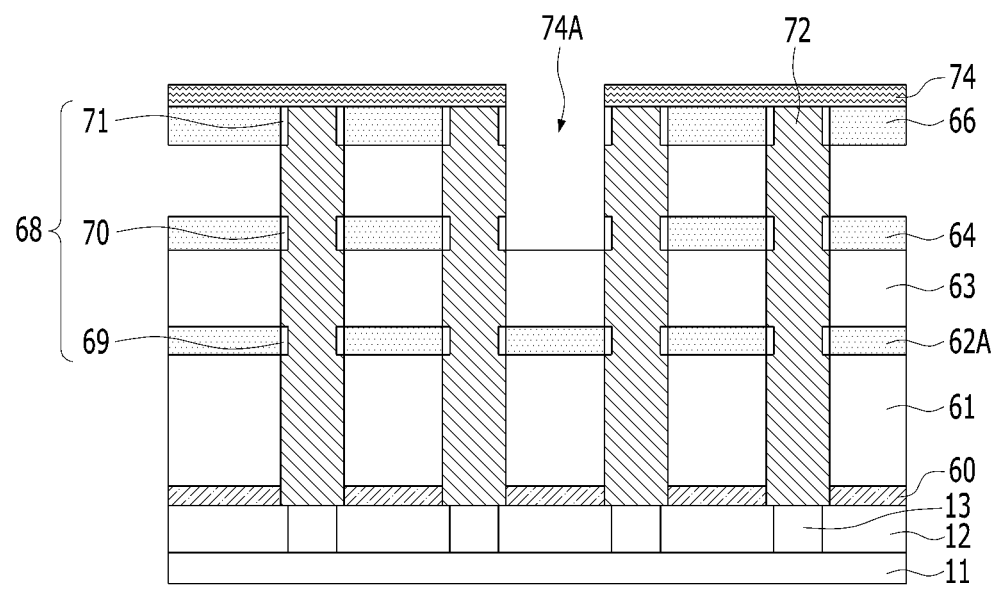

Referring to FIG. 13H, a middle-level supporter 64 may be formed. To form the middle-level supporter 64, the middle-level supporter layer 64A may be selectively etched by using the mask layer 74. Also, the middle-level supporter layer 64A may be selectively etched to be self-aligned with the upper-level supporter 66. The middle-level supporter openings 74A formed by etching the middle-level supporter layer 64A may have the same arrangement and shape as those of the supporter openings 105A shown in FIG. 3B. Accordingly, the middle-level supporter 64 may include a plurality of middle-level supporter openings 74A.

A plurality of middle-level supporter openings 74A may be positioned between the neighboring middle-level supporter reinforcement layers 70. The number of the middle-level supporter reinforcement layers 70 adjacent to the middle-level supporter openings 74A may be three or more. In this embodiment of the present invention, the middle-level supporter openings 74A may be adjacent to three middle-level supporter reinforcement layers 70. The middle-level supporter openings 74A may be formed in diverse shapes, such as a triangle, a square, and a pentagon. In this embodiment of the present invention, the cross section of the middle-level supporter openings 74A may be formed in a triangular shape. The shape of the middle-level supporter openings 74A may be the same as or different from the shape of the upper-level supporter openings 73A. Some surfaces of the middle-level mold layer 63 may be exposed by the middle-level supporter openings 74A.

The middle-level supporter reinforcement layer 70 may be positioned on a side portion of the middle-level supporter 64. The middle-level supporter reinforcement layer 70 may be positioned between the bottom electrodes 72 and the middle-level supporter 64. The middle-level supporter reinforcement layer 70 may have a shape surrounding the sidewall of the bottom electrodes 72. While the middle-level supporter layer 64A is etched, a portion of the middle-level supporter reinforcement layer 70 may be etched.

Figure 13I:
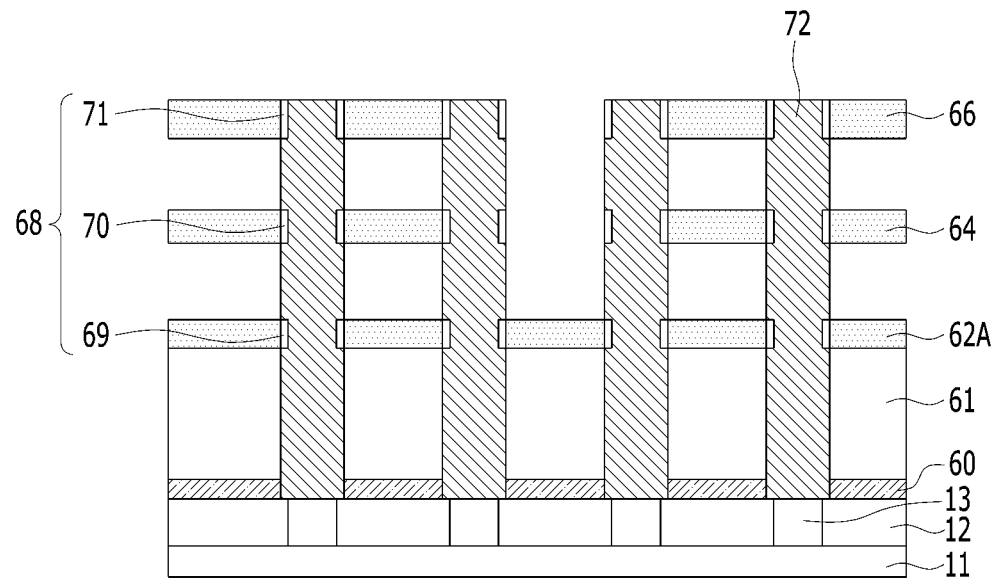

Referring to FIG. 13I, the middle-level mold layer 63 may be removed. For example, the middle-level mold layer 63 may be removed by a wet dip-out process. A wet chemical for removing the middle-level mold layer 63 may be supplied through the middle-level supporter openings 74A. As for the wet chemical, one or more chemicals among HF, $NH_4F/NH_4OH$, $H_2O_2$, HCl, $HNO_3$, and $H_2SO_4$ may be used. When the middle-level mold layer 63 is removed, the upper-level supporter 66, the middle-level supporter 64, and the lower-level supporter layer 62A having an etch selectivity with respect to the middle-level mold layer 63 may not be removed. As the middle-level mold layer 63 is removed, the outer wall of the middle portion of the bottom electrodes 72 may be exposed. Herein, the middle portion of the bottom electrodes 72 may be supported by the middle-level supporter reinforcement layer 70 and the middle-level supporter 64.

Figure 13J:
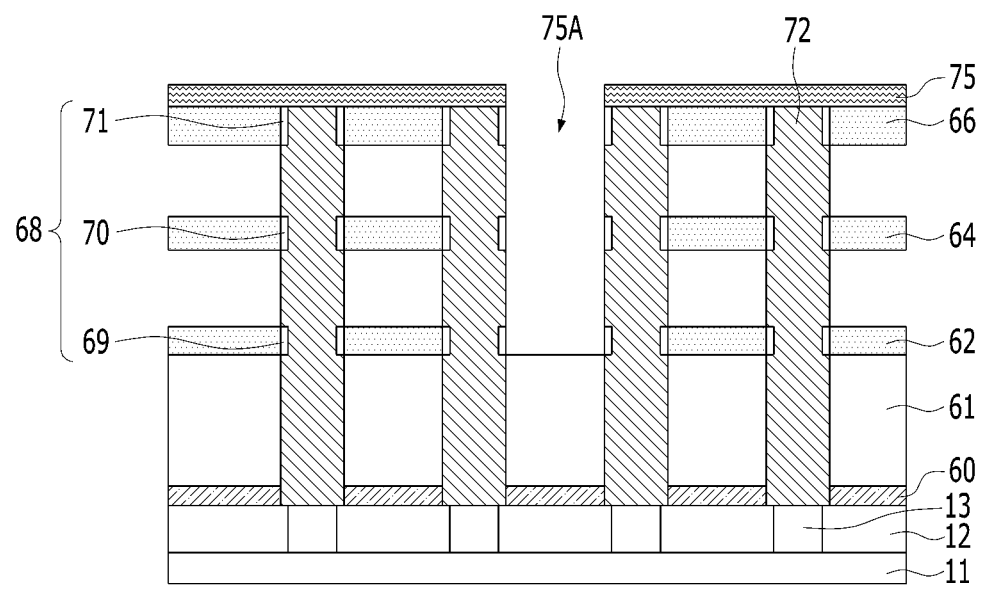

Referring to FIG. 13J, a lower-level supporter 62 may be formed. In order to form the lower-level supporter 62, the lower-level supporter layer 62A may be selectively etched by using the mask layer 75. Also, the lower-level supporter layer 62A may be selectively etched to be self-aligned with the lower-level supporter 62. The lower-level supporter openings 75A formed by etching the lower-level supporter layer 62A may have the same arrangement and shape as those of the lower-level supporter openings 105A shown in FIG. 3B. Therefore, the lower-level supporter layer 62A may include a plurality of lower-level supporter openings 75A.

The lower-level supporter openings 75A may not overlap with the lower-level supporter reinforcement layer 69. For example, a plurality of lower-level supporter openings 75A may be positioned between the neighboring lower-level supporter reinforcement layers 69. The number of the lower-level supporter reinforcement layers 69 adjacent to the lower-level supporter openings 75A may be three or more. In this embodiment of the present invention, the lower-level supporter openings 75A may be adjacent to three lower-level supporter reinforcement layers 69. The lower-level supporter openings 75A may be formed in diverse shapes, such as a triangle, a square, and a pentagon. In this embodiment of the present invention, the lower-level supporter openings 75A may be formed in a triangular shape. The shape of the lower-level supporter openings 75A may be the same as or different from the shape of the upper-level supporter openings 73A. Some surfaces of the lower-level mold layer 61 may be exposed by the lower-level supporter openings 75A.

The lower-level supporter reinforcement layer 69 may be positioned on the side portion of the lower-level supporter 62. The lower-level supporter reinforcement layer 69 may be positioned between the bottom electrodes 72 and the lower-level supporter 62. The lower-level supporter reinforcement layer 69 may have a shape surrounding the sidewall of the bottom electrodes 72. While the lower-level supporter layer 62A is etched, a portion of the lower-level supporter reinforcement layer 69 may be etched.

Figure 13K:
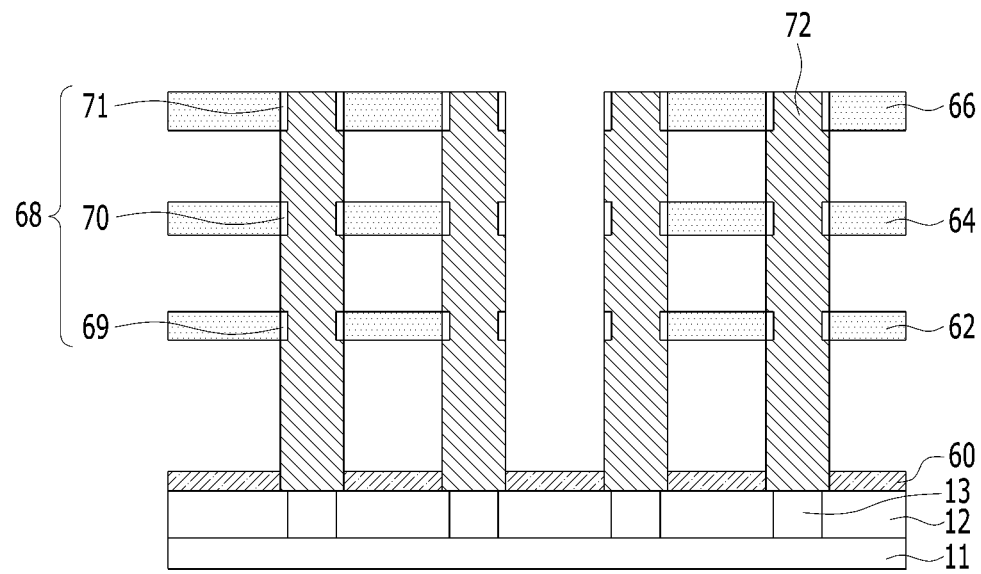

Referring to FIG. 13K, the lower-level mold layer 61 may be removed. For example, the lower-level mold layer 61 may be removed by a wet dip-out process. A wet chemical for removing the lower-level mold layer 61 may be supplied through the lower-level supporter openings 75A. As for the wet chemical, one or more chemicals among HF, $NH_4F/NH_4OH$, $H_2O_2$, HCl, $HNO_3$, and $H_2SO_4$ may be used. When the lower-level mold layer 61 is removed, the upper-level supporter 66, the middle-level supporter 64, and the lower-level supporter 62 having an etch selectivity with respect to the lower-level mold layer 61 may not be removed. When the lower-level mold layer 61 is removed, the etch stop layer 60 may protect the inter-layer dielectric layer 12 and the contact plugs 13 from being damaged. As the lower-level mold layer 61 is removed, an outer wall of the bottom electrodes 72 may be exposed. Herein, the middle portion of the bottom electrodes 72 may be supported by the lower-level supporter reinforcement layer 69 and the lower-level supporter 62.

Figure 13L:
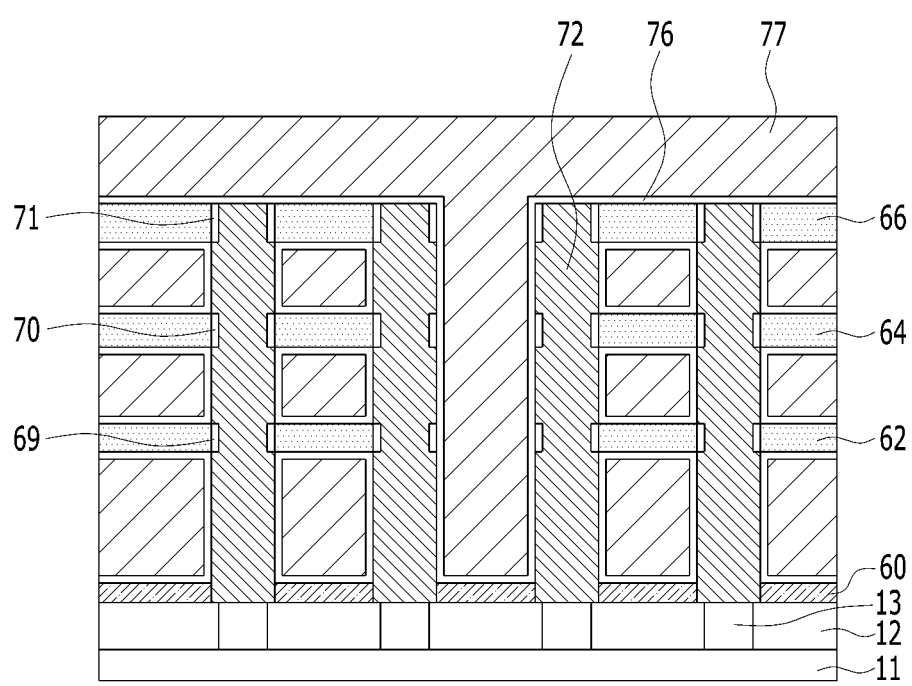

Referring to FIG. 13L, a dielectric layer 76 and a top electrode 77 may be sequentially formed. The dielectric layer 76 may be formed on the upper and sidewall portions of the bottom electrodes 72, the upper and lower portions of the lower-level supporter 62, the upper and lower portions of the middle-level supporter 64, the upper and lower portions of the upper-level supporter 66, the upper portion and a portion of the sidewall portions of the upper-level supporter reinforcement layer 71, the sidewall portions of the middle-level supporter reinforcement layer 70, and the sidewall portions of the lower-level supporter reinforcement layer 69. A portion of the dielectric layer 76 may cover the etch stop layer 60. The dielectric layer 76 may cover the lower-level supporter 62 and the upper-level supporter 66. The top electrode 77 may be formed over the dielectric layer 76.

FIGS. 14A to 14E are cross-sectional views illustrating an example of a method for fabricating a semiconductor device in accordance with another embodiment of the present invention.

First, a supporter reinforcement structure 68 and a plurality of bottom electrodes 72 may be formed by the method illustrated in FIGS. 13A to 13E.

Figure 14A:
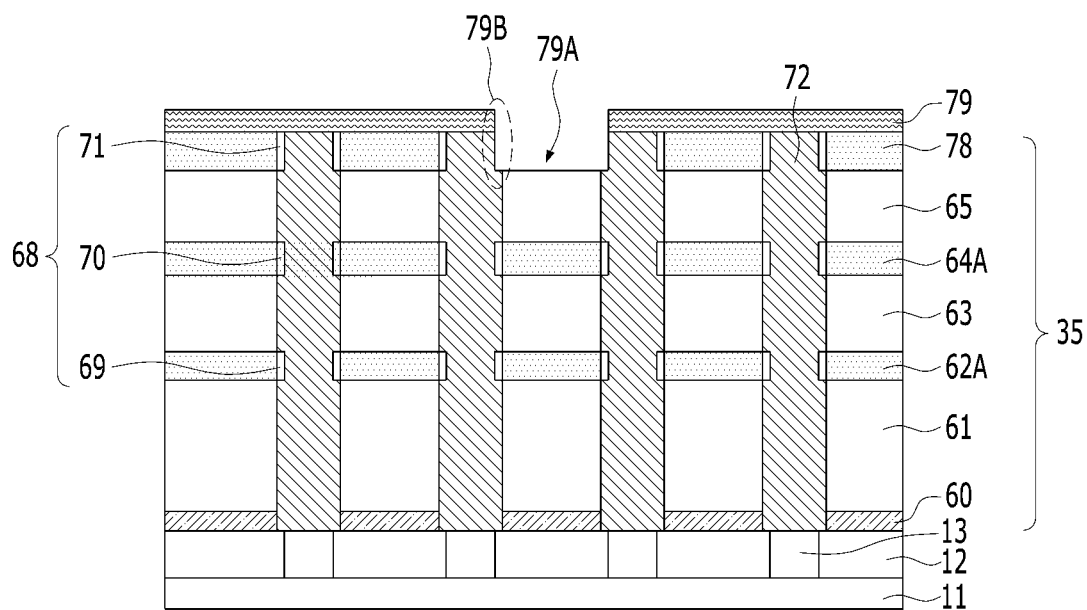
FIGS. 14A to 14E are cross-sectional views illustrating another example of a method for fabricating a semiconductor device in accordance with another embodiment of the present invention.

Subsequently, referring to FIG. 14A, an upper-level supporter 78 may be formed. In order to form the upper-level supporter 78, the upper-level supporter layer of the mold stack pattern 35 may be etched by using the mask layer 79. The portion exposed by the mask layer 79 may include an upper-level supporter layer and an upper-level supporter reinforcement layer 71. The upper-level supporter layer and the upper-level supporter reinforcement layer 71 exposed by the mask layer 79 may be selectively etched to form a supporter reinforcement layer cutting portion 79B and an upper-level supporter 78. The supporter reinforcement layer cutting portion 79B may be formed by partially etching the upper-level supporter reinforcement layer 71.

The upper-level supporter reinforcement layer 71 may be positioned between the bottom electrodes 72 and the upper-level supporter 78. From the perspective of a top view, the upper-level supporter reinforcement layer 71 may have a shape that partially surrounds the sidewall of the bottom electrodes 72. The upper-level supporter reinforcement layer 71 may include a broken loop-shape.

Figure 14B:
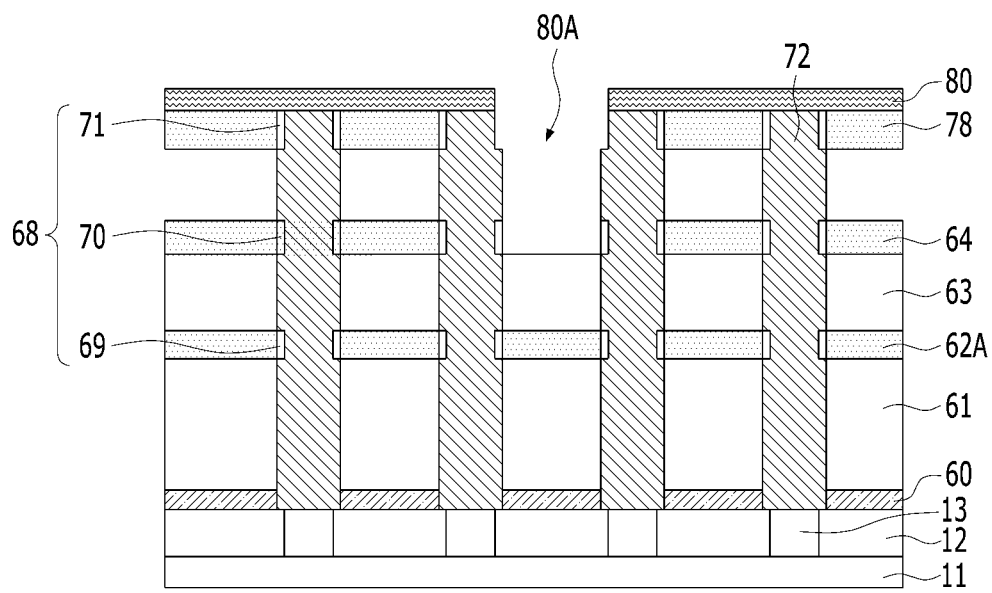

Referring to FIG. 14B, the upper-level mold layer 65 may be removed. For example, the upper-level mold layer 65 may be removed by a wet dip-out process. A wet chemical for removing the upper-level mold layer 65 may be supplied through the upper-level supporter openings 79A. As for the wet chemical, one or more chemicals among HF, $NH_4F/NH_4OH$, $H_2O_2$, HCl, $HNO_3$, and $H_2SO_4$ may be used. When the upper-level mold layer 65 is removed, the upper-level supporter 78 having an etch selectivity with respect to the upper-level mold layer 65 may not be removed. As the upper-level mold layer 65 is removed, the outer wall of the upper portion of the bottom electrodes 72 may be exposed. Herein, the bottom electrodes 72 may be supported by the upper-level supporter 78 and the upper-level supporter reinforcement layer 71. Accordingly, the bottom electrodes 72 may be prevented from collapsing.

Subsequently, the middle-level supporter layer 64A may be selectively etched by using a mask layer 80 to form the middle-level supporter 64. Also, the middle-level supporter layer 64A may be selectively etched to be self-aligned with the upper-level supporter 78. The mask layer 80 may include a photoresist pattern or a hard mask pattern.

Middle-level supporter openings 80A formed by etching the middle-level supporter layer 64A may have the same arrangement and shape as those of the supporter openings 105A shown in FIG. 3B. Therefore, the middle-level supporter layer 64A may include a plurality of middle-level supporter openings 80A.

A plurality of middle-level supporter openings 80A may be positioned between the neighboring middle-level supporter reinforcement layers 70. The number of the middle-level supporter reinforcement layers 70 positioned adjacent to the middle-level supporter openings 80A may be three or more. In this embodiment of the present invention, the middle-level supporter openings 80A may be adjacent to three middle-level supporter reinforcement layers 70. The middle-level supporter openings 80A may be formed in diverse shapes, such as a triangle, a square, and a pentagon. In this embodiment of the present invention, the cross section of the middle-level supporter openings 80A may be formed in a triangular shape. The shape of the middle-level supporter openings 80A may be the same as or different from that of the upper-level supporter openings 79A. In this embodiment of the present invention, the size of the middle-level supporter openings 80A may be smaller than the size of the upper-level supporter openings 79A. Some surfaces of the middle-level mold layer 63 may be exposed by the middle-level supporter openings 80A.

The middle-level supporter reinforcement layer 70 may be positioned on a side portion of the middle-level supporter 64. The middle-level supporter reinforcement layer 70 may have a shape surrounding the sidewall of the bottom electrodes 72. The middle-level supporter reinforcement layer 70 may be positioned between the bottom electrodes 72 and the middle-level supporter 64. Referring to FIG. 3B, the middle-level supporter reinforcement layer 70 may include a closed loop shape. While the middle-level supporter layer 64A is etched, a portion of the middle-level supporter reinforcement layer 70 may be etched.

Figure 14C:
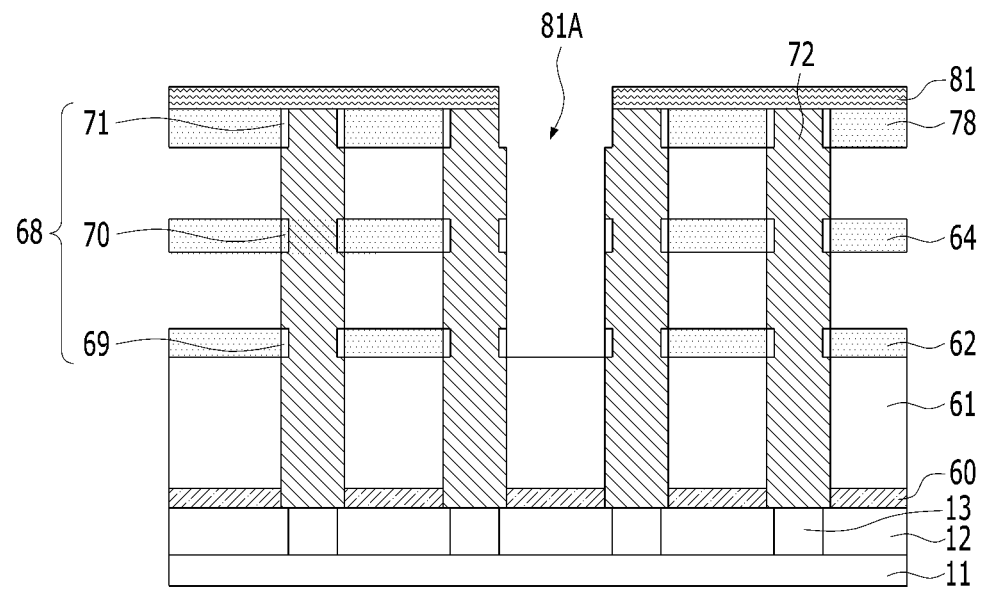

Referring to FIG. 14C, the middle-level mold layer 63 may be removed. For example, the middle-level mold layer 63 may be removed by a wet dip-out process. A wet chemical for removing the middle-level mold layer 63 may be supplied through the middle-level supporter openings 80A. As for the wet chemical, one or more chemicals among HF, $NH_4F/NH_4OH$, $H_2O_2$, HCl, $HNO_3$, and $H_2SO_4$ may be used. When the middle-level mold layer 63 is removed, the upper-level supporter 78 and the middle-level supporter 64 having an etch selectivity with respect to the middle-level mold layer 63 may not be removed. As the middle-level mold layer 63 is removed, the outer wall of the middle portion of the bottom electrodes 72 may be exposed. Herein, the middle portion of the bottom electrodes 72 may be supported by the middle-level supporter reinforcement layer 70 and the middle-level supporter 64.

To form the lower-level supporter 62, the lower-level supporter layer 62A may be selectively etched by using the mask layer 81. Also, the lower-level supporter layer 62A may be selectively etched to be self-aligned with the middle-level supporter 64.

The lower-level supporter opening 81A formed by etching the lower-level supporter layer 62A may have the same arrangement and shape as those of the supporter openings 105A shown in FIG. 3B. Therefore, the lower-level supporter layer 62A may include a plurality of lower-level supporter openings 81A.

A plurality of lower-level supporter openings 81A may be positioned between the neighboring lower-level supporter reinforcement layers 69. The number of the lower-level supporter reinforcement layers 69 positioned adjacent to the lower-level supporter openings 81A may be three or more. In this embodiment of the present invention, the lower-level supporter openings 81A may be adjacent to three lower-level supporter reinforcement layers 69. The lower-level supporter openings 81A may be formed in diverse shapes, such as a triangle, a square, and a pentagon. In this embodiment of the present invention, the cross section of the lower-level supporter openings 81A may be formed in a triangular shape. The shape of the lower-level supporter openings 81A may be the same as or different from that of the upper-level supporter openings 79A. Some surfaces of the lower-level mold layer 61 may be exposed by the lower-level supporter openings 81A.

The lower-level supporter reinforcement layer 69 may be positioned on the side portion of the lower-level supporter 62. The lower-level supporter reinforcement layer 69 may have a shape surrounding the sidewall of the bottom electrodes 72. The lower-level supporter reinforcement layer 69 may be positioned between the bottom electrodes 72 and the lower-level supporter 62. Referring to FIG. 3B, the lower-level supporter reinforcement layer 69 may include a closed loop shape. While the lower-level supporter layer 62A is etched, a portion of the lower-level supporter reinforcement layer 69 may be etched.

Figure 14D:
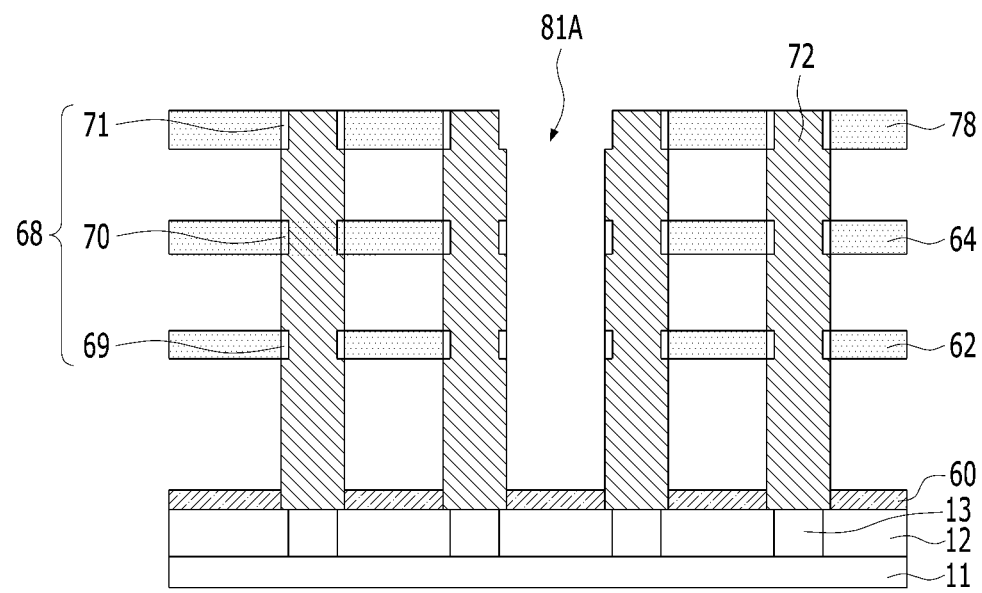

Referring to FIG. 14D, the lower-level mold layer 61 may be removed. For example, the lower-level mold layer 61 may be removed by a wet dip-out process. A wet chemical for removing the lower-level mold layer 61 may be supplied through the lower-level supporter openings 81A. As for the wet chemical, one or more chemicals among HF, $NH_4F/NH_4OH$, $H_2O_2$, HCl, $HNO_3$, and $H_2SO_4$ may be used. When the lower-level mold layer 61 is removed, the upper-level supporter 78, the middle-level supporter 64, and the lower-level supporter 62 having an etch selectivity with respect to the lower-level mold layer 61 may not be removed. When the lower-level mold layer 61 is removed, the etch stop layer 60 may protect the inter-layer dielectric layer 12 and the contact plugs 13 from being damaged. As the lower-level mold layer 61 is removed, an outer wall of the lower portion of the bottom electrodes 72 may be exposed. Herein, the lower portion of the bottom electrodes 72 may be supported by the lower-level supporter reinforcement layer 69 and the lower-level supporter 62.

Figure 14E:
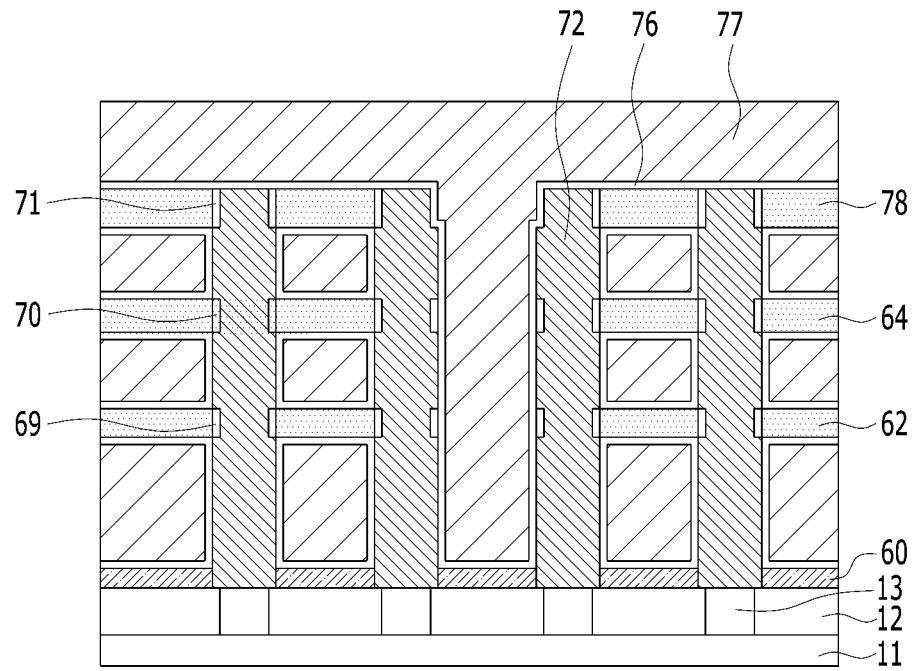

Referring to FIG. 14E, a dielectric layer 76 and a top electrode 77 may be sequentially formed. The dielectric layer 76 may be formed on the upper and sidewall portions of the bottom electrodes 72, the upper and lower portions of the upper-level supporter 78, the upper and lower portions of the middle-level supporter 64, the upper and lower portions of the lower-level supporters 62, the upper and sidewall portions of the upper-level supporter reinforcement layer 71, the sidewall portions of the middle-level supporter reinforcement layer 70, and the sidewall portions of the lower-level supporter reinforcement layer 69. A portion of the dielectric layer 76 may cover the etch stop layer 60. The dielectric layer 76 may cover the lower-level supporter 62 and the upper-level supporter 78.

The top electrode 77 may be formed on the dielectric layer 76. The top electrode 77 may include a metal material or a metal-based conductive material.

Figure 15:
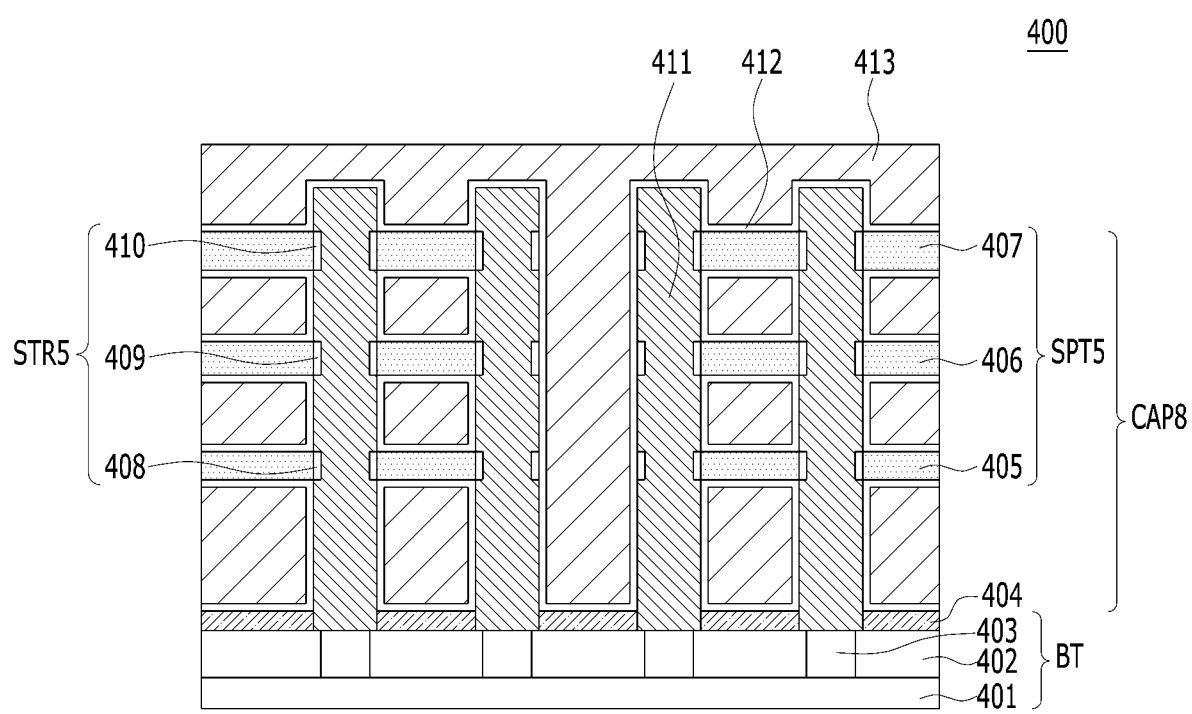
FIG. 15 is a cross-sectional view illustrating a semiconductor device in accordance with another embodiment of the present invention.

FIG. 15 is a cross-sectional view illustrating a semiconductor device 400 in accordance with another embodiment of the present invention.

Referring to FIG. 15, the semiconductor device 400 may include a lower structure BT and a capacitor structure CAP8 disposed over the lower structure BT.

The lower structure BT may include a substrate 401, an inter-layer dielectric layer 402, and a plurality of contact plugs 403. The contact plugs 403 may penetrate the inter-layer dielectric layer 402 to be coupled to the substrate 401.

The capacitor structure CAP8 may include an etch stop layer 404, a supporter structure SPT5, a supporter reinforcement structure STR5, a plurality of bottom electrodes 411, a dielectric layer 412, and a top electrode 413.

The bottom electrodes 411 may be formed over the contact plugs 403. The bottom electrodes 411 may each be electrically connected to a corresponding one of the contact plugs 403. The dielectric layer 412 and the top electrode 413 may be formed over the bottom electrodes 411.

The outer wall of the bottom electrodes 411 may be supported by the supporter structure SPT5. The supporter structure SPT5 may be a multi-level structure including at least one supporter. For example, the supporter structure SPT5 may include a lower-level supporter 405, a middle-level supporter 406 which is positioned at a higher level than the lower-level supporter 405, and an upper-level supporter 407 which is positioned at a higher level than the middle-level supporter 406. The supporter structure SPT5 may be formed to support the bottom electrodes 411 in a lateral direction to prevent the bottom electrodes 411 from collapsing.

The upper-level supporter 407 may be positioned on the upper outer wall of the bottom electrodes 411. The upper-level supporter 407 may be positioned at a lower level than the top surface of the bottom electrodes 411. The upper-level supporter 407 may be formed to support the upper outer wall of the bottom electrodes 411 in a lateral direction. The thickness of the upper-level supporter 407 may be the same as or different from the thickness of the middle-level supporter 406. The thickness of the upper-level supporter 407 may be the same as or different from the thickness of the lower-level supporter 405.

The supporter structure SPT5 may be formed of a dielectric material. The supporter structure SPT5 may include a nitrogen-containing material. The supporter structure SPT5 may include, for example, silicon nitride, silicon carbon nitride (SiCN), silicon boron nitride (SiBN), or a combination thereof. The lower-level supporter 405, the middle-level supporter 406, and the upper-level supporter 407 may be formed of the same material or different materials.

The supporter reinforcement structure STR5 may be a multi-level structure including at least one or more supporter reinforcement layers. For example, the supporter reinforcement structure STR5 may include a lower-level supporter reinforcement layer 408, a middle-level supporter reinforcement layer 409 which is positioned at a higher level than the lower-level supporter reinforcement layer 408, and an upper-level supporter reinforcement layer 410 which is positioned at a higher level than the middle-level supporter reinforcement layer 409. From the perspective of a top view, the supporter reinforcement structure STR5 may have a closed loop shape that surrounds the sidewall of the bottom electrodes 411. The supporter reinforcement structure STR5 may be positioned between the bottom electrodes 411 and the supporter structure SPT5. The shape of the supporter reinforcement structure STR5 may vary. The sidewall profile of the supporter reinforcement structure STR5 may be at least one among a vertical shape, a curved shape, and a tapered shape. The supporter reinforcement structure STR5 may include the sidewall profiles of FIGS. 4A to 4D. The sidewall profiles of the lower-level supporter reinforcement layer 408, the middle-level supporter reinforcement layer 409, and the upper-level supporter reinforcement layer 410 may be the same or different.

The supporter reinforcement structure STR5 may include a dielectric material. The supporter reinforcement structure STR5 may include a nitrogen-containing material. The supporter reinforcement structure STR5 may include, for example, silicon nitride, silicon carbon nitride (SiCN), silicon boron nitride (SiBN), or a combination thereof. The supporter reinforcement structure STR5 and the supporter structure SPT5 may be of the same material or different materials. The lower-level supporter reinforcement layer 408, the middle-level supporter reinforcement layer 409, and the upper-level supporter reinforcement layer 410 may be of the same material or different materials.

The supporter reinforcement structure STR5 may be formed, for example, by a chemical vapor deposition (CVD) process or an atomic layer deposition (ALD) process. The supporter reinforcement structure STR5 may grow by using plasma to increase the selective growth effect from the supporter structure SPT5. The supporter reinforcement structure STR5 may selectively grow using an atomic layer deposition (ALD) process or a low-pressure chemical vapor deposition (LPCVD) process using, for example, dichloro silane ($SiH_2Cl_2$) and ammonia ($NH_3$) as reaction gases. The method for forming the lower-level supporter reinforcement layer 408, the method for forming the middle-level supporter reinforcement layer 409, and the method for forming the upper-level supporter reinforcement layer 410 may be the same or different. The thickness of the lower-level supporter reinforcement layer 408, the thickness of the middle-level supporter reinforcement layer 409, and the thickness of the upper-level supporter reinforcement layer 410 may be the same or different.

According to the above-described embodiment, since the supporter reinforcement structure STR5 reinforces the side portion of the supporter structure SPT5, the structural stability of a capacitor may be increased. As the upper-level supporter reinforcement layer 410 is positioned at a lower level than the top surface of the bottom electrode, the capacitor may be secured with a greater capacity.

FIGS. 16A to 16H are cross-sectional views illustrating an example of a method for fabricating a semiconductor device in accordance with an embodiment of the present invention.

Figure 16A:
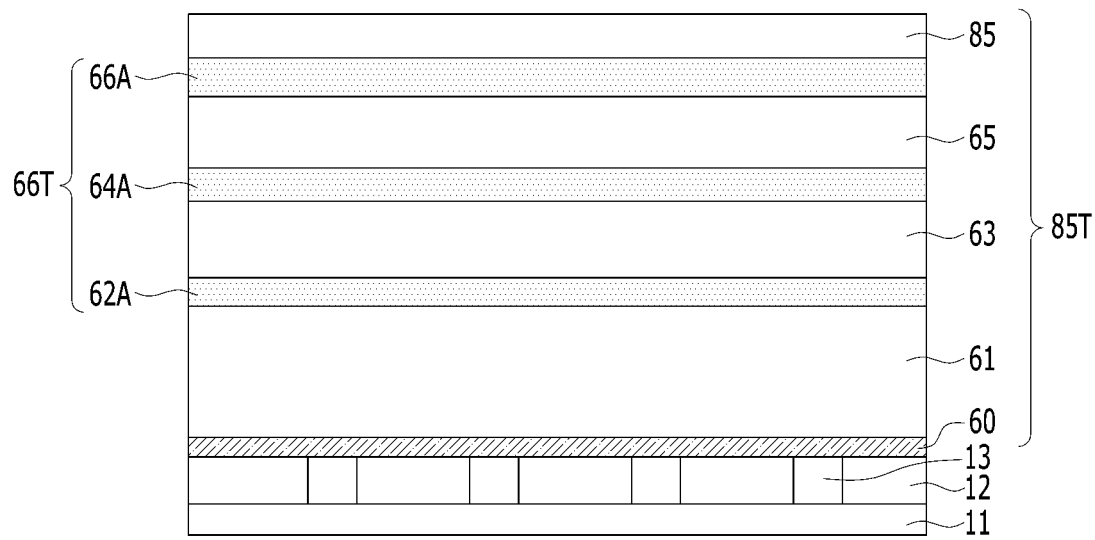
FIGS. 16A to 16H are cross-sectional views illustrating an example of a method for fabricating a semiconductor device in accordance with another embodiment of the present invention.

Referring to FIG. 16A, an inter-layer dielectric layer 12 may be formed over the substrate 11. A plurality of spaced apart contact plugs 13 penetrating the inter-layer dielectric layer 12 may be formed. The contact plugs 13 may penetrate the inter-layer dielectric layer 12 to be coupled to the substrate 11.

An etch stop layer 60 may be formed over the contact plugs 13 and the inter-layer dielectric layer 12. A mold layer 85T and a supporter layer 66T may be formed over the etch stop layer 60. The mold stack layer 85T may include a lower-level mold layer 61, a middle-level mold layer 63, an upper-level mold layer 65, and an uppermost-level mold layer 85. The supporter layer 66T may include a lower-level supporter layer 62A, a middle-level supporter layer 64A, and an upper-level supporter layer 66A. For example, the lower-level mold layer 61, the lower-level supporter layer 62A, the middle-level mold layer 63, the middle-level supporter layer 64A, the upper-level mold layer 65, the upper-level supporter layer 66A, and the uppermost-level mold layer 85 may be sequentially formed over the etch stop layer 60. The etch stop layer 60 may be formed of a material having an etch selectivity with respect to the lower-level mold layer 61. The mold layer 85T may include a dielectric material.

The thickness of the supporter layer 66T may be the same or different. The supporter layer 66T may be formed of a material having an etch selectivity with respect to the mold layer 85T. The supporter layer 66T may include a nitrogen-containing material. The supporter layer 66T may include, for example, silicon nitride, silicon carbon nitride (SiCN), silicon boron nitride (SiBN), or a combination thereof. The supporter layer 66T may include the same or different materials.

Figure 16B:
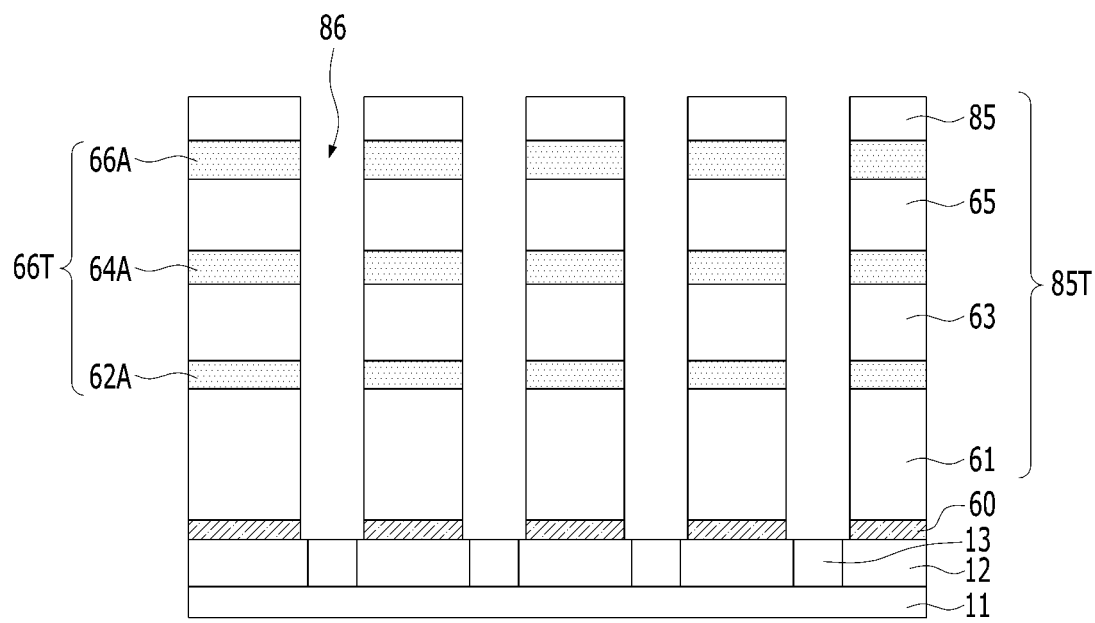

Referring to FIG. 16B, a plurality of spaced apart openings 86 may be formed in the mold stack layer 85T, and the opening 86 may expose the contact plugs 13. In order to form the opening 86, the support layer 66T and the mold stack layer 85T may be sequentially etched by using the mask layer as an etch barrier. The etching process may stop at the etch stop layer 60. Subsequently, the etch stop layer 60 may be etched to expose the upper surface of the contact plugs 13 below the opening 86.

Figure 16C:
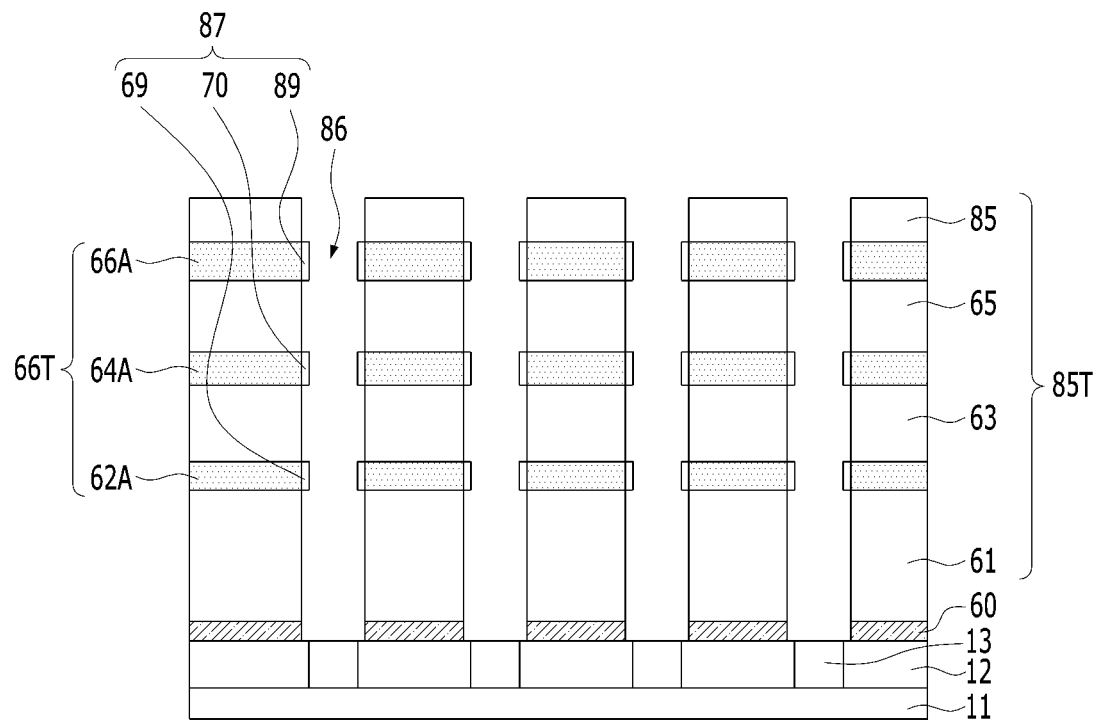

Referring to FIG. 16C, a supporter reinforcement structure 87 may be formed in the opening 86. The supporter reinforcement structure 87 may include a lower-level supporter reinforcement layer 69, a middle-level supporter reinforcement layer 70 which is positioned at a higher level than the lower-level supporter reinforcement layer 69, and an upper-level supporter reinforcement layer 89 which is positioned at a higher level than the middle-level supporter reinforcement layer 70.

The supporter reinforcement structure 87 may selectively grow from the exposed surface of the supporter layer 66T which is exposed in the opening 86. The height of the supporter reinforcement structure 87 may be the same as or different from the height of the supporter layer 62A. The supporter reinforcement structure 87 may have a surround shape surrounding the sidewall of the opening 86. The shape of the supporter reinforcement structure 87 may vary. The sidewall profile of the supporter reinforcement structure 87 may be at least one among a vertical shape, a curved shape, and a tapered shape. The supporter reinforcement structure 87 may include the sidewall profiles of FIGS. 4A to 4D. The sidewall profiles of the supporter reinforcement structure 87 may be the same or different.

The supporter reinforcement structure 87 may include a nitrogen-containing material. The supporter reinforcement structure 87 may include, for example, silicon nitride, silicon carbon nitride (SiCN), silicon boron nitride (SiBN), or a combination thereof. The supporter reinforcement structure 87 may include the same material or different materials.

The supporter reinforcement structure 87 may be formed, for example, by a chemical vapor deposition (CVD) process or an atomic layer deposition (ALD) process. The supporter reinforcement structure 87 may selectively grow using an atomic layer deposition (ALD) process or a low-pressure chemical vapor deposition (LPCVD) process using, for example, dichloro silane ($SiH_2Cl_2$) and ammonia ($NH_3$) as reaction gases. The method for forming the supporter reinforcement structure 87 may be the same or different.

Figure 16D:
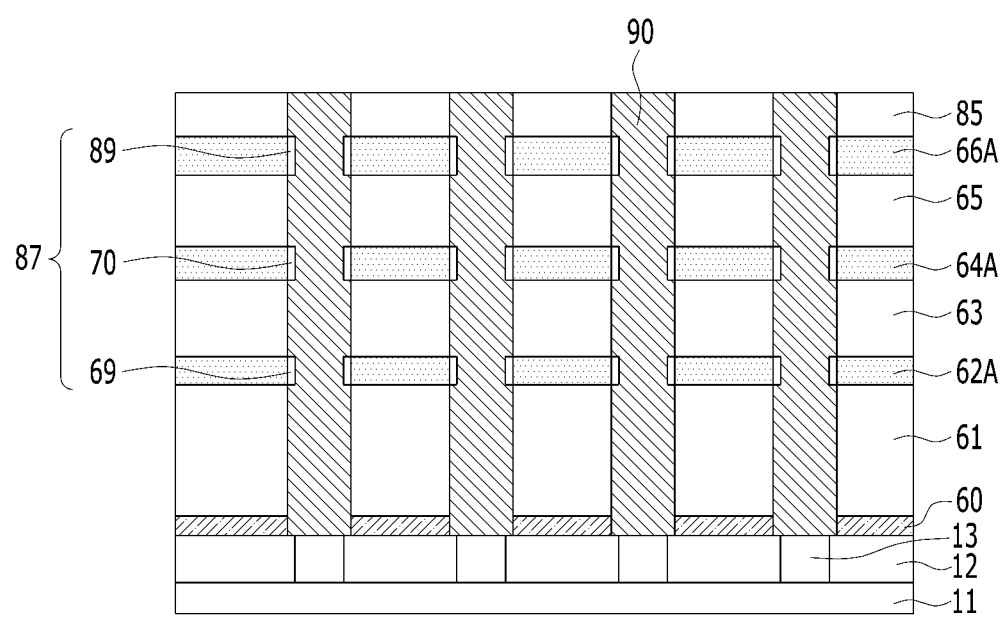

Referring to FIG. 16D, a plurality of bottom electrodes 90 may be formed in the opening 86 in which the supporter reinforcement structure 87 is formed. The bottom electrodes 90 may be formed over the contact plugs 13. The bottom electrodes 90 may include a metal, a metal nitride, or a combination thereof.

Figure 16E:
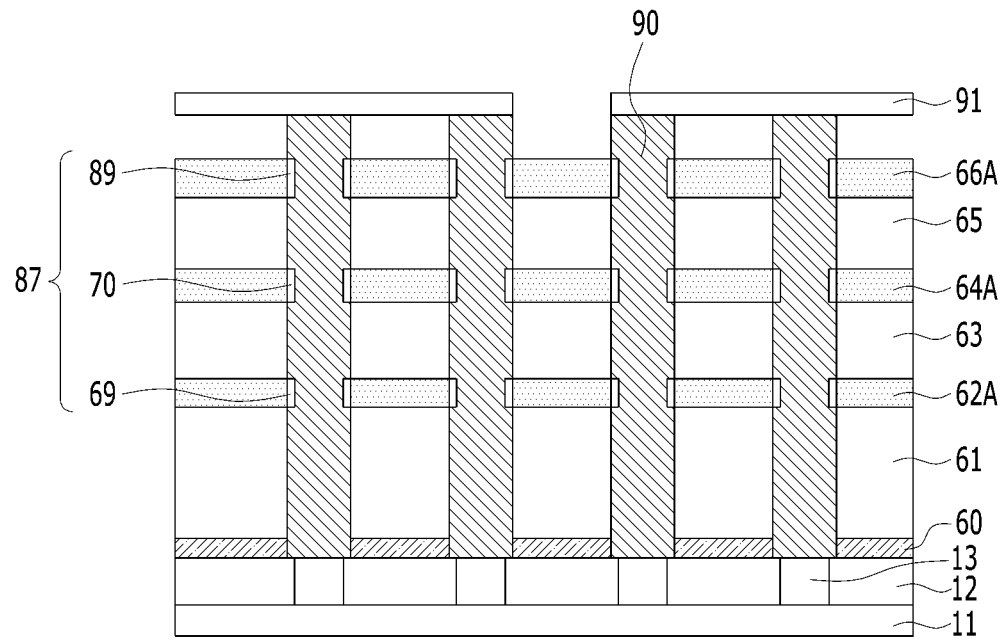

Referring to FIG. 16E, the uppermost-level mold layer 85 may be removed. The uppermost-level mold layer 85 may be removed by a wet dip-out process using the mask layer 91. As for the wet chemical, one or more chemicals among HF, $NH_4F/NH_4OH$, $H_2O_2$, HCl, $HNO_3$, and $H_2SO_4$ may be used. When the uppermost-level mold layer 85 is removed, the upper-level supporter layer 66A having an etch selectivity with respect to the uppermost-level mold layer 85 may not be removed. As the uppermost-level mold layer 85 is removed, the uppermost outer wall of the bottom electrodes 90 may be exposed.

Figure 16F:
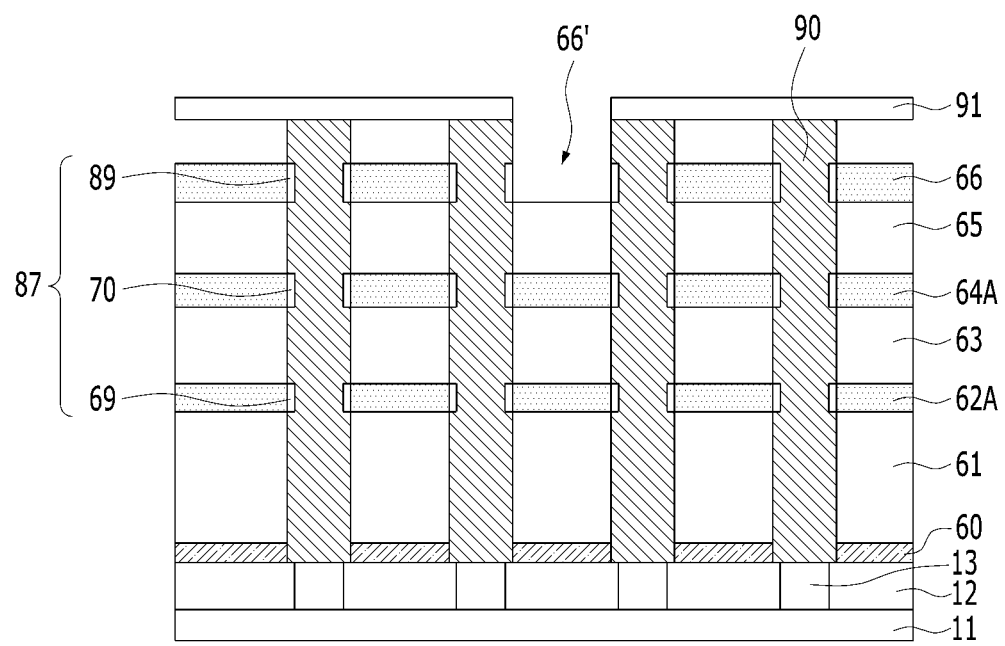

Referring to FIG. 16F, an upper-level supporter 66 may be formed over the bottom electrodes 90. In order to form the upper-level supporter 66, the upper-level supporter layer 66A exposed by the mask layer 91 may be selectively etched. The upper-level supporter 66 may be positioned at a lower level than the top surface of the bottom electrode.

The upper-level supporter opening 66' formed by etching the upper-level supporter layer 66A may have the same arrangement and shape as those of the supporter opening 105A shown in FIG. 3B. Therefore, the upper-level supporter 66 may include a plurality of upper-level supporter openings 66'. The upper-level supporter openings 66' may partially expose the side of the upper-level supporter reinforcement layer 89. From the perspective of a top view, one upper-level supporter opening 66' may be adjacent to at least three upper-level supporter reinforcement layers 89, and one upper-level supporter opening 66' may expose three neighboring upper-level supporter reinforcement layers 89. The upper-level supporter openings 66' may be formed in diverse shapes. In this embodiment of the present invention, the cross sections of the upper-level supporter openings 66' may be formed in a triangular shape. Some surfaces of the upper-level mold layer 65 may be exposed by the upper-level supporter openings 66'.

Figure 16G:
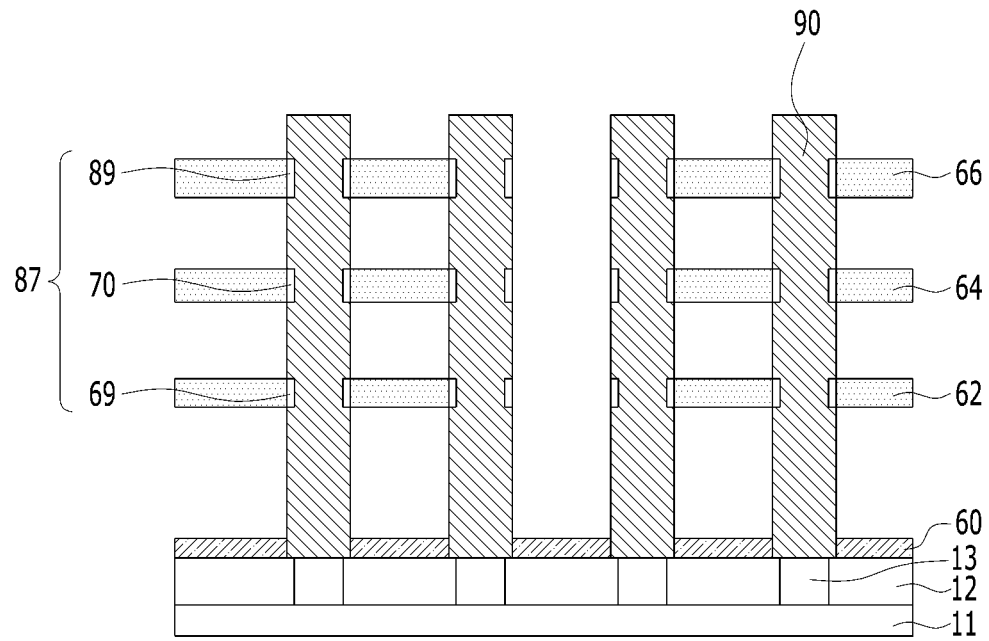

Referring to FIG. 16G, a middle-level supporter 64 and a lower-level supporter 62 may be sequentially formed.

In order to form the middle-level supporter 64, the upper-level mold layer 65 may be removed by a wet dip-out process, and then the middle-level supporter layer 64A may be etched. In order to form the lower-level supporter 62, the middle-level mold layer 63 may be removed by a wet dip-out process, and then the lower-level supporter layer 62A may be etched. After the lower-level supporter 62 is formed, the lower-level mold layer 61 may be removed by a wet dip-out process. An etching process for forming the middle-level supporter 64 and the lower-level supporter 62 may use a mask layer 91. The wet dip-out process for removing the upper-level mold layer 65, the middle-level mold layer 63, and the lower-level mold layer 61 may use such chemicals as HF, $NH_4F/NH_4OH$, $H_2O_2$, HCl, $HNO_3$, and $H_2SO_4$.

The middle-level supporter 64 and the lower-level supporter 62 may include middle-level supporter openings and lower-level supporter openings (whose reference numerals are not given), respectively. The middle-level supporter openings and the lower-level supporter openings may have the same shape as the shape of the upper-level supporter openings 66'.

As the lower-level mold layer 61 is removed, the outer wall of the bottom electrodes 90 may be partially exposed. Herein, the bottom electrodes 90 may be supported by the lower-level supporter reinforcement layer 69, the middle-level supporter reinforcement layer 70, the upper-level supporter reinforcement layer 89, the lower-level supporter 62, the middle-level supporter 64, and the upper-level supporters 66.

After the lower-level mold layer 61 is removed, the mask layer 91 may be removed.

Figure 16H:
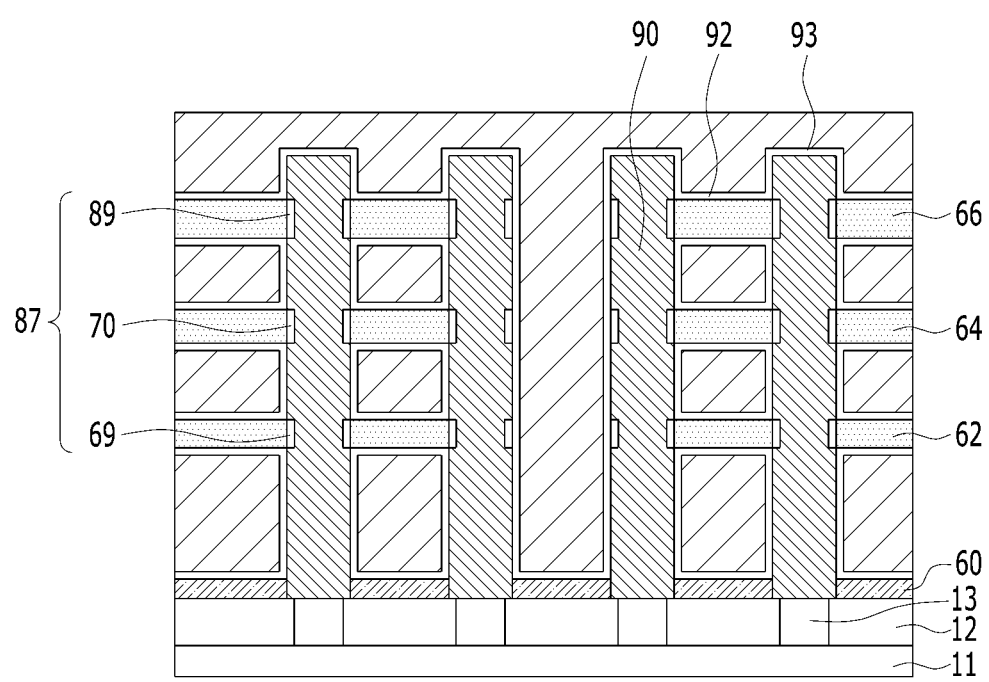

Referring to FIG. 16H, the dielectric layer 92 and the top electrode 93 may be sequentially formed. The dielectric layer 92 may cover a portion of the bottom electrodes 90, a portion of the supporter reinforcement layer 87, the upper and lower surfaces of the lower-level supporter 62, the upper and lower surfaces of the middle-level supporter 64, and the upper and lower surfaces of the upper-level supporter 66. A portion of the dielectric layer 92 may cover the surface of the etch stop layer 60.

The top electrode 93 may fill the space between the neighboring bottom electrodes 90 over the dielectric layer 92. A portion of the top electrode 93 may cover the upper portion of the bottom electrodes 90 over the dielectric layer 92.

Figure 17A:
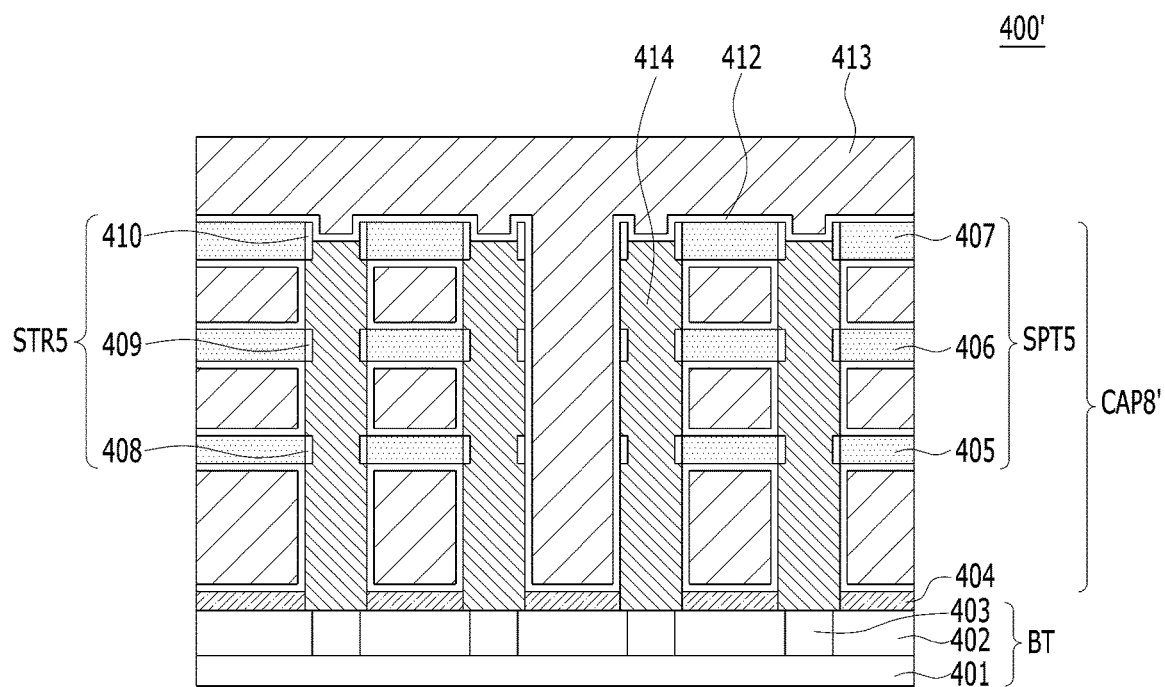
FIGS. 17A and 17B are cross-sectional views illustrating a semiconductor device in accordance with another embodiment of the present invention.
Figure 17B:
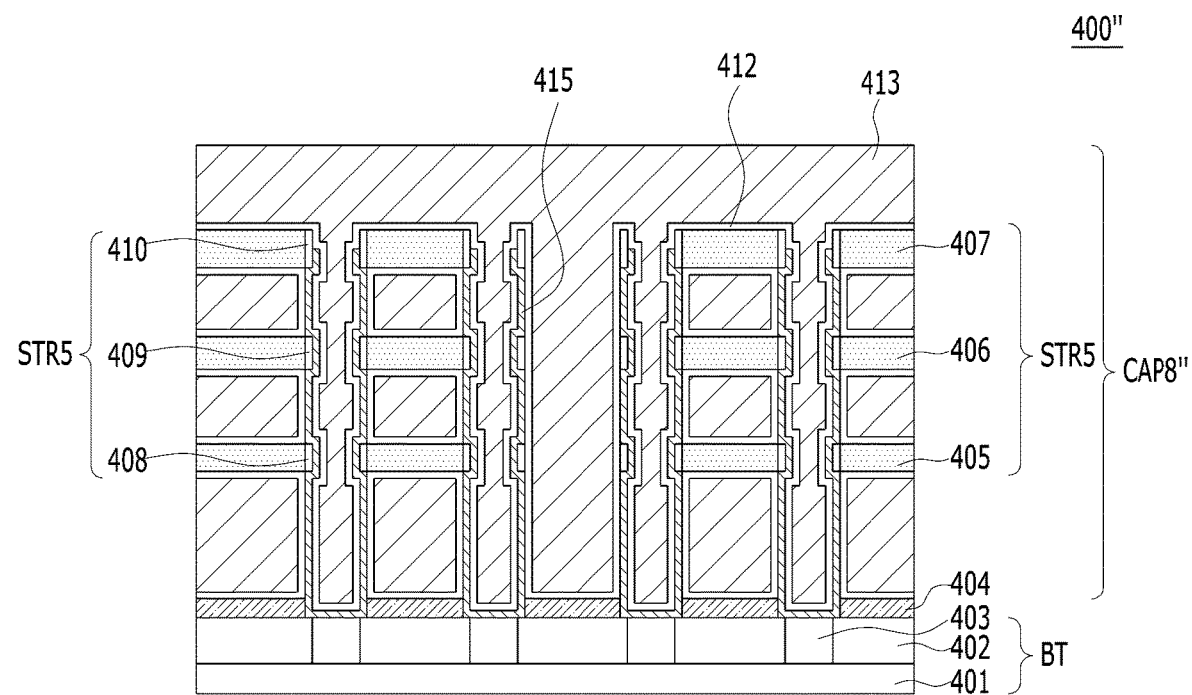

FIGS. 17A and 17B are cross-sectional views illustrating semiconductor devices 400' and 400", respectively, in accordance with an embodiment of the present invention.

The semiconductor devices 400' and 400" respectively illustrated in FIGS. 17A and 17B may be identical or similar to the semiconductor devices in accordance with the above-described embodiments of the present invention. Hereinafter, the semiconductor devices 400' and 400" may include a supporter and a supporter reinforcement layer similarly to the semiconductor device 400 shown in FIG. 15. Hereinafter, detailed description of the overlapping constituent elements will be omitted.

Referring to FIG. 17A, the semiconductor device 400' may be identical or similar to the semiconductor device 400 shown in FIG. 15. A plurality of bottom electrodes 414 may be formed over each of the contact plugs 403. The bottom electrodes 414 may be positioned at a lower level than the top surface of the upper-level supporter 407. The top surface of the bottom electrode 414 may be at a higher level than the bottom surface of the upper-level supporter 407. The upper outer wall of the bottom electrode 414 may be supported by the upper-level supporter 407 and the upper-level supporter reinforcement layer 410. From the perspective of a top view, the upper-level supporter reinforcement layer 410 may have a closed loop shape surrounding the upper sidewall of the bottom electrodes 414. A portion of the upper-level supporter reinforcement layer 410 may be positioned between the bottom electrodes 414 and the upper-level supporter 407. The shape of the upper-level supporter reinforcement layer 410 may vary. The sidewall profile of the upper-level supporter reinforcement layer 410 may be at least one among a vertical shape, a curved shape, and a tapered shape. The upper-level supporter reinforcement layer 410 may include sidewall profiles of FIGS. 4A to 4D. The sidewall profile of the upper-level supporter reinforcement layer 410 may be a vertical shape whose height is the same as that of the upper-level supporter 407.

Referring to FIG. 17B, the semiconductor device 400" may be identical or similar to the semiconductor device 400' of FIG. 17A. The bottom electrodes 415 of the semiconductor device 400" may have a cylinder shape. The top surface of the bottom electrodes 415 may be positioned at a lower level than the top surface of the upper-level supporter 407. The top surface of the bottom electrodes 415 may be positioned at a higher level than the bottom surface of the upper-level supporter 407. The upper outer wall of the bottom electrodes 415 may be supported by the upper-level supporter 407 and the upper-level supporter reinforcement layer 410.

Figure 18:
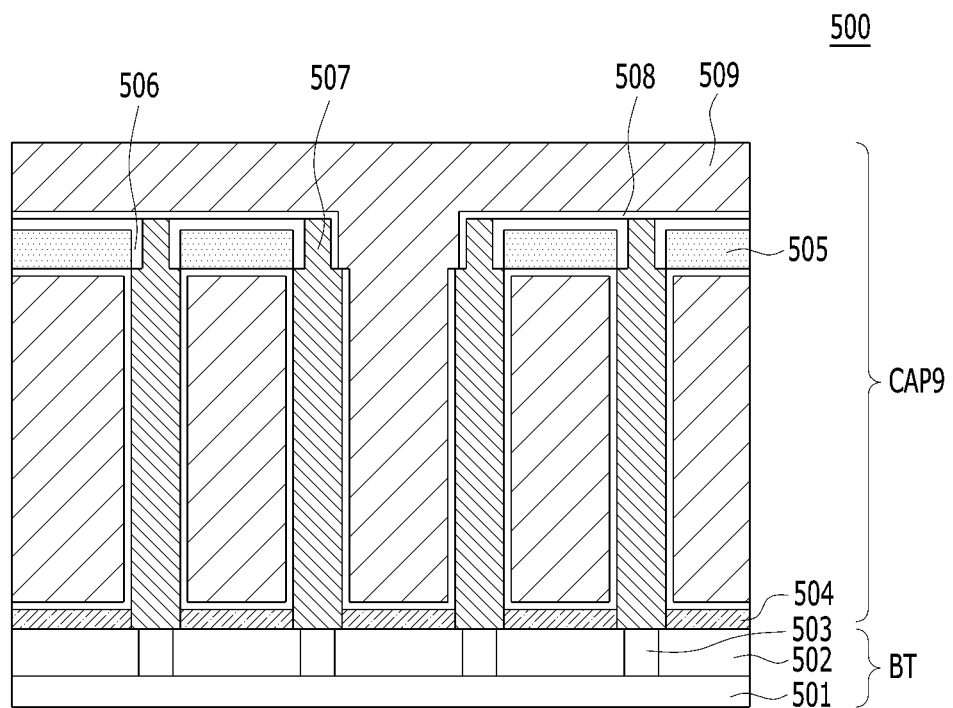
FIG. 18 is a cross-sectional view illustrating a semiconductor device in accordance with another embodiment of the present invention.

FIG. 18 is a cross-sectional view illustrating a semiconductor device 500 in accordance with an embodiment of the present invention. The semiconductor device 500 may be identical or similar to the semiconductor devices in accordance with the above-described embodiments of the present invention.

Referring to FIG. 18, the semiconductor device 500 may include a lower structure BT and a capacitor structure CAP9.

The lower structure BT may include a substrate 501, an inter-layer dielectric layer 502, and contact plugs 503. The contact plugs 503 may penetrate the inter-layer dielectric layer 502 to be coupled to the substrate 501.

The capacitor structure CAP9 may include an etch stop layer 504, a supporter 505, a supporter reinforcement layer 506, a plurality of bottom electrodes 507, a dielectric layer 508, and a top electrode 509. The etch stop layer 504 may be formed over the contact plugs 503 and the inter-layer dielectric layer 502. The bottom electrodes 507 may be formed over a corresponding one of the contact plugs 503. Each of the bottom electrodes 507 may each be electrically connected to a corresponding one of the contact plugs 503. The bottom electrodes 507 may have a pillar shape. The dielectric layer 508 may be formed on the bottom electrodes 507. The top electrode 509 may be formed on the dielectric layer 508.

The outer wall of the bottom electrodes 507 may be supported by the supporter 505. The supporter 505 may be formed to support the outer wall of the bottom electrodes 507 in a lateral direction to prevent the bottom electrodes 507 from collapsing. The supporter 505 may be formed to support the upper outer wall of the bottom electrodes 507 in a lateral direction. The supporter 505 may include a nitrogen-containing material. The supporter 505 may be formed of a dielectric material, such as silicon nitride. The supporter 505 may include a plurality of supporter openings (not shown).

The supporter reinforcement layer 506 may have a cap shape surrounding the supporter 505. For example, the supporter reinforcement layer 506 may be formed on the upper surface and side portion of the supporter 505. The supporter reinforcement layer 506 may be positioned between the bottom electrodes 507 and the supporter 505. The supporter reinforcement layer 506 may be positioned between the dielectric layer 508 and the supporter 505. The supporter reinforcement layer 506 may have a shape extending from the interface between the supporter 505 and the bottom electrodes 507 to cover the upper surface of the supporter 505.

The supporter reinforcement layer 506 may include a dielectric material. The supporter reinforcement layer 506 may include a nitrogen-containing material. The supporter reinforcement layer 506 may include, for example, silicon nitride, silicon carbon nitride (SiCN), silicon boron nitride (SiBN), or a combination thereof. The supporter reinforcement layer 506 and the supporter 505 may be of the same material or different materials.

The supporter reinforcement layer 506 may be formed, for example, by a chemical vapor deposition (CVD) process or an atomic layer deposition (ALD) process. The supporter reinforcement layer 506 may grow by using plasma to increase the selective growth effect from the supporter 505. The supporter reinforcement layer 506 may selectively grow using an atomic layer deposition (ALD) process or a low-pressure chemical vapor deposition (LPCVD) process using, for example, dichloro silane (SiH$_2$Cl$_2$) and ammonia (NH$_3$) as reaction gases.

According to the above-described embodiment of the present invention, since the supporter reinforcement layer 506 reinforces the side portion and the upper surface of the supporter 505, the structural stability of a capacitor may be increased.

FIGS. 19A to 19E are cross-sectional views illustrating an example of a method for fabricating a semiconductor device in accordance with an embodiment of the present invention.

First, a mold stack pattern 30 including a plurality of openings 17 may be formed by the method illustrated in FIGS. 7A to 7B.

Figure 19A:
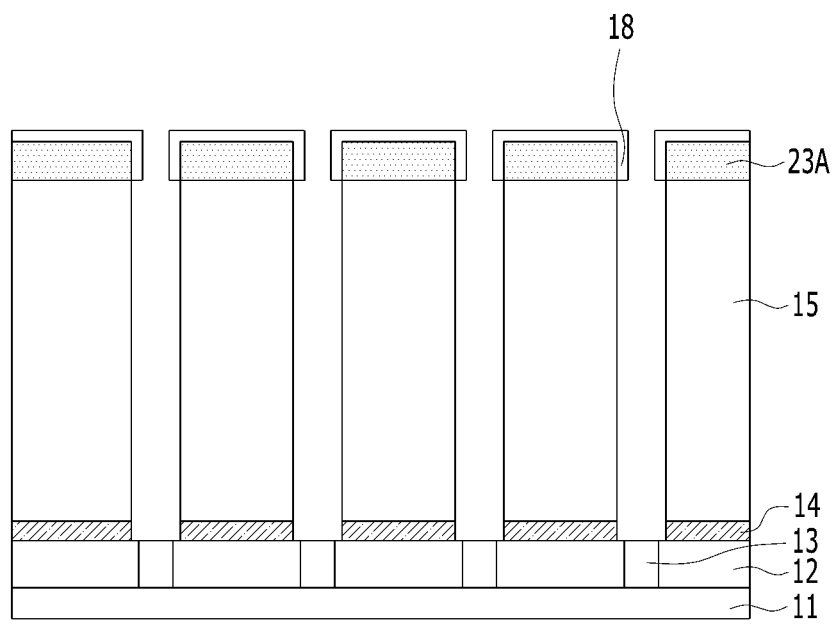
FIGS. 19A to 19E are cross-sectional views illustrating an example of a method for fabricating a semiconductor device in accordance with another embodiment of the present invention.

Referring to FIG. 19A, a supporter reinforcement layer 18 may be selectively formed on the upper surface and side portion of the supporter layer 23A.

The supporter reinforcement layer 18 may selectively grow from the exposed surface of the supporter layer 23A formed inside the openings and the upper surface of the supporter layer 23A. The supporter reinforcement layer 18 may not grow on the exposed surface of the mold layer 15 formed inside the openings. The thickness of the supporter reinforcement layer 18 may be the same as or different from the thickness of the supporter layer 23A. The height from the etch stop layer 14 to the supporter reinforcement layer 18 may be the same as or different from the height from the etch stop layer 14 to the lower surface of the supporter layer 23A. The thickness of the supporter reinforcement layer 18 on the upper surface of the supporter layer 23A and the thickness of the supporter reinforcement layer 18 on the side portion of the supporter layer 23A may be the same or different.

The supporter reinforcement layer 18 may be a surround shape surrounding the upper sidewalls of the openings 17. The sidewall profile of the supporter reinforcement layer 18 may be at least one among a vertical shape, a curved shape, and a tapered shape. The supporter reinforcement layer 18 may have a sidewall profile shown in FIGS. 4A to 4D. In this embodiment of the present invention, the sidewall profile of the supporter reinforcement layer 18 may be a vertical shape.

The supporter reinforcement layer 18 may include a nitrogen-containing material. The supporter reinforcement layer 18 may include, for example, silicon nitride, silicon carbon nitride (SiCN), silicon boron nitride (SiBN), or a combination thereof. The supporter reinforcement layer 18 may be formed, for example, by a chemical vapor deposition (CVD) process or an atomic layer deposition (ALD) process. The supporter reinforcement layer 18 may selectively grow using an atomic layer deposition (ALD) process or a low-pressure chemical vapor deposition (LPCVD) process using, for example, dichloro silane (SiH$_2$Cl$_2$) and ammonia (NH$_3$) as reaction gases.

Since the supporter reinforcement layer 18 may selectively grow from the exposed surface of the supporter layer 23A, which is exposed inside the openings, and the upper surface of the supporter layer 23A, the supporter reinforcement layer 18 may increase the structural stability of the supporter layer 23A. Even though the supporter layer 23A is formed thin, since the supporter material is reinforced by the supporter reinforcement layer 18, the bottom electrodes may be stably supported during the subsequent process. Also, since the supporter layer 23A is formed thin, an etching process for forming openings may be easily performed while preventing etching defects such as not-open. Since the supporter reinforcement layer 18 is formed after the openings are formed in a greater width (or diameter) than the width (or diameter) of the subsequent bottom electrodes, gap-filling of the subsequent bottom electrodes may be performed easily.

Figure 19B:
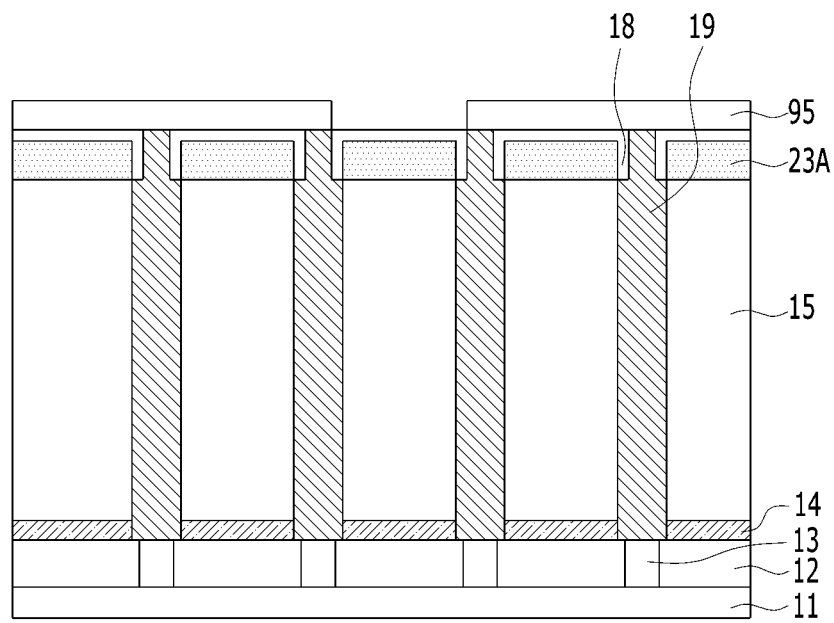

Referring to FIG. 19B, bottom electrodes 19 may be formed over the contact plugs 13. The bottom electrodes 19 may be formed by a polishing process of the bottom electrode layer. While the bottom electrodes 19 is formed, the supporter reinforcement layer 18 may partially remain on the upper surface of the supporter layer 23A. Therefore, the bottom electrodes 19 may be formed inside the openings 17, and the supporter reinforcement layer 18 may be formed in a cap shape surrounding the upper surface and side portion of the supporter layer 23A. For example, the supporter reinforcement layer 18 may be positioned between the bottom electrodes 19 and the supporter layer 23A, and may also be positioned on the upper surface of the supporter layer 23A. The supporter reinforcement layer 18 may have a shape extending from the interface between the supporter layer 23A and the bottom electrodes 19 to cover the upper surface of the supporter layer 23A.

The bottom electrodes 19 may include one shape among a pillar shape, a cylinder shape, or a pylinder shape. In this embodiment of the present invention, the bottom electrodes 19 may have a pillar shape. The bottom electrodes 19 may have a high aspect ratio. The aspect ratio of each of the bottom electrodes 19 refers to its height over its width. The high aspect ratio refers to an aspect ratio which is greater than approximately 1:1. For example, the height of the bottom electrodes 19 may be ten times greater than the width of the bottom electrodes 19.

Figure 19C:
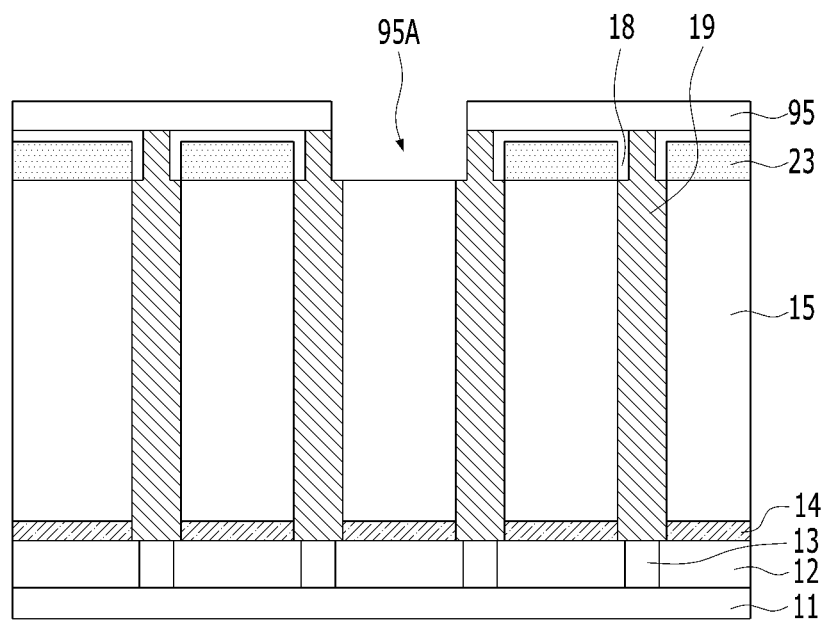

Referring to FIG. 19C, a supporter 23 may be formed on the bottom electrodes 19. In order to form the supporter 23, a mask layer 95 may be included. The portion exposed by the mask layer 95 may include a supporter layer 23A and a supporter reinforcement layer 18. The supporter 23 may be formed by selectively etching the supporter layer 23A exposed by the mask layer 95. The supporter openings 95A formed by etching the supporter layer 23A may have the same arrangement and shape as those of the supporter openings 105B shown in FIG. 5. A plurality of supporter openings 95A may be positioned between the neighboring bottom electrodes 19. The supporter openings 95A may partially expose the upper outer wall of at least three neighboring bottom electrodes 19. The supporter openings 95A may be formed in diverse shapes. In this embodiment of the present invention, the cross section of the supporter openings 95A may be formed in a triangular shape.

The bottom electrodes 19 may be partially exposed due to the formation of the supporter 23. The supporter reinforcement layer 18 may be positioned between the bottom electrodes 19 and the supporter 23. The supporter reinforcement layer 18 may be positioned between the mask layer 95 and the upper surface of the supporter 23. The supporter reinforcement layer 18 may have a shape extending from the interface between the bottom electrodes 19 and the supporter 23 to cover the upper surface of the supporter 23. Some surfaces of the mold layer 15 may be exposed by the supporter openings.

Figure 19D:
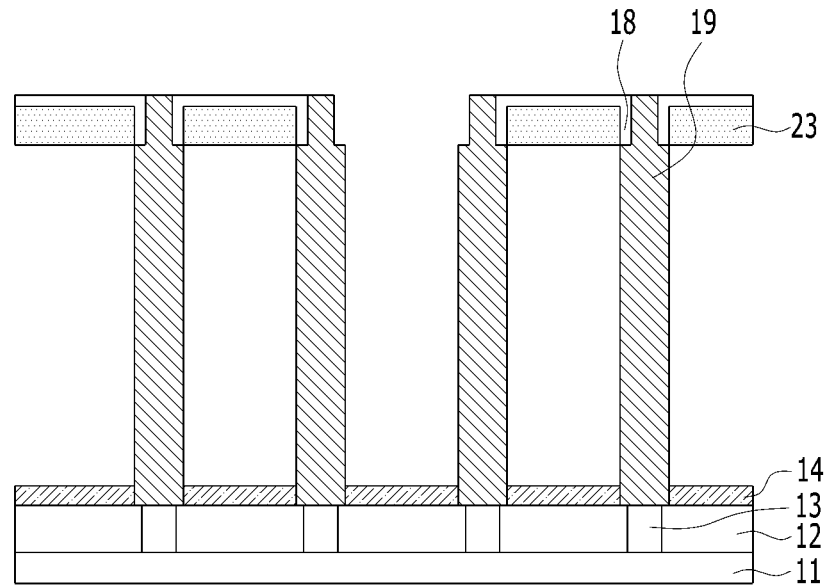

Referring to FIG. 19D, the mold layer 15 may be removed. For example, the mold layer 15 may be removed by a wet dip-out process. As for the wet chemical, one or more chemicals among HF, NH$_4$F/NH$_4$OH, H$_2$O$_2$, HCl, HNO$_3$, and H$_2$SO$_4$ may be used. When the mold layer 15 is removed, the supporter 23 having an etch selectivity with respect to the mold layer 15 may not be removed.

As the mold layer 15 is removed, the outer wall of the bottom electrodes 19 may be exposed. Herein, the upper outer wall of the bottom electrodes 19 may be supported by the supporter 23 and the supporter reinforcement layer 18. The supporter reinforcement layer 18 may have a cap shape surrounding the supporter 23. Therefore, it is possible to prevent the bottom electrodes 19 from collapsing and secure a greater capacity.

Figure 19E:
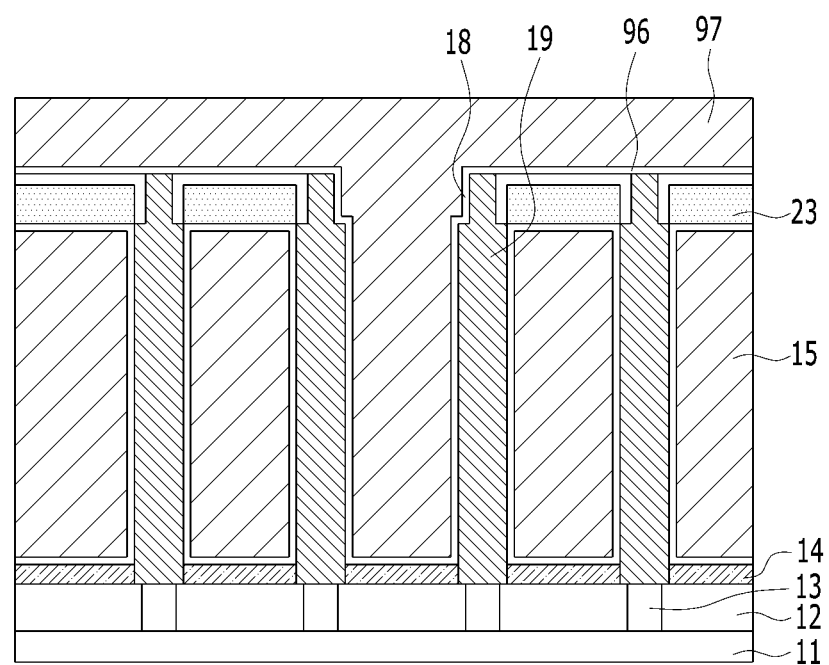

Referring to FIG. 19E, a dielectric layer 96 may be formed on the bottom electrodes 19, the supporter 23, and the supporter reinforcement layer 18. A portion of the dielectric layer 96 may cover the etch stop layer 14. The dielectric layer 96 may cover the supporter 23.

A top electrode 97 may be formed on the dielectric layer 21.

Figure 20:
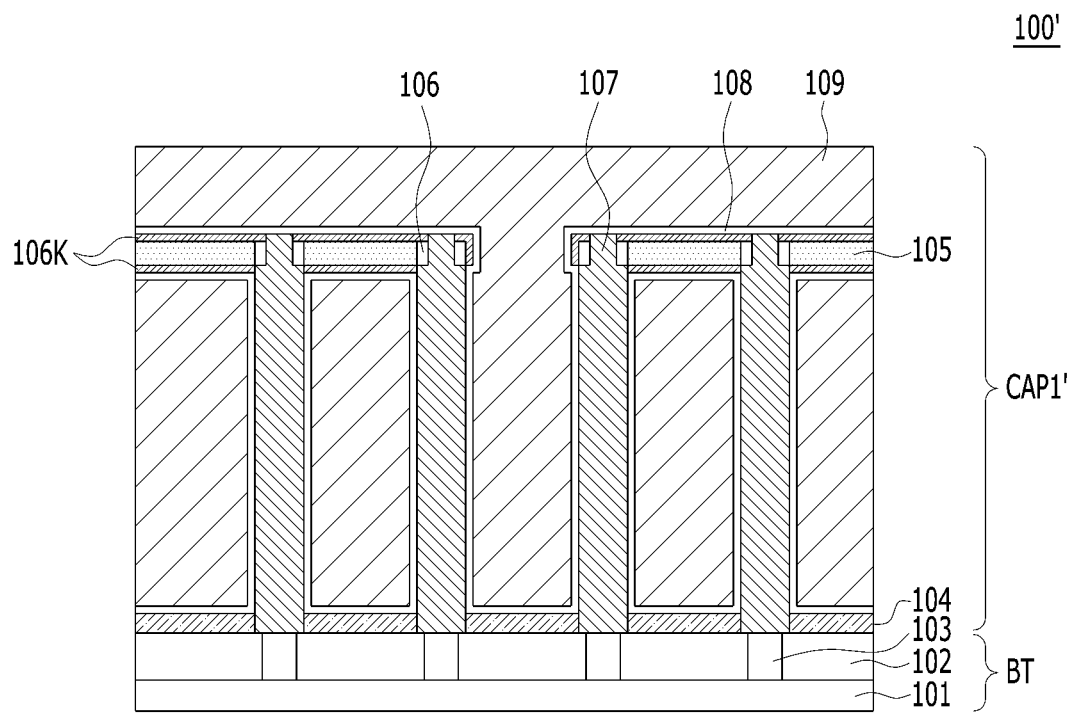
FIG. 20 is a cross-sectional view illustrating a semiconductor device in accordance with another embodiment of the present invention.

FIG. 20 is a cross-sectional view illustrating a semiconductor device 100' in accordance with an embodiment of the present invention. The semiconductor device 100' illustrated in FIG. 20 may be identical or similar to the semiconductor devices in accordance with the above-described embodiments of the present invention.

Referring to FIG. 20, the semiconductor device 100' may include a lower structure BT and a capacitor structure CAP1' disposed over the lower structure BT.

The lower structure BT may include a substrate 101, an inter-layer dielectric layer 102, and a plurality of contact plugs spaced apart from each other.

The capacitor structure CAP1' may include an etch stop layer 104, a supporter 105, a supporter reinforcement layer 106, an additional supporter reinforcement layer 106K, a plurality of bottom electrodes 107, a dielectric layer 108, and a top electrode 109.

The etch stop layer 104 may be formed over the contact plugs 103 and the inter-layer dielectric layer 102. The bottom electrodes 107 may be formed over a corresponding one of the contact plugs 103. The dielectric layer 108 may be formed on the bottom electrodes 107. The top electrode 109 may be formed on the dielectric layer 108.

The outer wall of the bottom electrodes 107 may be supported by the supporter 105. The supporter 105 may be formed to support the outer wall of the bottom electrodes 107 in a lateral direction to prevent the bottom electrodes 107 from collapsing. The supporter 105 may be formed of a dielectric material, such as silicon nitride.

The supporter reinforcement layer 106 may be formed on the side portion of the supporter 105. The supporter reinforcement layer 106 may be positioned between the bottom electrodes 107 and the supporter 105. As illustrated in FIG. 3B, the supporter reinforcement layer 106 may have a surround shape surrounding the upper outer wall of the bottom electrodes 107. From the perspective of a top view, the supporter reinforcement layer 106 may have a closed loop shape surrounding the side wall of the bottom electrodes 107. The height of the supporter reinforcement layer 106 may be the same as or different from the height of the supporter 105. The height from the etch stop layer 104 to the supporter reinforcement layer 106 may be the same as or different from the height from the etch stop layer 103 to the lower surface of the supporter 105. The sidewall profile of the supporter reinforcement layer 106 may be at least one among a vertical shape, a curved shape, and a tapered shape.

The supporter reinforcement layer 106 may include a dielectric material. The supporter reinforcement layer 106 may include a nitrogen-containing material. The supporter reinforcement layer 106 may include, for example, silicon nitride, silicon carbon nitride (SiCN), silicon boron nitride (SiBN), or a combination thereof. The supporter reinforcement layer 106 and the supporter 105 may be of the same material or different materials. The supporter reinforcement layer 106 may be formed, for example, by a chemical vapor deposition (CVD) process or an atomic layer deposition (ALD) process. The supporter reinforcement layer 106 may selectively grow using an atomic layer deposition (ALD) process or a low-pressure chemical vapor deposition (LPCVD) process using, for example, dichloro silane ($SiH_2Cl_2$) and ammonia ($NH_3$) as reaction gases.

The additional supporter reinforcement layer 106K may be positioned on the upper surface of the supporter 105, the lower surface of the supporter 105, and the upper surface of the supporter reinforcement layer 106. The additional supporter reinforcement layer 106K may be formed by performing a wet dip-out process on the mold layer and then performing a selective growth process after the outer wall of the bottom electrodes 107 is exposed. The additional supporter reinforcement layer 106K may selectively grow from at least one between the supporter 105 and the supporter reinforcement layer 106. The thickness of the additional supporter reinforcement layer 106K on the upper surface of the supporter 105 and the thickness of the additional supporter reinforcement layer 106K on the lower surface of the supporter 105 may be the same or different.

The additional supporter reinforcement layer 106K may include a nitrogen-containing material. The additional supporter reinforcement layer 106K may include, for example, silicon nitride, silicon carbon nitride (SiCN), silicon boron nitride (SiBN), or a combination thereof. The additional supporter reinforcement layer 106K and the supporter 105 may be of the same material or different materials. The additional supporter reinforcement layer 106K and the supporter reinforcement layer 106 may be of the same material or different materials.

The additional supporter reinforcement layer 106K may be formed, for example, by a chemical vapor deposition (CVD) process or an atomic layer deposition (ALD) process. The additional supporter reinforcement layer 106K may grow by using plasma to increase the selective growth effect from the supporter 105. The additional supporter reinforcement layer 106K may selectively grow using an atomic layer deposition (ALD) process or a low-pressure chemical vapor deposition (LPCVD) process using, for example, dichloro silane ($SiH_2Cl_2$) and ammonia ($NH_3$) as reaction gases.

Therefore, even though the supporter 105 is formed thin, since the supporter material is reinforced by the supporter reinforcement layer 106 and the additional supporter reinforcement layer 106K, the bottom electrodes 107 may be stably supported.

FIGS. 21A to 21E are cross-sectional views illustrating an example of a method for fabricating a semiconductor device in accordance with an embodiment of the present invention.

Figure 21A:
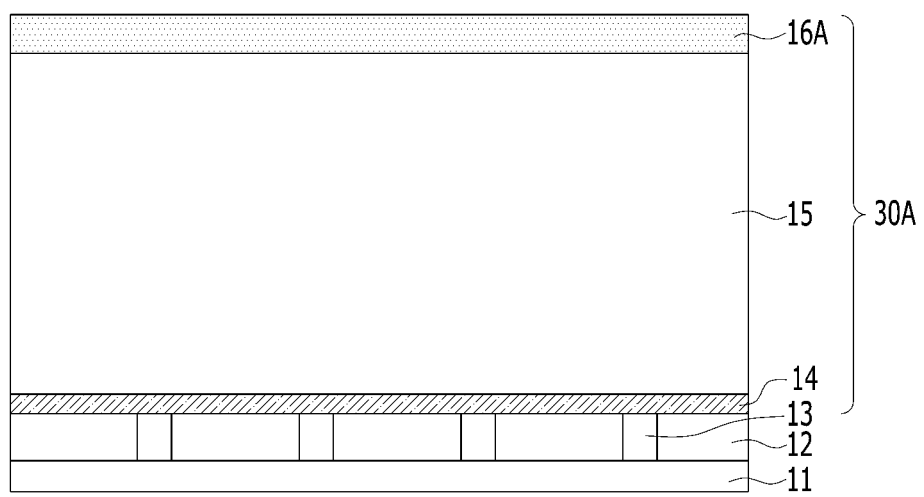
FIGS. 21A to 21E are cross-sectional views illustrating an example of a method for fabricating a semiconductor device in accordance with another embodiment of the present invention.

Referring to FIG. 21A, an inter-layer dielectric layer 12 and A plurality of spaced apart contact plugs 13 penetrating the inter-layer dielectric layer 12 may be formed over the substrate 11. A mold stack layer 30A may be formed over the contact plugs 13 and the inter-layer dielectric layer 12. The mold stack layer 30A may include an etch stop layer 14, a mold layer 15, and a supporter layer 16A. An etch stop layer 14 may be formed on the contact plugs 13 and the inter-layer dielectric layer 12. A mold layer 15 may be formed over the etch stop layer 14.

A supporter layer 16A may be formed over the mold layer 15. The thickness of the supporter layer 16A may be smaller than the thickness of the mold layer 15. The supporter layer 16A may be formed of a material having an etch selectivity with respect to the mold layer 15. The supporter layer 16A may include a nitrogen-containing material. The supporter layer 16A may include, for example, silicon nitride, silicon carbon nitride (SiCN), silicon boron nitride (SiBN), or a combination thereof.

Figure 21B:
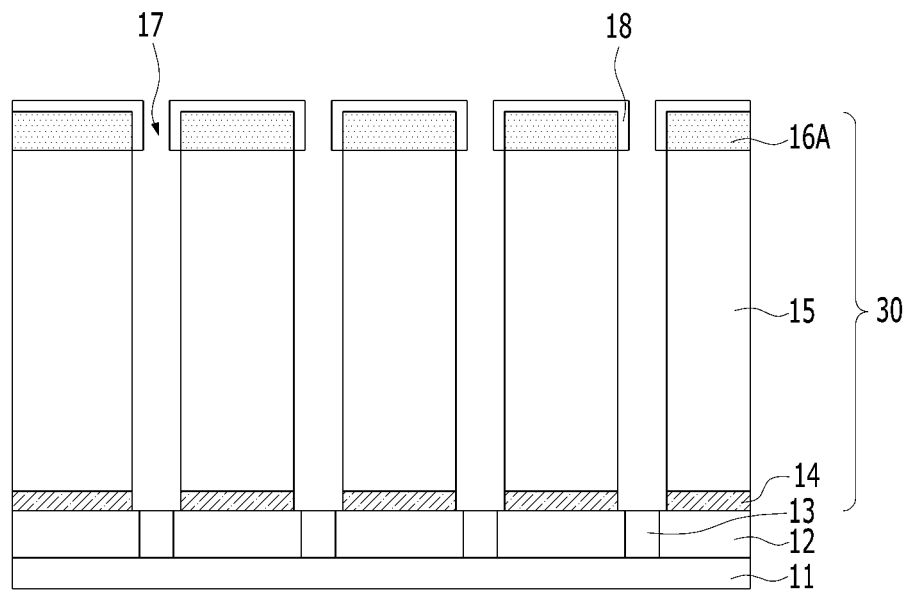

Referring to FIG. 21B, a plurality of spaced apart openings 17 and a mold stack pattern 30 may be formed. Subsequently, a supporter reinforcement layer 18 may be selectively formed on the side portion and the upper surface of the supporter layer 16A.

The supporter reinforcement layer 18 may selectively grow from the exposed surface of the supporter layer 16A which is formed inside the openings 17. The supporter reinforcement layer 18 may not grow on the exposed surface of the mold layer 15 which is formed inside the openings 17. The supporter reinforcement layer 18 may grow on the upper surface of the supporter layer 16A. The height of the supporter reinforcement layer 18 may be the same as or different from the height of the supporter layer 16A. The height from the etch stop layer 14 to the supporter reinforcement layer 18 may be the same as or different from the height from the etch stop layer 14 to the lower surface of the supporter layer 16A. The supporter reinforcement layer 18 may have a surround shape surrounding the upper sidewall of the openings 17. The shape of the supporter reinforcement layer 18 may vary. The sidewall profile of the supporter reinforcement layer 18 may be at least one among a vertical shape, a curved shape, and a tapered shape. The supporter reinforcement layer 18 may have the sidewall profiles shown in FIGS. 4A to 4D.

The supporter reinforcement layer 18 may include a nitrogen-containing material. The supporter reinforcement layer 18 may include, for example, silicon nitride, silicon carbon nitride (SiCN), silicon boron nitride (SiBN), or a combination thereof. The supporter reinforcement layer 18 may be formed, for example, by a chemical vapor deposition (CVD) process or an atomic layer deposition (ALD) process. The supporter reinforcement layer 18 may selectively grow using an atomic layer deposition (ALD) process or a low-pressure chemical vapor deposition (LPCVD) process using, for example, dichloro silane ($SiH_2Cl_2$) and ammonia ($NH_3$) as reaction gases.

Figure 21C:
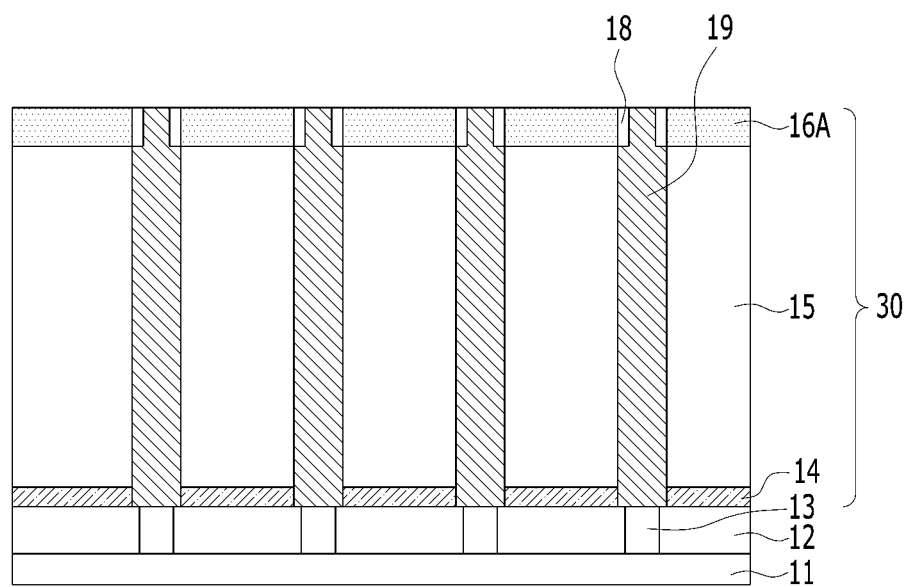

Referring to FIG. 21C, bottom electrodes 19 may be formed in the openings 17 in which the supporter reinforcement layer 18 is formed. The bottom electrodes 19 may each be electrically connected to a corresponding one of the contact plugs 13. The bottom electrodes 19 may include a metal, a metal nitride, or a combination thereof. The bottom electrodes 19 may be performed by a polishing process. While the bottom electrodes 19 is formed, the supporter reinforcement layer 18 of the upper surface of the supporter layer 16A may be removed.

The supporter reinforcement layer 18 may be positioned between the bottom electrodes 19 and the supporter layer 16A. The supporter reinforcement layer 18 may have a surround shape surrounding the outer wall of the bottom electrodes 19. From the perspective of a top view, the supporter reinforcement layer 18 may be a closed loop shape. The bottom electrodes 19 may include one shape among a pillar shape, a cylinder shape, or a pylinder shape. In this embodiment of the present invention, the bottom electrodes 19 may have a pillar shape.

Figure 21D:
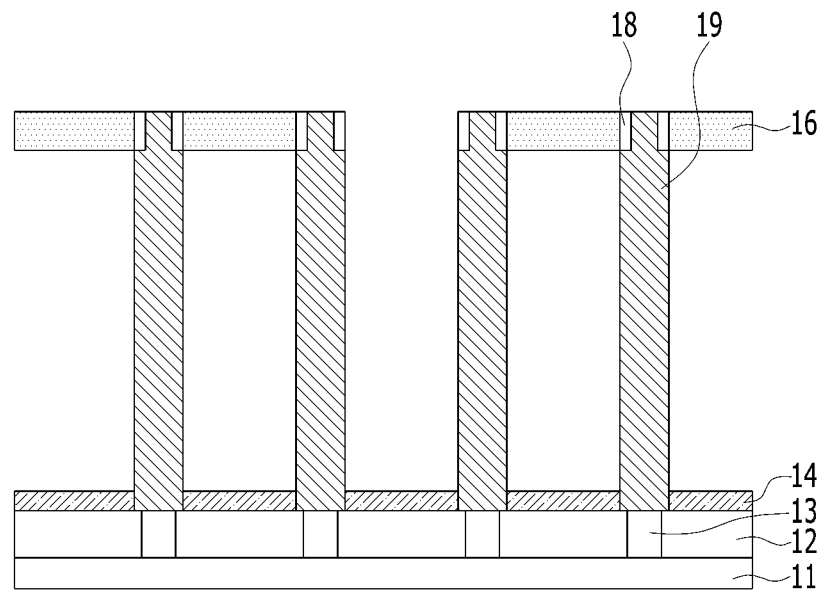

Referring to FIG. 21D, a supporter 16 supporting the upper outer wall of the bottom electrodes 19 may be formed. In order to form the supporter 16, the supporter layer 16A exposed by the mask layer (not shown) may be selectively etched. The supporter opening (not shown) formed by etching the supporter layer 16A may have the same arrangement and shape as those of the supporter opening 105A shown in FIG. 3B. Some surfaces of the mold layer 15 may be exposed by the supporter opening (not shown).

The mold layer 15 may be removed by a wet dip-out process. As for the wet chemical, one or more chemicals among HF, $NH_4F/NH_4OH$, $H_2O_2$, HCl, $HNO_3$, and $H_2SO_4$ may be used. When the mold layer 15 is removed, the supporter 16 and the supporter reinforcement layer 18 having an etch selectivity with respect to the mold layer 15 may not be removed.

Figure 21E:
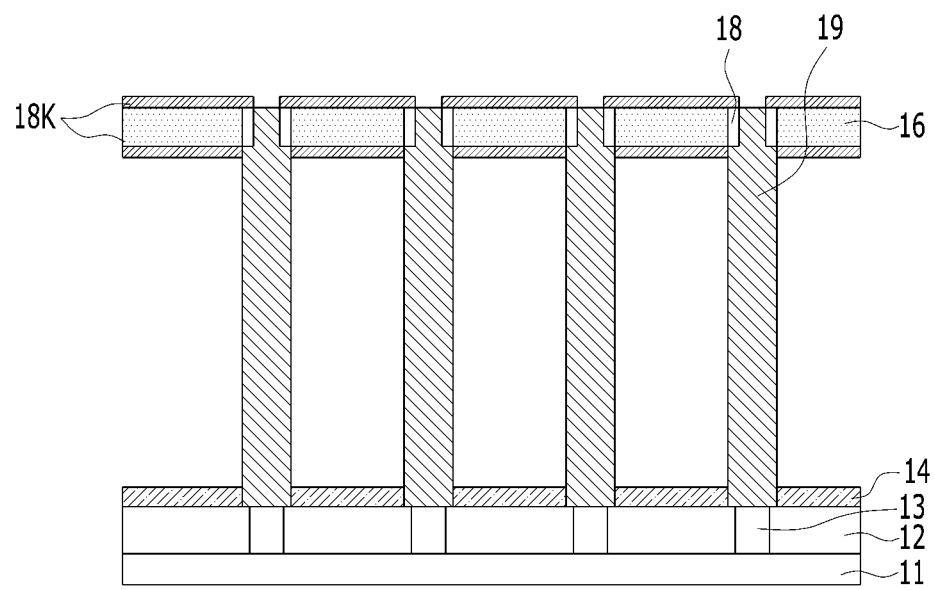

Referring to FIG. 21E, an additional supporter reinforcement layer 18K may selectively grow from at least one between the supporter 16 and the supporter reinforcement layer 18. The additional supporter reinforcement layer 18K may be formed over the upper surface of the supporter 16, the lower surface of the supporter 16, and the upper surface of the supporter reinforcement layer 18. The additional supporter reinforcement layer 18K may selectively grow from the supporter 16 and the supporter reinforcement layer 18. The thickness of the additional supporter reinforcement layer 18K on the upper surface of the supporter 16 and the thickness of the additional supporter reinforcement layer 18K on the lower surface of the supporter 16 may be the same or different. The thickness of the additional supporter reinforcement layer 18K on the upper surface of the supporter reinforcement layer 18 and the thickness of the additional supporter reinforcement layer 18K on the lower surface of the supporter 16 may be the same or different.

The additional supporter reinforcement layer 18K may include a nitrogen-containing material. The additional supporter reinforcement layer 18K may include, for example, silicon nitride, silicon carbon nitride (SiCN), silicon boron nitride (SiBN), or a combination thereof. The additional supporter reinforcement layer 18K and the supporter 16 may be of the same material or different materials. The additional supporter reinforcement layer 18K and the supporter reinforcement layer 18 may be of the same material or different materials.

The additional supporter reinforcement layer 18K may be formed, for example, by a chemical vapor deposition (CVD) process or an atomic layer deposition (ALD) process. The additional supporter reinforcement layer 18 may grow by using plasma to increase the selective growth effect from the supporter 16 and supporter reinforcement layer 18. The additional supporter reinforcement layer 18K may selectively grow using an atomic layer deposition (ALD) process or a low-pressure chemical vapor deposition (LPCVD) process using, for example, dichloro silane ($SiH_2Cl_2$) and ammonia ($NH_3$) as reaction gases.

Therefore, even though the supporter 16 is formed thin, since the supporter material is reinforced by the supporter reinforcement layer 18 and the additional supporter reinforcement layer 18K, the bottom electrode may be stably supported.

Although not illustrated, a dielectric layer and a top electrode may be sequentially formed over the bottom electrodes 19, the supporter 16, and the additional supporter reinforcement layer 18K.

FIGS. 22A to 22H are cross-sectional views illustrating semiconductor devices 110', 120', 200', 220', 300', 320', 400''', and 500' in accordance with other embodiments of the present invention. The semiconductor devices illustrated in FIGS. 22A to 22H may be identical or similar to the semiconductor devices in accordance with the above-described embodiments of the present invention.

Hereafter, the semiconductor devices 110', 120', 200', 220', 300', 320', 400''', and 500' may include an additional support reinforcement layer, similarly to the semiconductor device 100' shown in FIG. 20. Hereafter, detailed description on the overlapping constituent elements will be omitted.

Figure 22A:
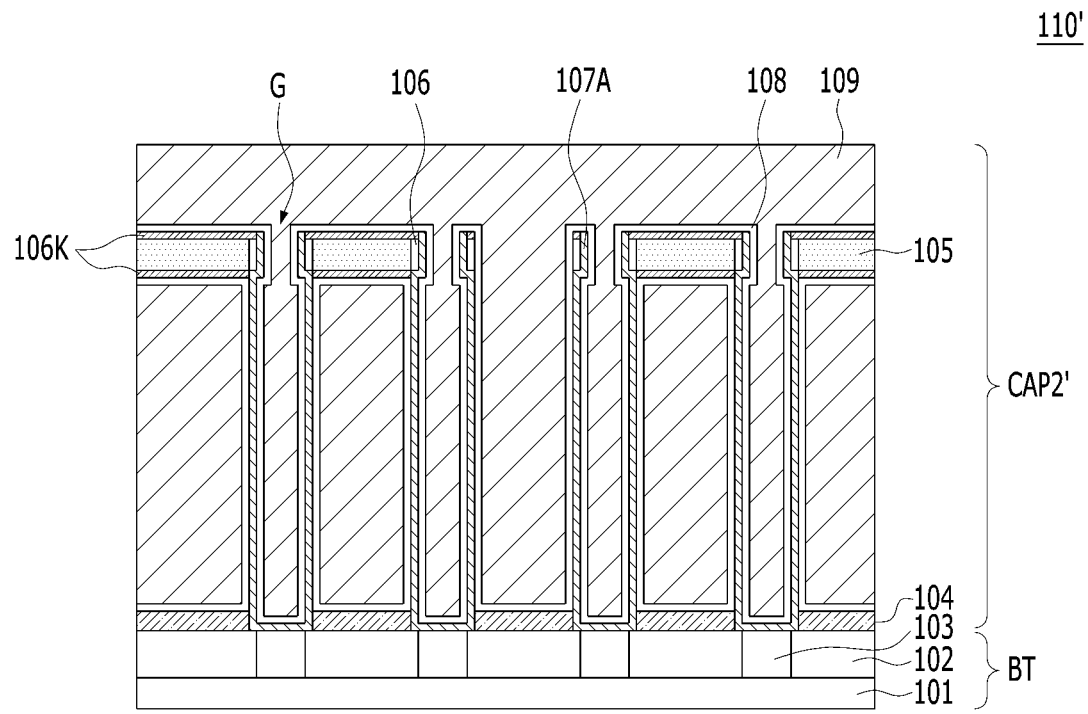
FIGS. 22A to 22H are cross-sectional views illustrating semiconductor devices in accordance with other embodiments of the present invention.

Referring to FIG. 22A, the semiconductor device 110' may be identical or similar to the semiconductor device 110 shown in FIG. 6A. The bottom electrodes 107A of the semiconductor device 110' may have a cylinder shape in which a gap G is defined. The upper outer wall of the bottom electrodes 107A may be supported by a supporter 105, a supporter reinforcement layer 106, and an additional supporter reinforcement layer 106K.

Figure 22B:
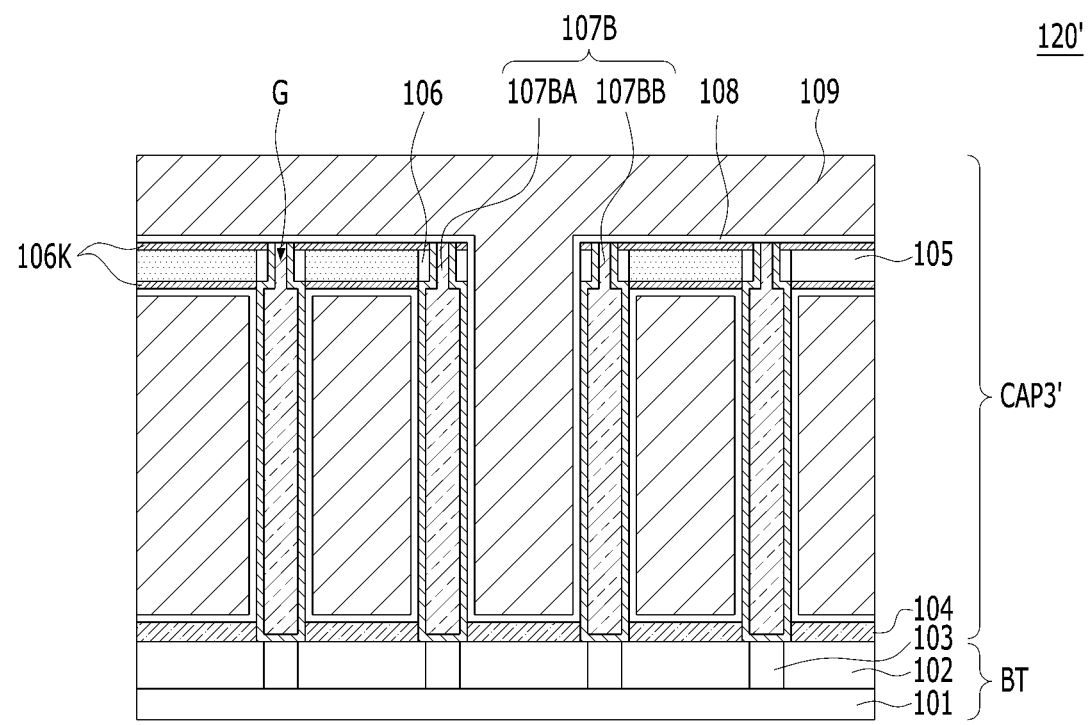

Referring to FIG. 22B, the semiconductor device 120' may be identical or similar to the semiconductor device 120 shown in FIG. 6B. The bottom electrodes 107B of the semiconductor device 120' may have a modified pylinder shape in which a cylinder shape and a pillar shape are combined. The bottom electrodes 107B may include a first bottom electrodes 107BA and a second bottom electrodes 107BB. The first bottom electrodes 107BA may have a cylinder shape in which the gap G is defined. The second bottom electrodes 107BB may have a pillar shape. The second bottom electrodes 107BB may fill the gap G inside the first bottom electrodes 107BA. The height of the second bottom electrodes 107BB may be the same as or different from the height of the first bottom electrodes 107BA. The bottom and side wall of the second bottom electrodes 107BB may have a structure surrounded by the first bottom electrodes 107BA. The upper outer wall of the bottom electrodes 107B may be supported by the supporter 105, the supporter reinforcement layer 106, and the additional supporter reinforcement layer 106K.

Referring to FIGS. 22A and 22B, the additional supporter reinforcement layer 106K may selectively grow from at least one between the supporter 105 and the supporter reinforcement layer 106. The additional supporter reinforcement layer 106K may selectively grow from the upper surface of the supporter 105, the lower surface of the supporter 105, and the upper surface of the supporter reinforcement layer 106. In order to form the additional supporter reinforcement layer 106K, selective growth of the additional supporter reinforcement layer 106K may be performed after a wet dip-out process is performed on the mold layer (see FIG. 20E). The thickness of the additional supporter reinforcement layer 106K on the upper surface of the supporter 105 and the thickness of the additional supporter reinforcement layer 106K on the lower surface of the supporter 105 may be the same or different.

The additional supporter reinforcement layer 106K may include a nitrogen-containing material. The additional supporter reinforcement layer 106K may include, for example, silicon nitride, silicon carbon nitride (SiCN), silicon boron nitride (SiBN), or a combination thereof. The additional supporter reinforcement layer 106K and the supporter 105 may be of the same material or different materials. The additional supporter reinforcement layer 106K and the supporter reinforcement layer 106 may be of the same material or different materials.

The additional supporter reinforcement layer 106K may be formed, for example, by a chemical vapor deposition (CVD) process or an atomic layer deposition (ALD) process. The additional supporter reinforcement layer 106K may grow by using plasma to increase the selective growth effect from the supporter 105 and the supporter reinforcement layer 106. The additional supporter reinforcement layer 106K may selectively grow using an atomic layer deposition (ALD) process or a low-pressure chemical vapor deposition (LPCVD) process using, for example, dichloro silane ($SiH_2Cl_2$) and ammonia ($NH_3$) as reaction gases.

Therefore, even though the supporter 105 is formed thin, since the supporter material is reinforced by the supporter reinforcement layer 106 and the additional supporter reinforcement layer 106K, the bottom electrodes 107A and 107B may be stably supported.

Figure 22C:
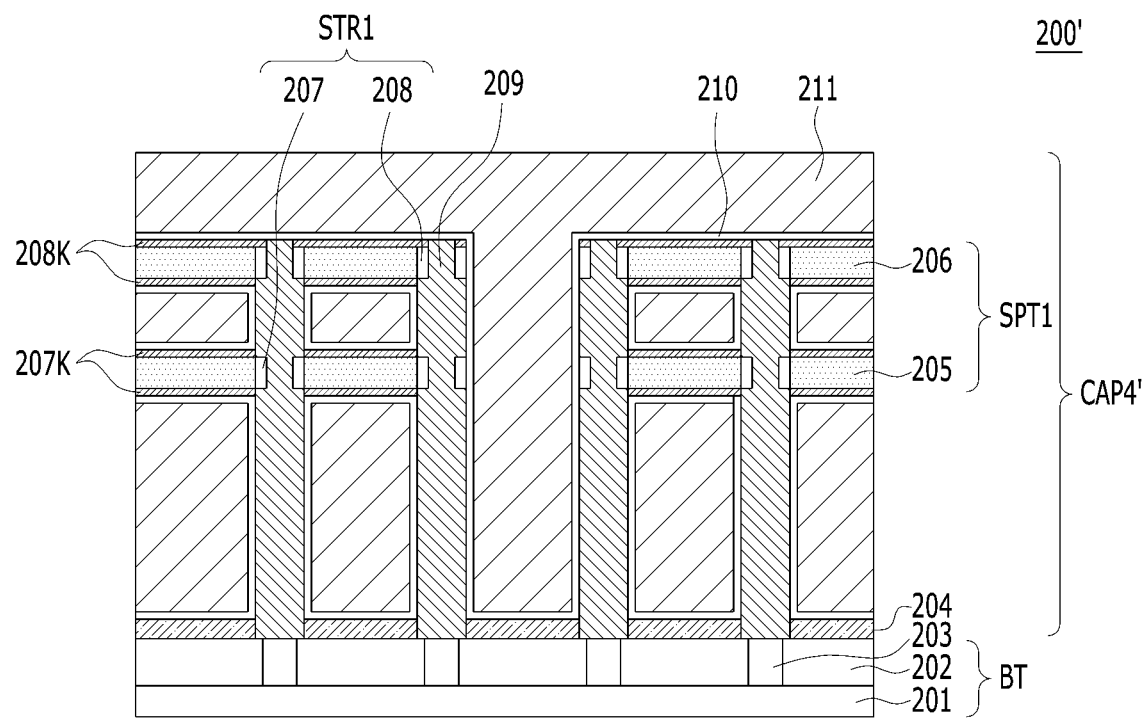

Referring to FIG. 22C, the semiconductor device 200' may be identical or similar to the semiconductor device 200 shown in FIG. 9A. The semiconductor device 200' may include a capacitor structure CAP4' disposed over the lower structure BT. The capacitor structure CAP4' may include an etch stop layer 204, a supporter structure SPT1, a supporter reinforcement structure STR1, an upper-level additional supporter reinforcement layer 208K, a lower-level additional supporter reinforcement layer 207K, a bottom electrode 209, a dielectric layer 210, and a top electrode 211. The other constituent elements except the upper-level additional supporter reinforcement layer 208K and the lower-level additional supporter reinforcement layer 207K may be the same as those of the semiconductor device 200 shown in FIG. 9A.

The upper-level additional supporter reinforcement layer 208K may be formed on the upper surface of the upper-level supporter 206, the lower surface of the upper-level supporter 206, and the upper surface of the upper-level supporter reinforcement layer 208. The lower-level additional supporter reinforcement layer 207K may be formed on the upper and lower surfaces of the lower-level supporter 205.

The upper-level additional supporter reinforcement layer 208K may selectively grow from at least one between the upper-level supporter 206 and the upper-level supporter reinforcement layer 208. The upper-level additional supporter reinforcement layer 208K may selectively grow from the upper surface of the upper-level supporter 206, the lower surface of the upper-level supporter 206, and the upper surface of the upper-level supporter reinforcement layer 208. The lower-level additional supporter reinforcement layer 207K may selectively grow from the lower-level supporter 205. The lower-level additional supporter reinforcement layer 207K may selectively grow from the upper and lower surfaces of the lower-level supporter 205.

To form the upper-level additional supporter reinforcement layer 208K and the lower-level additional supporter reinforcement layer 207K, a wet dip-out process may be performed on the mold layer, and then a selective growth process may be performed after the outer wall of the bottom electrodes 209 is exposed. The thickness of the upper-level additional supporter reinforcement layer 208K on the upper surface of the upper-level supporter 206 and the thickness of the upper-level additional supporter reinforcement layer 208K on the lower surface of the upper-level supporter 206 may be the same or different. The thickness of the lower-level additional supporter reinforcement layer 207K on the upper surface of the lower-level supporter 205 and the thickness of the lower-level additional supporter reinforcement layer 207K on the lower surface of the lower-level supporter 205 may be the same or different. The thickness of the upper-level additional supporter reinforcement layer 208K and the thickness of the lower-level additional supporter reinforcement layer 207K may be the same or different.

The upper-level additional supporter reinforcement layer 208K and the lower-level additional supporter reinforcement layer 207K may include a nitrogen-containing material. The upper-level additional supporter reinforcement layer 208K and the lower-level additional supporter reinforcement layer 207K may include, for example, silicon nitride, silicon carbon nitride (SiCN), silicon boron nitride (SiBN), or a combination thereof. The upper-level additional supporter reinforcement layer 208K and the upper-level supporter 206 may be of the same material or different materials. The upper-level additional supporter reinforcement layer 208K and the upper-level supporter reinforcement layer 208 may be of the same material or different materials. The lower-level additional supporter reinforcement layer 207K and the lower-level supporter 205 may be of the same material or different materials. The lower-level additional supporter reinforcement layer 207K and the lower-level supporter reinforcement layer 207 may be of the same material or different materials.

The upper-level additional supporter reinforcement layer 208K and the lower-level additional supporter reinforcement layer 207K may be formed, for example, by a chemical vapor deposition (CVD) process or an atomic layer deposition (ALD) process. The upper-level additional supporter reinforcement layer 208K and the lower-level additional supporter reinforcement layer 207K may grow by using plasma to increase the selective growth effect from the supporter 105 and the supporter reinforcement layer 208. The upper-level additional supporter reinforcement layer 208K and the lower-level additional supporter reinforcement layer 207K may selectively grow using an atomic layer deposition (ALD) process or a low-pressure chemical vapor deposition (LPCVD) process using, for example, dichloro silane ($SiH_2Cl_2$) and ammonia ($NH_3$) as reaction gases. The method for forming the upper-level additional supporter reinforcement layer 208K and the method for forming the lower-level additional supporter reinforcement layer 207K may be the same or different.

According to the above-described embodiment, since the supporter reinforcement structure STR1, the upper-level additional supporter reinforcement layer 208K and the lower-level additional supporter reinforcement layer 207K reinforce the side portion, upper surface and lower surface of the supporter structure SPT2, the structural stability of a capacitor may be increased.

Figure 22D:
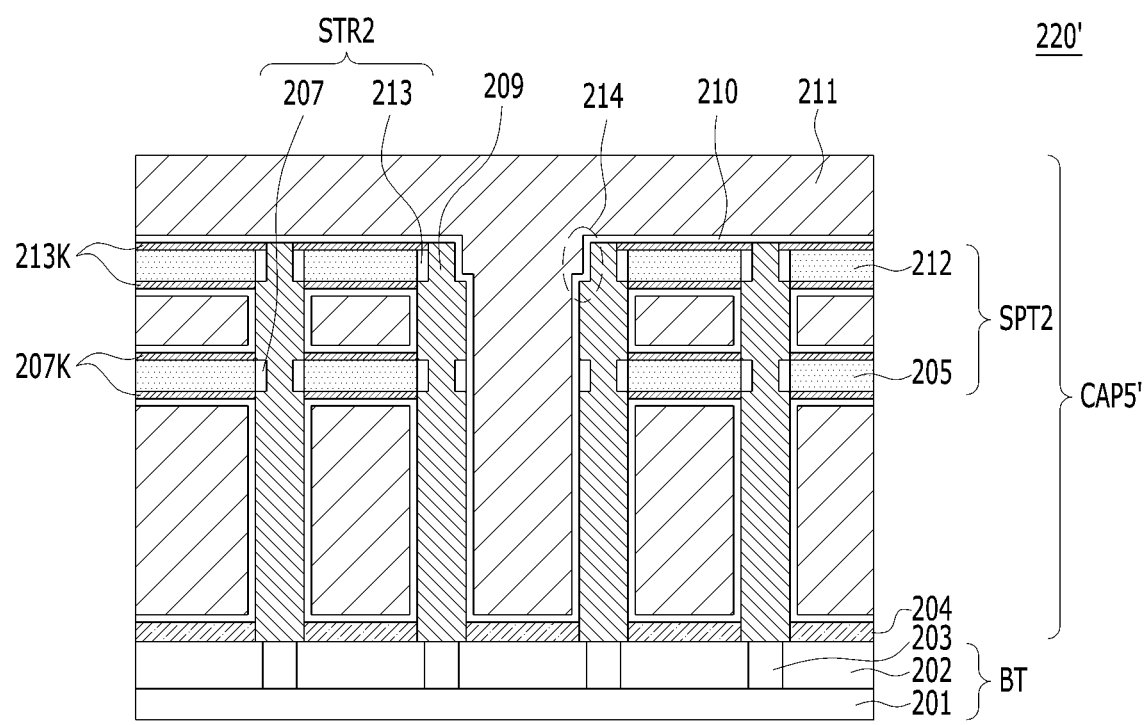

Referring to FIG. 22D, the semiconductor device 220' may be identical or similar to the semiconductor device 220 shown in FIG. 9B. The semiconductor device 220' may include a lower structure BT and a capacitor structure CAP5'.

The capacitor structure CAP5' may include an etch stop layer 204, a supporter structure SPT2, a supporter reinforcement structure STR2, a supporter reinforcement layer cutting portion 214, an upper-level additional supporter reinforcement layer 213K, a lower-level additional supporter reinforcement layer 207K, a bottom electrodes 209, a dielectric layer 210, and a top electrode 211. For example, the other constituent elements except the upper-level additional supporter reinforcement layer 213K and the lower-level additional supporter reinforcement layer 207K may be the same as those of the semiconductor device 220 shown in FIG. 9B.

The upper-level additional supporter reinforcement layer 213K may be formed on the upper surface of the upper-level supporter 212, the lower surface of the upper-level supporter 212, and the upper surface of the upper-level supporter reinforcement layer 213. The lower-level additional supporter reinforcement layer 207K may be formed on the upper and lower surfaces of the lower-level supporter 205.

The upper-level additional supporter reinforcement layer 213K may selectively grow from at least one between the upper-level supporter 212 and the upper-level supporter reinforcement layer 213.

The upper-level additional supporter reinforcement layer 213K may selectively grow from the upper surface of the upper-level supporter 212, the lower surface of the upper-level supporter 212, and the upper surface of the upper-level supporter reinforcement layer 213. The lower-level additional supporter reinforcement layer 207K may selectively grow from the lower-level supporter 205. The lower-level additional supporter reinforcement layer 207K may selectively grow from the upper and lower surfaces of the lower-level supporter 205.

To form the upper-level additional supporter reinforcement layer 213K and the lower-level additional supporter reinforcement layer 207K, a wet dip-out process may be performed on the mold layer and then a selective growth process may be performed after the outer wall of the bottom electrodes 209 is exposed. The thickness of the upper-level additional supporter reinforcement layer 213K on the upper surface of the upper-level supporter 206 and the thickness of the upper-level additional supporter reinforcement layer 213K on the lower surface of the upper-level supporter 206 may be the same or different. The thickness of the lower-level additional supporter reinforcement layer 207K on the upper surface of the lower-level supporter 205 and the thickness of the lower-level additional supporter reinforcement layer 207K on the lower surface of the lower-level supporter 205 may be the same or different. The thickness of the upper-level additional supporter reinforcement layer 213K and the thickness of the lower-level additional supporter reinforcement layer 207K may be the same or different.

The upper-level additional supporter reinforcement layer 213K and the lower-level additional supporter reinforcement layer 207K may include a nitrogen-containing material. The upper-level additional supporter reinforcement layer 213K and the lower-level additional supporter reinforcement layer 207K may include, for example, silicon nitride, silicon carbon nitride (SiCN), silicon boron nitride (SiBN), or a combination thereof. The upper-level additional supporter reinforcement layer 213K and the upper-level supporter 206 may be of the same material or different materials. The upper-level additional supporter reinforcement layer 213K and the upper-level supporter reinforcement layer 208 may be of the same material or different materials. The lower-level additional supporter reinforcement layer 207K and the lower-level supporter 205 may be of the same material or different materials. The lower-level additional supporter reinforcement layer 207K and the lower-level supporter reinforcement layer 207 may be of the same material or different materials.

The upper-level additional supporter reinforcement layer 213K and the lower-level additional supporter reinforcement layer 207K may be formed, for example, by a chemical vapor deposition (CVD) process or an atomic layer deposition (ALD) process. The upper-level additional supporter reinforcement layer 213K and the lower-level additional supporter reinforcement layer 207K may grow by using plasma to increase the selective growth effect from the supporter 105. The upper-level additional supporter reinforcement layer 213K and lower-level additional supporter reinforcement layer 207K may selectively grow using an atomic layer deposition (ALD) process or a low-pressure chemical vapor deposition (LPCVD) process dichloro silane ($SiH_2Cl_2$) and ammonia ($NH_3$) as reaction gases. The method for forming the upper-level additional supporter reinforcement layer 213K and the method for forming the lower-level additional supporter reinforcement layer 207K may be the same or different.

According to the above-described embodiment, since the supporter reinforcement structure STR1, the upper-level additional supporter reinforcement layer 213K, and the lower-level additional supporter reinforcement layer 207K reinforce the side portion, upper surface and lower surface of the supporter structure SPT2, the structural stability of a capacitor may be increased.

Figure 22E:
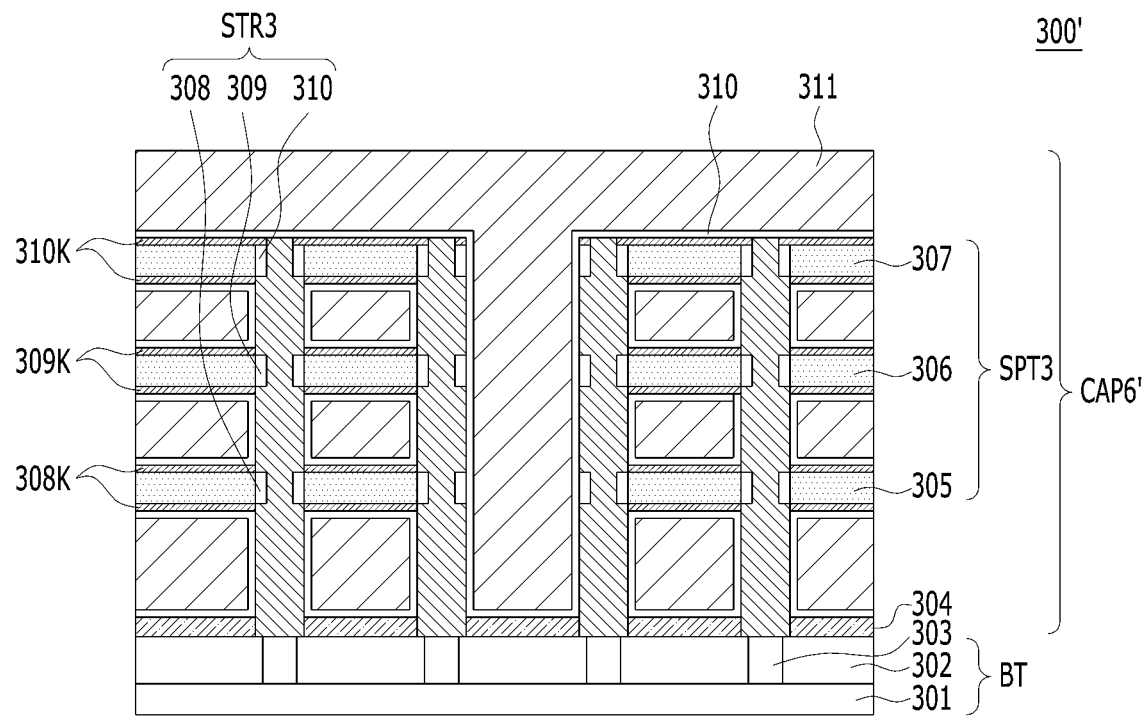

Referring to FIG. 22E, the semiconductor device 300' may be identical or similar to the semiconductor device 300 shown in FIG. 12A. The semiconductor device 300' may include a lower structure BT and a capacitor structure CAP6'.

The capacitor structure CAP6' may include an etch stop layer 304, a supporter structure SPT3, a supporter reinforcement structure STR3, an upper-level additional supporter reinforcement layer 310K, a middle-level additional supporter reinforcement layer 309K, a lower-level additional supporter reinforcement layer 308K, a plurality of bottom electrodes 311, a dielectric layer 312, and a top electrode 313. For example, the other constituent elements except the upper-level additional supporter reinforcement layer 310K, the middle-level additional supporter reinforcement layer 309K, and the lower-level additional supporter reinforcement layer 308K may be the same as those of the semiconductor device 300 shown in FIG. 12A.

The upper-level additional supporter reinforcement layer 310K may be formed on the upper surface of the upper-level supporter 307, the lower surface of the upper-level supporter 307, and the upper surface of the upper-level supporter reinforcement layer 310. The middle-level additional supporter reinforcement layer 309K may be formed on the upper and lower surfaces of the middle-level supporter 306.

The upper-level additional supporter reinforcement layer 310K may selectively grow from the upper surface of the upper-level supporter 307, the lower surface of the upper-level supporter 307, and the upper surface of the upper-level supporter reinforcement layer 310. The middle-level additional supporter reinforcement layer 309K may selectively grow from the upper and lower surfaces of the middle-level supporter 306. The lower-level additional supporter reinforcement layer 308K may be formed on the upper and lower surfaces of the lower-level supporter 305. The lower-level additional supporter reinforcement layer 308K may selectively grow from the upper and lower surfaces of the lower-level supporter 305.

In order to form the upper-level additional supporter reinforcement layer 310K, the middle-level additional supporter reinforcement layer 309K, and the lower-level additional supporter reinforcement layer 308K, a wet dip-out process may be performed on the mold layer and then a selective growth process may be performed after the outer wall of the bottom electrode 311 is exposed. The thickness of the upper-level additional supporter reinforcement layer 310K on the upper surface of the upper-level supporter 307 and the thickness of the upper-level additional supporter reinforcement layer 310K on the lower surface of the upper-level supporter 307 may be the same or different. The thickness of the middle-level additional supporter reinforcement layer 309K on the upper surface of the middle-level supporter 306 and the thickness of the middle-level additional supporter reinforcement layer 309K on the lower surface of the middle-level supporter 306 may be the same or different. The thickness of the lower-level additional supporter reinforcement layer 308K on the upper surface of the lower-level supporter 305 and the thickness of the lower-level additional supporter reinforcement layer 308K on the lower surface of the lower-level supporter 305 may be the same or different. The thickness of the upper-level additional supporter reinforcement layer 310K, the thickness of the middle-level additional supporter reinforcement layer 309K, and the thickness of the lower-level additional supporter reinforcement layer 308K may be the same or different.

The upper-level additional supporter reinforcement layer 310K, the middle-level additional supporter reinforcement layer 309K, and lower-level additional supporter reinforcement layer 308K may include a nitrogen-containing material. The upper-level additional supporter reinforcement layer 310K, the middle-level additional supporter reinforcement layer 309K, and the lower-level additional supporter reinforcement layer 308K may include, for example, silicon nitride, silicon carbon nitride (SiCN), silicon boron nitride (SiBN), or a combination thereof. The upper-level additional supporter reinforcement layer 310K and the upper-level supporter 307 may be of the same material or different materials. The upper-level additional supporter reinforcement layer 310K and the upper-level supporter reinforcement layer 310 may be of the same material or different materials. The middle-level additional supporter reinforcement layer 309K and the middle-level supporter 306 may be of the same material or different materials. The middle-level additional supporter reinforcement layer 309K and the middle-level supporter reinforcement layer 309 may be of the same material or different materials. The lower-level additional supporter reinforcement layer 308K and the lower-level supporter 305 may be of the same material or different materials. The lower-level additional supporter reinforcement layer 308K and the lower-level supporter reinforcement layer 308 may be of the same material or different materials.

The upper-level additional supporter reinforcement layer 310K, the middle-level additional supporter reinforcement layer 309K, and the lower-level additional supporter reinforcement layer 308K may be formed, for example, by a chemical vapor deposition (CVD) process or an atomic layer deposition (ALD) process. The upper-level additional supporter reinforcement layer 310K, the middle-level additional supporter reinforcement layer 309K, and the lower-level additional supporter reinforcement layer 308K may grow by using plasma to increase the selective growth effect from the supporter 105. The upper-level additional supporter reinforcement layer 310K, the middle-level additional supporter reinforcement layer 309K, and the lower-level additional supporter reinforcement layer 308K may selectively grow using an atomic layer deposition (ALD) process or a low-pressure chemical vapor deposition (LPCVD) process using, for example, dichloro silane ($SiH_2Cl_2$) and ammonia ($NH_3$) as reaction gases. The method for forming the upper-level additional supporter reinforcement layer 310K and the method for forming the lower-level additional supporter reinforcement layer 207K may be the same or different.

According to the above-described embodiment, since the supporter reinforcement structure STR3, the upper-level additional supporter reinforcement layer 310K, the middle-level additional supporter reinforcement layer 309K, and the lower-level additional supporter reinforcement layer 308K reinforce at least one among the side portion, upper surface, and lower surface of the supporter structure SPT3, the structural stability of a capacitor may be increased.

Figure 22F:
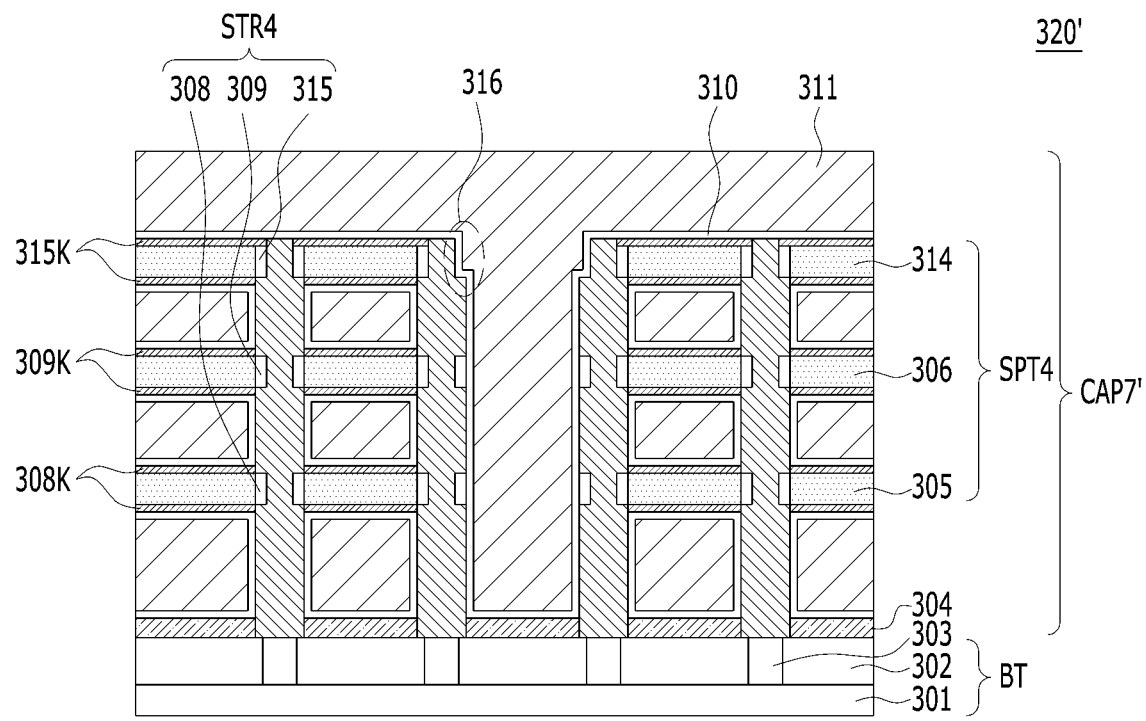

Referring to FIG. 22F, the semiconductor device 320' may be identical or similar to the semiconductor device 320 shown in FIG. 12B. The semiconductor device 320' may include a lower structure BT and a capacitor structure CAP7'.

The capacitor structure CAP7' may include an etch stop layer 304, a supporter structure SPT4, a supporter reinforcement structure STR4, a supporter reinforcement layer cutting portion 316, an upper-level additional supporter reinforcement layer 315K, a middle-level additional supporter reinforcement layer 309K, a lower-level additional supporter reinforcement layer 308K, a plurality of bottom electrodes 311, a dielectric layer 312, and a top electrode 313. For example, the other constituent elements except the upper-level additional supporter reinforcement layer 315K, the middle-level additional supporter reinforcement layer 309K, and the lower-level additional supporter reinforcement layer 308K may be the same as those of the semiconductor device 320 shown in FIG. 12B.

The upper-level additional supporter reinforcement layer 315K may selectively grow from the upper surface of the upper-level supporter 307, the lower surface of the upper-level supporter 307, and the upper surface of the upper-level supporter reinforcement layer 310. The middle-level additional supporter reinforcement layer 309K may selectively grow from the upper and lower surfaces of the middle-level supporter 306. The lower-level additional supporter reinforcement layer 308K may selectively grow from the upper and lower surfaces of the lower-level supporter 305.

In order to form an upper-level additional supporter reinforcement layer 315K, the middle-level additional supporter reinforcement layer 309K, and the lower-level additional supporter reinforcement layer 308K, a wet dip-out process may be performed on the mold layer, and then a selective growth process may be performed after the outer wall of the bottom electrode 311 is exposed. The thickness of the upper-level additional supporter reinforcement layer 315K on the upper surface of the upper-level supporter 307 and the thickness of the upper-level additional supporter reinforcement layer 315K on the lower surface of the upper-level supporter 307 may be the same or different. The thickness of the middle-level additional supporter reinforcement layer 309K on the upper surface of the middle-level supporter 306 and the thickness of the middle-level additional supporter reinforcement layer 309K on the lower surface of the middle-level supporter 306 may be the same or different. The thickness of the lower-level additional supporter reinforcement layer 308K on the upper surface of the lower-level supporter 305 and the thickness of the lower-level additional supporter reinforcement layer 308K on the lower surface of the lower-level supporter 305 may be the same or different. The thickness of the upper-level additional supporter reinforcement layer 315K, the thickness of the middle-level additional supporter reinforcement layer 309K, and the thickness of the lower-level additional supporter reinforcement layer 308K may have the same or different.

The upper-level additional supporter reinforcement layer 315K, the middle-level additional supporter reinforcement layer 309K, and the lower-level additional supporter reinforcement layer 308K may include a nitrogen-containing material. The upper-level additional supporter reinforcement layer 315K, the middle-level additional supporter reinforcement layer 309K, and the lower-level additional supporter reinforcement layer 308K may include, for example, silicon nitride, silicon carbon nitride (SiCN), silicon boron nitride (SiBN), or a combination thereof. The upper-level additional supporter reinforcement layer 315K and the upper-level supporter 307 may be of the same or different materials. The upper-level additional supporter reinforcement layer 315K and the upper-level supporter reinforcement layer 310 may be of the same material or different materials. The middle-level additional supporter reinforcement layer 309K and the middle-level supporter 306 may be of the same material or different materials. The middle-level additional supporter reinforcement layer 309K and the middle-level supporter reinforcement layer 309 may be of the same material or different materials. The lower-level additional supporter reinforcement layer 308K and the lower-level supporter 305 may be of the same material or different materials. The lower-level additional supporter reinforcement layer 308K and the lower-level supporter reinforcement layer 308 may be of the same material or different materials.

The upper-level additional supporter reinforcement layer 315K, the middle-level additional supporter reinforcement layer 309K, and the lower-level additional supporter reinforcement layer 308K may be formed, for example, by a chemical vapor deposition (CVD) process or an atomic layer deposition (ALD) process. The upper-level additional supporter reinforcement layer 315K, the middle-level additional supporter reinforcement layer 309K, and the lower-level additional supporter reinforcement layer 308K may grow by using plasma to increase the selective growth effect from the supporter 105. The upper-level additional supporter reinforcement layer 315K, the middle-level additional supporter reinforcement layer 309K, and the lower-level additional supporter reinforcement layer 308K may selectively grow using an atomic layer deposition (ALD) process or a low-pressure chemical vapor deposition (LPCVD) process using, for example, dichloro silane ($SiH_2Cl_2$) and ammonia ($NH_3$) as reaction gases. The method for forming the upper-level additional supporter reinforcement layer 315K and the method for forming the lower-level additional supporter reinforcement layer 207K may be the same or different.

According to the above-described embodiment of the present invention, since the supporter reinforcement structure STR3, the upper-level additional supporter reinforcement layer 315K, the middle-level additional supporter reinforcement layer 309K, and the lower-level additional supporter reinforcement layer 308K reinforce at least one among the side portion, the upper surface, and the lower surface of the supporter structure SPT3, the structural stability of a capacitor may be increased.

Figure 22G:
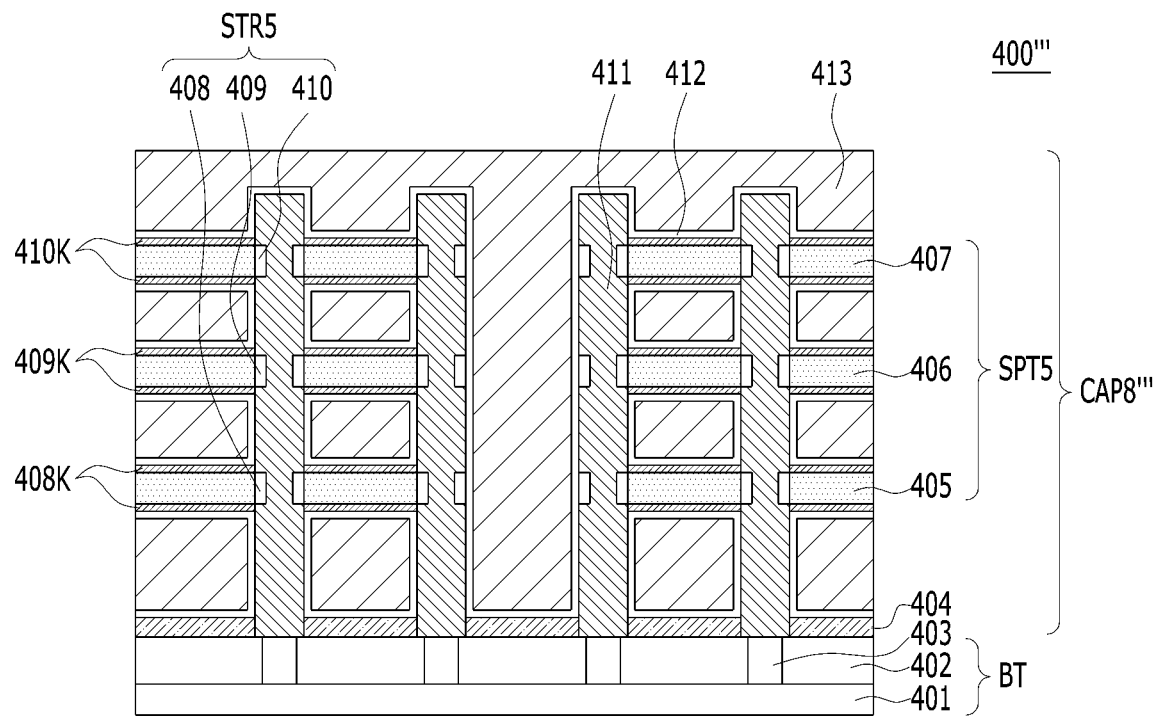

Referring to FIG. 22G, the semiconductor device 400''' may be identical or similar to the semiconductor device 400 of FIG. 15. The semiconductor device 400''' may include a lower structure BT and a capacitor structure CAP8'''.

The capacitor structure CAP8''' may include an etch stop layer 404, a supporter structure SPT5, a supporter reinforcement structure STR5, an upper-level additional supporter reinforcement layer 410K, a middle-level additional supporter reinforcement layer 409K, a lower-level additional supporter reinforcement layer 408K, a plurality of bottom electrodes 411, a dielectric layer 412, and a top electrode 413. For example, the other constituent elements except the upper-level additional supporter reinforcement layer 410K, the middle-level additional supporter reinforcement layer 409K, and the lower-level additional supporter reinforcement layer 408K may be the same as those of the semiconductor device 400 shown in FIG. 15.

The upper-level additional supporter reinforcement layer 410K may selectively grow from the upper and lower surfaces of the upper-level supporter 407. The middle-level additional supporter reinforcement layer 409K may selectively grow from the upper and lower surfaces of the middle-level supporter 406. The lower-level additional supporter reinforcement layer 408K may selectively grow from the upper and lower surfaces of the lower-level supporter 405.

In order to form the upper-level additional supporter reinforcement layer 410K, the middle-level additional supporter reinforcement layer 409K, and the lower-level additional supporter reinforcement layer 408K, a wet dip-out process may be performed on the mold layer, and then a selective growth process may be performed after the outer wall of the bottom electrodes 411 is exposed. The thickness of the upper-level additional supporter reinforcement layer 410K on the upper surface of the upper-level supporter 407 and the thickness of the upper-level additional supporter reinforcement layer 410K on the lower surface of the upper-level supporter 407 may be the same or different. The thickness of the middle-level additional supporter reinforcement layer 409K on the upper surface of the middle-level supporter 406 and the thickness of the middle-level additional supporter reinforcement layer 409K on the lower surface of the middle-level supporter 406 may be the same or different. The thickness of the lower-level additional supporter reinforcement layer 408K on the upper surface of the lower-level supporter 405 and the thickness of the lower-level additional supporter reinforcement layer 408K on the lower surface of the lower-level supporter 405 may be the same or different. The thickness of the upper-level additional supporter reinforcement layer 410K, the thickness of the middle-level additional supporter reinforcement layer 409K, and the thickness of the lower-level additional supporter reinforcement layer 408K may be the same or different.

The upper-level additional supporter reinforcement layer 410K, the middle-level additional supporter reinforcement layer 409K, and the lower-level additional supporter reinforcement layer 408K may include a nitrogen-containing material. The upper-level additional supporter reinforcement layer 410K, the middle-level additional supporter reinforcement layer 409K, and the lower-level additional supporter reinforcement layer 408K may include, for example, silicon nitride, silicon carbon nitride (SiCN), silicon boron nitride (SiBN), or a combination thereof. The upper-level additional supporter reinforcement layer 410K and the upper-level supporter 407 may be of the same material or different materials. The upper-level additional supporter reinforcement layer 410K and the upper-level supporter reinforcement layer 410 may be of the same material or different materials. The middle-level additional supporter reinforcement layer 409K and the middle-level supporter 406 may be of the same material or different materials. The middle-level additional supporter reinforcement layer 409K and the middle-level supporter reinforcement layer 409 may be of the same material or different materials. The lower-level additional supporter reinforcement layer 408K and the lower-level supporter 405 may be of the same material or different materials. The lower-level additional supporter reinforcement layer 408K and the lower-level supporter reinforcement layer 408 may be of the same material or different materials.

The upper-level additional supporter reinforcement layer 410K, the middle-level additional supporter reinforcement layer 409K, and the lower-level additional supporter reinforcement layer 408K may be formed, for example, by a chemical vapor deposition (CVD) process or an atomic layer deposition (ALD) process. The upper-level additional supporter reinforcement layer 410K, the middle-level additional supporter reinforcement layer 409K, and the lower-level additional supporter reinforcement layer 408K may grow by using plasma to increase the selective growth effect from the supporter structure SPT5. The upper-level additional supporter reinforcement layer 410K, the middle-level additional supporter reinforcement layer 409K, and the lower-level additional supporter reinforcement layer 408K may selectively grow using an atomic layer deposition (ALD) process or a low-pressure chemical vapor deposition (LPCVD) process using, for example, dichloro silane ($SiH_2Cl_2$) and ammonia ($NH_3$) as reaction gases. The method for forming the upper-level additional supporter reinforcement layer 410K, the method for forming the middle-level additional supporter reinforcement layer 409K, and the method for forming the lower-level additional supporter reinforcement layer 408K may be the same or different.

According to the above-described embodiment of the present invention, the supporter reinforcement structure STR5, the upper-level additional supporter reinforcement layer 410K, the middle-level additional supporter reinforcement layer 409K, and the lower-level additional supporter reinforcement layer 408K reinforce at least one among the side portion, upper surface and lower surface of the supporter structure SPT5, the structural stability of a capacitor may be increased. Also, the upper-level supporter reinforcement layer 410 may be positioned at a lower level than the top surface of the bottom electrodes 411 to secure a greater capacity of a capacitor.

Figure 22H:
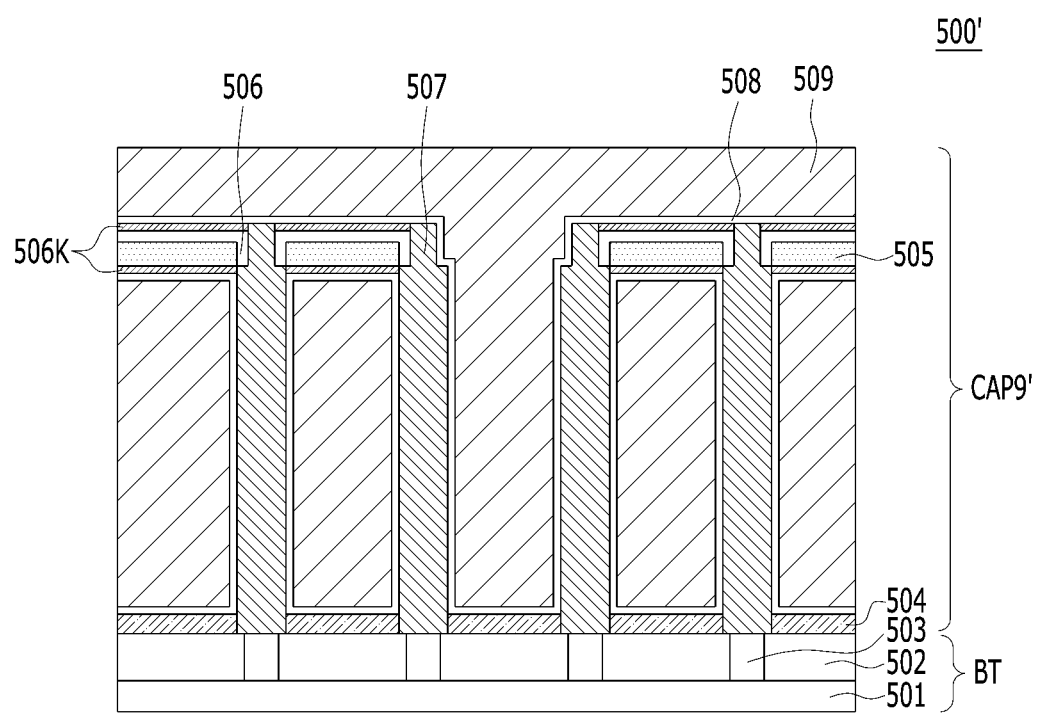

Referring to FIG. 22H, the semiconductor device 500' may be identical or similar to the semiconductor device 500 shown in FIG. 18. The semiconductor device 500' may include a lower structure BT and a capacitor structure CAP9'.

The capacitor structure CAP9' may include an etch stop layer 504, a supporter 505, a supporter reinforcement layer 506, an additional supporter reinforcement layer 506K, a plurality of bottom electrodes 507, a dielectric layer 508, and a top electrode 509. For example, the other constituent elements except the additional supporter reinforcement layer 506K may be the same as that of the semiconductor device 500 shown in FIG. 18.

The additional supporter reinforcement layer 506K may be formed on the upper surface of the supporter 505, the lower surface of the supporter 505, and the upper surface of the supporter reinforcement layer 506. The thickness of the additional supporter reinforcement layer 506K on the upper surface of the supporter 505 and the thickness of the additional supporter reinforcement layer 506K on the lower surface of the supporter 505 may be the same or different.

The additional supporter reinforcement layer 506K may grow from at least one between the supporter 505 and the supporter reinforcement layer 506. The additional supporter reinforcement layer 506K may selectively grow from the upper surface of the supporter 505, the lower surface of the supporter 505, and the upper surface of the supporter reinforcement layer 506. In order to form the additional supporter reinforcement layer 506K, a selective growth process may be performed after the outer wall of the bottom electrodes 507 is exposed.

The additional supporter reinforcement layer 506K may include a nitrogen-containing material. The additional supporter reinforcement layer 506K may include, for example, silicon nitride, silicon carbon nitride (SiCN), silicon boron nitride (SiBN) or a combination thereof. The additional supporter reinforcement layer 506K and the supporter 505 may be of the same material or different materials. The additional supporter reinforcement layer 506K and the supporter reinforcement layer 506 may be of the same material or different materials.

The additional supporter reinforcement layer 506K may be formed, for example, by a chemical vapor deposition (CVD) process or an atomic layer deposition (ALD) process. The supporter reinforcement layer 506 may grow by using plasma to increase the selective growth effect from the supporter 505. The additional supporter reinforcement layer 506K may selectively grow using an atomic layer deposition (ALD) process or a low-pressure chemical vapor deposition (LPCVD) process using, for example, dichloro silane (SiH$_2$Cl$_2$) and ammonia (NH$_3$) as reaction gases.

Therefore, even though the supporter 505 is formed thin, since the supporter material is reinforced by the supporter reinforcement layer 506 and the additional supporter reinforcement layer 506K, the bottom electrodes 507 may be stably supported.

Figure 23A:
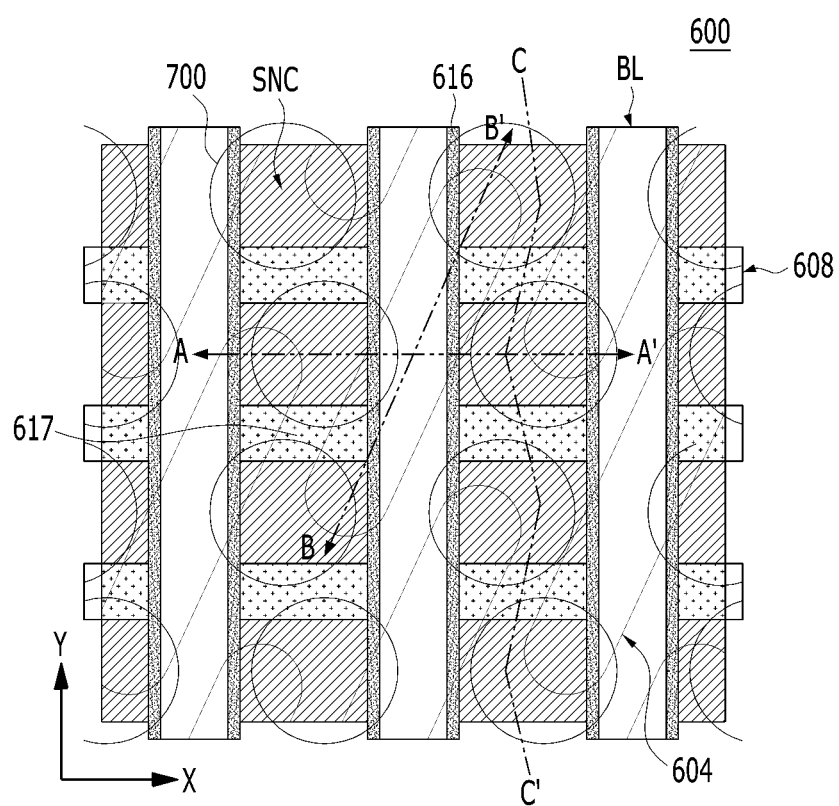
FIG. 23A is a plan view illustrating a semiconductor device in accordance with an embodiment of the present invention.
Figure 23B:
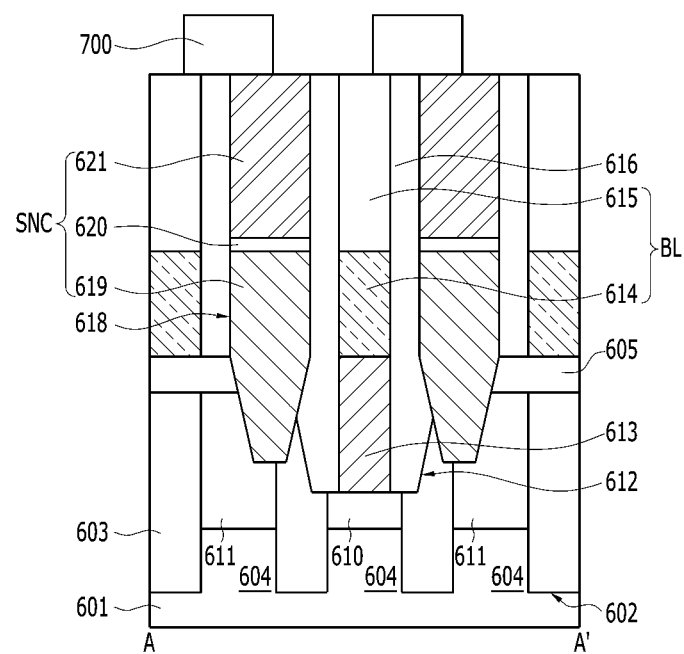
FIG. 23B is a cross-sectional view taken along a line A-A' shown in FIG. 23A.
Figure 23C:
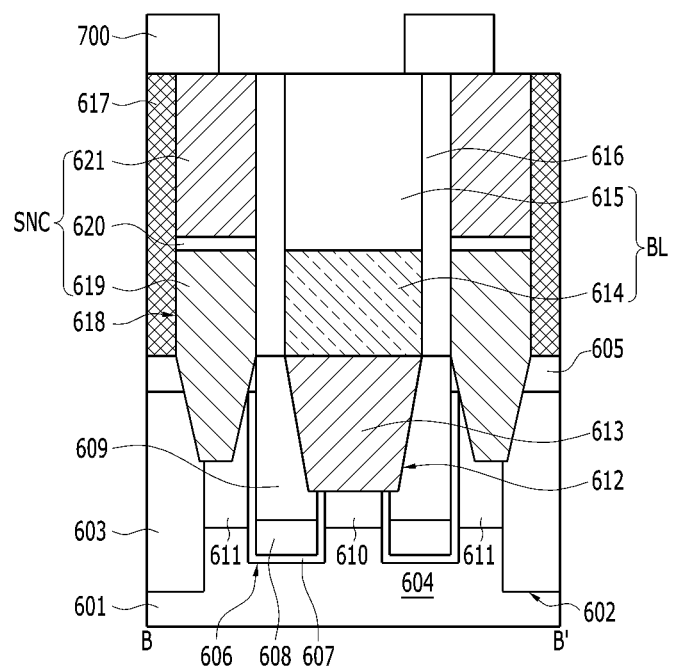
FIG. 23C is a cross-sectional view taken along a line B-B' shown in FIG. 23A.

FIGS. 23A to 23C illustrate a semiconductor device in accordance with an embodiment of the present invention.

The embodiment describes a semiconductor device having memory cells, such as DRAM. FIG. 23A is a plan view of the semiconductor device in accordance with the embodiment of the present invention. FIG. 23B is a cross-sectional view taken along a line A-A' shown in FIG. 23A. FIG. 23C is a cross-sectional view taken along a line B-B' shown in FIG. 23A.

The memory cell 600 may include a cell transistor including a buried word line 608, a bit line 614, and a capacitor 700. The capacitor 700 may include at least one supporter and at least one supporter reinforcement layer. The capacitor 700 may further include at least one additional supporter reinforcement layer. The supporter, the supporter reinforcement layer, and the additional supporter reinforcement layer may be described by referring to the above-described embodiments of the present invention.

The memory cell 600 will be described in detail.

An isolation layer 603 and an active region 604 may be formed in the substrate 601. A plurality of active regions 604 may be defined by the isolation layer 603. The substrate 601 may be of a material appropriate for semiconductor processing. The substrate 601 may include a semiconductor substrate. The substrate 601 may be formed of a silicon-containing material. The substrate 601 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 601 may also include other semiconductor materials, such as germanium. The substrate 601 may include a group-IIIV semiconductor substrate, for example, a compound semiconductor substrate, such as GaAs. The substrate 601 may include a silicon-on-insulator (SOI) substrate. An isolation layer 603 may be formed in an isolation trench 602 by a shallow trench isolation (STI) process.

A word line trench 606 may be formed in the substrate 601. The word line trench 606 may be referred to as a gate trench. A gate dielectric layer 607 may be formed on the surface of the word line trench 606. A buried word line 608 partially filling the word line trench 606 may be formed over the gate dielectric layer 607. The buried word line 608 may be referred to as a buried gate electrode. The word line capping layer 609 may be formed over the buried word line 608. The upper surface of the buried word line 608 may be positioned at a lower level than the surface of the substrate 601. The buried word line 608 may be a low-resistance metal material. The buried word line 608 may, for example, include titanium nitride and tungsten that are sequentially stacked. According to another embodiment of the present invention, the buried word line 608 may be formed of titanium nitride only (TiN Only).

First and second impurity regions 610 and 611 may be formed in the substrate 601. The first and second impurity regions 610 and 611 may be spaced apart from each other by the word line trench 606. The first and second impurity regions 610 and 611 may be referred to as first and second source/drain regions. The first and second impurity regions 610 and 611 may include an N-type impurity, such as arsenic (As) or phosphorus (P). Accordingly, the buried word line 608 and the first and second impurity regions 610 and 611 may become a cell transistor. The cell transistor may improve a short channel effect by the buried word line 608.

A bit line contact plug 613 may be formed over the substrate 601. The bit line contact plug 613 may be coupled to the first impurity region 610. The bit line contact plug 613 may be positioned in the bit line contact hole 612. The bit line contact hole 612 may be formed in the hard mask layer 605. The hard mask layer 605 may be formed on the substrate 601. The bit line contact hole 612 may expose the first impurity region 610. The lower surface of the bit line contact plug 613 may be lower than the upper surface of the substrate 601. The bit line contact plug 613 may be formed of polysilicon or a metal material. A portion of the bit line contact plug 613 may have a line width which is smaller than the diameter of the bit line contact hole 612. A bit line 614 may be formed over the bit line contact plug 613. A bit line hard mask 615 may be formed over the bit line 614. The stacked structure of the bit line 614 and the bit line hard mask 615 may be referred to as a bit line structure BL. The bit line 614 may have a line shape extending in a direction intersecting with the buried word line 608. A bottom portion of the bit line 614 may be coupled to the bit line contact plug 613. The bit line 614 may include a metal material. The bit line hard mask 615 may include a dielectric material.

A bit liner spacer 616 may be formed on the sidewall of the bit line structure BL. The bottom portion of the bit liner spacer 616 may extend to be formed on both sides of the bit line contact plug 613. The bit liner spacer 616 may include silicon oxide, silicon nitride or a combination thereof. According to another embodiment of the present invention, the bit liner spacer 616 may include an air gap. For example, the bit line spacer 616 may be a NAN (Nitride-Air gap-Nitride) structure in which an air gap is positioned between silicon nitrides.

A storage node contact plug SNC may be formed between neighboring bit line structures BL. The storage node contact plug SNC may be formed in the storage node contact hole 618. The storage node contact plug SNC may be coupled to the second impurity region 611. The storage node contact plug SNC may include a lower plug 619 and an upper plug 621. The storage node contact plug SNC may further include an ohmic contact layer 620 disposed between the lower plug 619 and the upper plug 621. The ohmic contact layer 620 may include a metal silicide. The upper plug 621 may include a metal material, and the lower plug 619 may include a silicon-containing material.

When viewed in a direction parallel to the bit line structure BL, a plug separation layer 617 may be formed between the neighboring storage node contact plugs SNCs. The plug separation layer 617 may be formed between the neighboring bit line structures BL, and the plug separation layer 617 may include the storage node contact hole 618 together with the hard mask layer 605.

According to embodiments of the present invention, the support force of the supporter may be reinforced to prevent the bottom electrode from collapsing during the subsequent processes by selectively forming a supporter reinforcement layer from the exposed surface of the supporter layer positioned in a plurality of spaced apart openings.

According to embodiments of the present invention, since the supporter reinforcement layer is formed after the opening is formed, the difficulty of an etching process for forming the opening may be improved by reducing the thickness of the supporter layer when a mold stack is formed. Accordingly, the side profile of the opening may be vertical. Therefore, contact failure of the capacitor may be improved and the capacitance may be improved.

According to embodiments of the present invention, the structural stability of the supporter may be reinforced to prevent the bottom electrode from collapsing and to increase the reliability and yield of the semiconductor device.

While the present invention has been described with respect to specific embodiments, it will be apparent to those skilled in the art that various changes and modifications may be made without departing from the spirit and scope of the invention as defined in the following claims.

What is claimed is:

1. A method for fabricating a semiconductor device, comprising:
    forming a mold stack layer including a mold layer and a supporter layer over a substrate;
    forming an opening by etching the mold layer and the supporter layer of the mold stack layer;
    selectively forming a supporter reinforcement layer on a partially etched side portion of the supporter layer which is positioned in the opening;
    forming a bottom electrode in the opening in which the supporter reinforcement layer is formed;
    forming a supporter opening by etching a portion of the supporter layer to form a supporter that supports an outer wall of the bottom electrode;
    removing the mold layer out of the mold stack layer;
    forming a dielectric layer on the bottom electrode, the supporter reinforcement layer, and the supporter; and
    forming a top electrode on the dielectric layer.

2. The method of claim 1, wherein the supporter reinforcement layer selectively grows on the etched side portion of the supporter layer among the mold layer and the supporter layer.

3. The method of claim 1, wherein the supporter reinforcement layer fully covers the etched side portion of the supporter layer.

4. The method of claim 1, wherein the supporter reinforcement layer has a closed loop shape that surrounds the outer wall of the bottom electrode.

5. The method of claim 1, wherein the supporter reinforcement layer has a broken loop shape that partially surrounds the outer wall of the bottom electrode.

6. The method of claim 1, wherein a side profile of the supporter reinforcement layer is one among a curved shape, a vertical shape, and a tapered shape.

7. The method of claim 1, wherein the supporter layer has a multi-level structure.

8. The method of claim 1, wherein the supporter reinforcement layer has a multi-level structure.

9. The method of claim 1, wherein the supporter reinforcement layer has a multi-level structure including a supporter reinforcement layer of a closed loop shape, and a supporter reinforcement layer of a broken loop shape which is disposed at higher level than the supporter reinforcement layer of the closed loop shape.

10. The method of claim 1, wherein the supporter layer and the supporter reinforcement layer include the same material.

11. The method of claim 1, wherein the supporter layer and the supporter reinforcement layer include a nitrogen-containing material.

12. The method of claim 1, wherein the supporter layer and the supporter reinforcement layer include silicon nitride, silicon carbon nitride, silicon boron nitride, or a combination thereof.

13. The method of claim 1, wherein the mold layer includes silicon oxide, and
    the supporter layer and the supporter reinforcement layer include silicon nitride.

14. The method of claim 1, wherein the supporter layer includes a first silicon nitride, and
    the supporter reinforcement layer includes a second silicon nitride that selectively grows from the first silicon nitride.

15. The method of claim 1, further comprising before the forming of the mold stack layer:
    forming a buried word line in the substrate; and
    forming a bit line over the substrate.

16. The method of claim 1, further comprising after the removing the mold layer out of the mold stack layer:
    forming an additional supporter reinforcement layer that selectively grows from at least one between the supporter and the supporter reinforcement layer.

17. The method of claim 16, wherein the additional supporter reinforcement layer includes a nitrogen-containing material.

18. The method of claim 16, wherein the additional supporter reinforcement layer includes silicon nitride, silicon carbon nitride, silicon boron nitride, or a combination thereof.

* * * * *